(12) United States Patent
Huang et al.

(10) Patent No.: US 12,243,872 B2
(45) Date of Patent: Mar. 4, 2025

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Chen-Huang Huang, Hsinchu (TW); Yu-Ling Cheng, Tainan (TW); Shun-Hui Yang, Taoyuan (TW); An Chyi Wei, Hsinchu (TW); Chia-Jen Chen, Hsinchu (TW); Shang-Shuo Huang, Kaohsiung (TW); Chia-I Lin, Taipei (TW); Chih-Chang Hung, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 406 days.

(21) Appl. No.: 17/672,216

(22) Filed: Feb. 15, 2022

(65) Prior Publication Data
US 2023/0260993 A1 Aug. 17, 2023

(51) Int. Cl.
*H01L 27/088* (2006.01)
*H01L 21/8234* (2006.01)

(52) U.S. Cl.
CPC .... *H01L 27/088* (2013.01); *H01L 21/823481* (2013.01)

(58) Field of Classification Search
CPC .............................................. H01L 21/823481
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,425,318 B1 * | 8/2016 | Hoentschel | H01L 29/7843 |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |

(Continued)

OTHER PUBLICATIONS

U.S. Appl. No. 17/007,742, filed Aug. 31, 2020.
U.S. Appl. No. 17/005,172, filed Aug. 27, 2020.

*Primary Examiner* — Peniel M Gumedzoe
(74) *Attorney, Agent, or Firm* — NZ CARR LAW OFFICE

(57) ABSTRACT

A semiconductor device structure, along with methods of forming such, are described. The structure includes a first channel region disposed over a substrate, a second channel region disposed adjacent the first channel region, a gate electrode layer disposed in the first and second channel regions, and a first dielectric feature disposed adjacent the gate electrode layer. The first dielectric feature includes a first dielectric material having a first thickness. The structure further includes a second dielectric feature disposed between the first and second channel regions, and the second dielectric feature includes a second dielectric material having a second thickness substantially less than the first thickness. The second thickness ranges from about 1 nm to about 20 nm.

20 Claims, 57 Drawing Sheets

(56) References Cited

U.S. PATENT DOCUMENTS

| | | |
|---|---|---|
| 2015/0187571 A1* | 7/2015 | Fan .................. H01L 29/165 |
| | | 438/282 |
| 2015/0214318 A1 | 7/2015 | Ching et al. |
| 2019/0067284 A1* | 2/2019 | Ching ................ H01L 27/1207 |
| 2020/0058650 A1 | 2/2020 | Wen et al. |
| 2021/0028173 A1 | 1/2021 | Yang et al. |
| 2021/0184001 A1 | 6/2021 | Trivedi et al. |

* cited by examiner

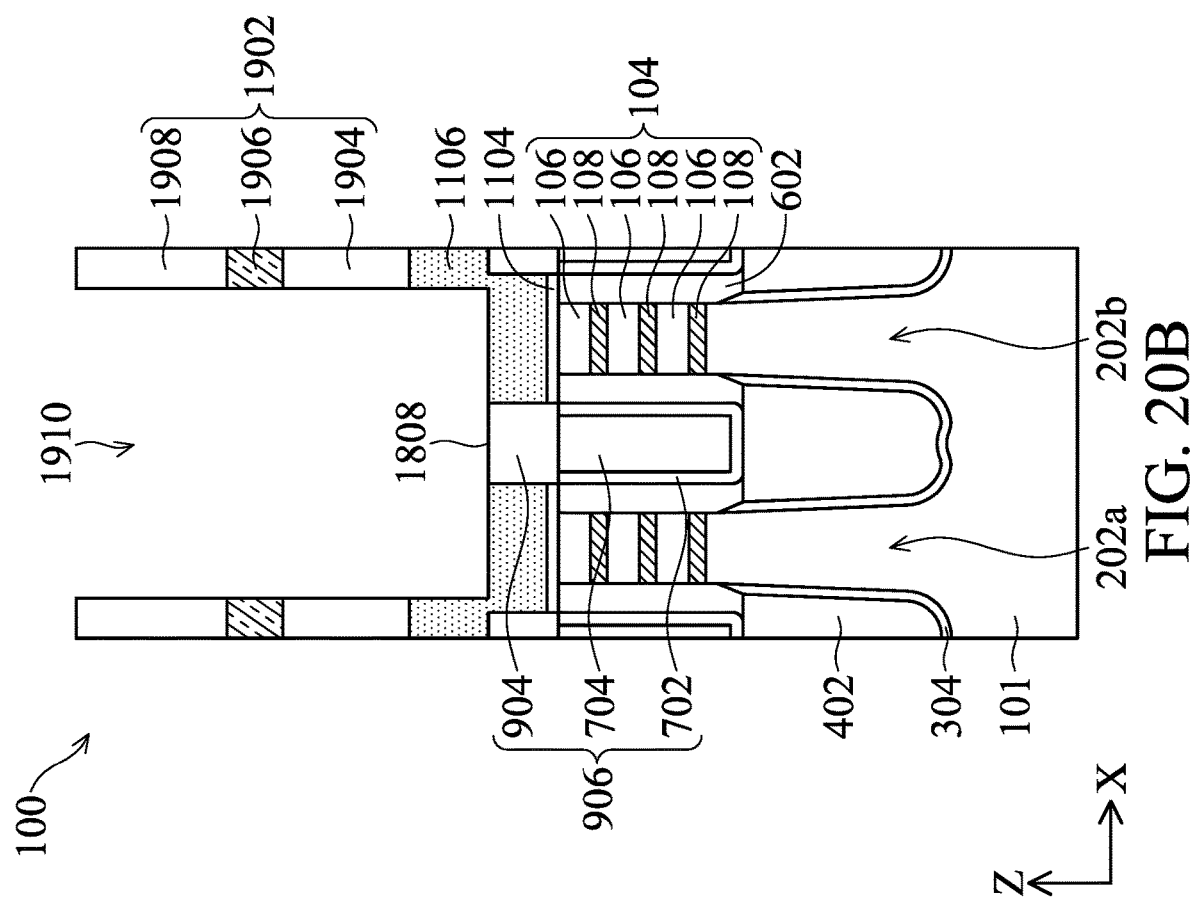

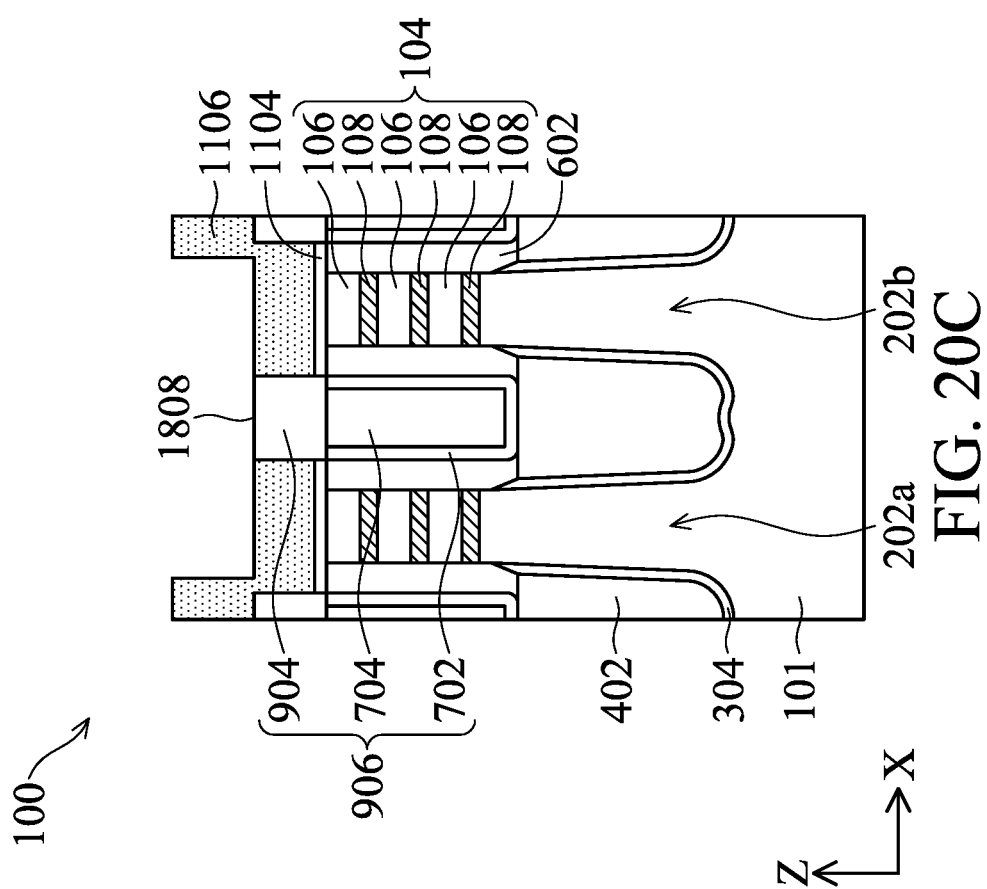

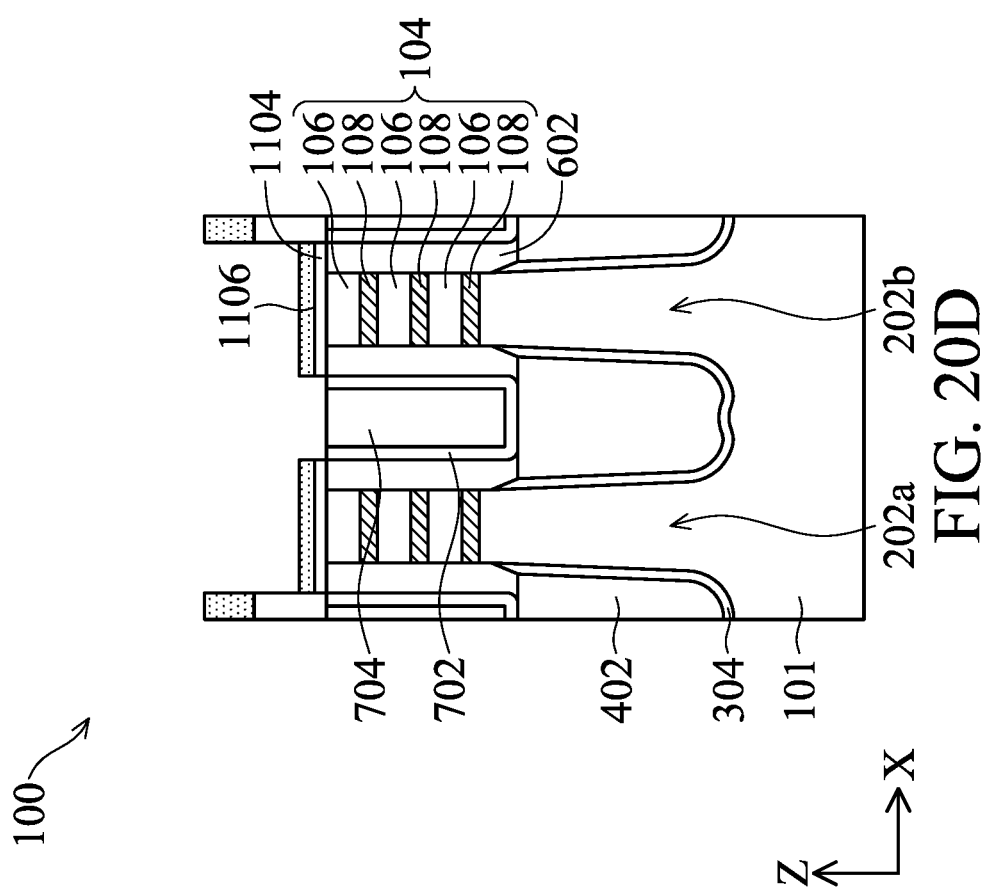

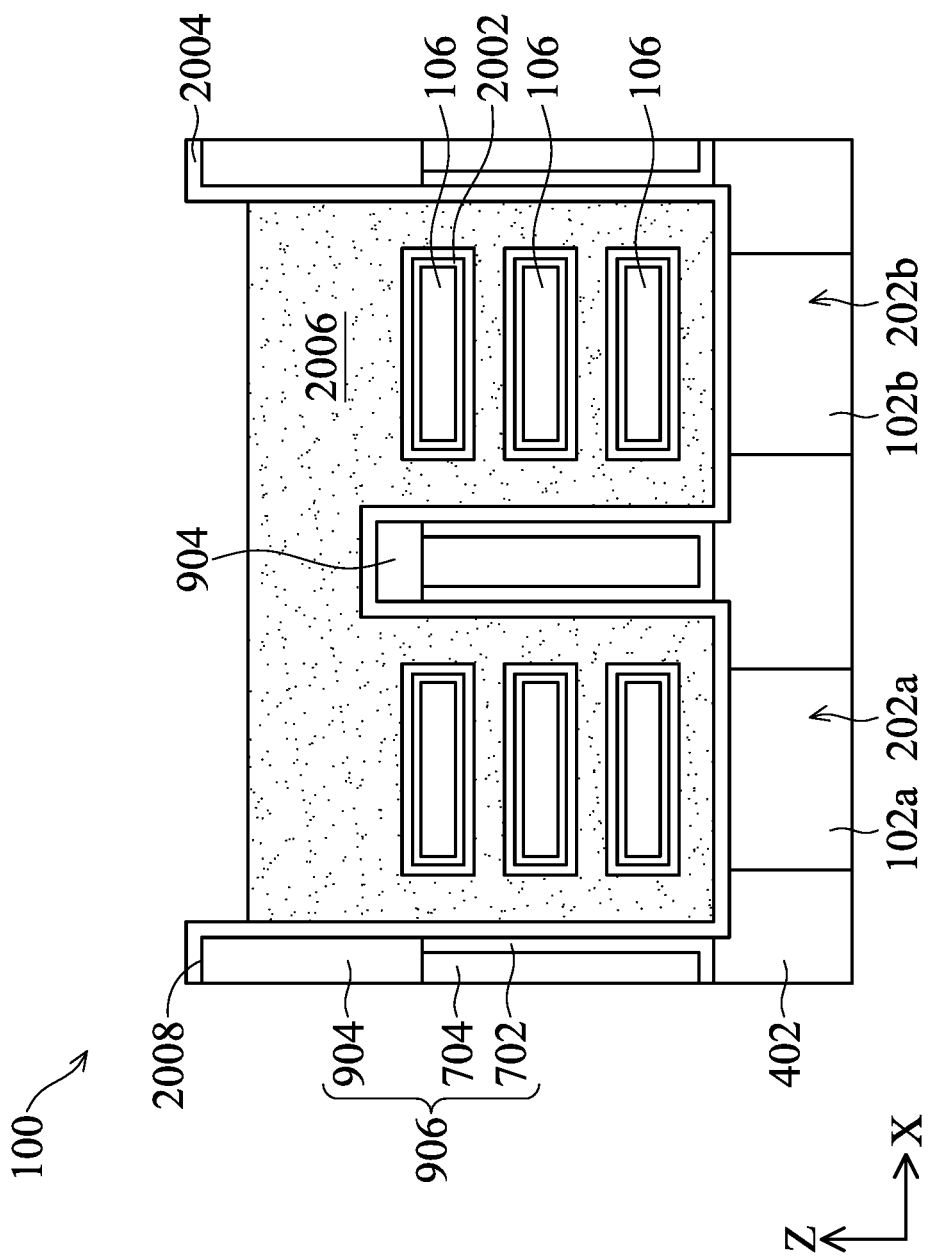

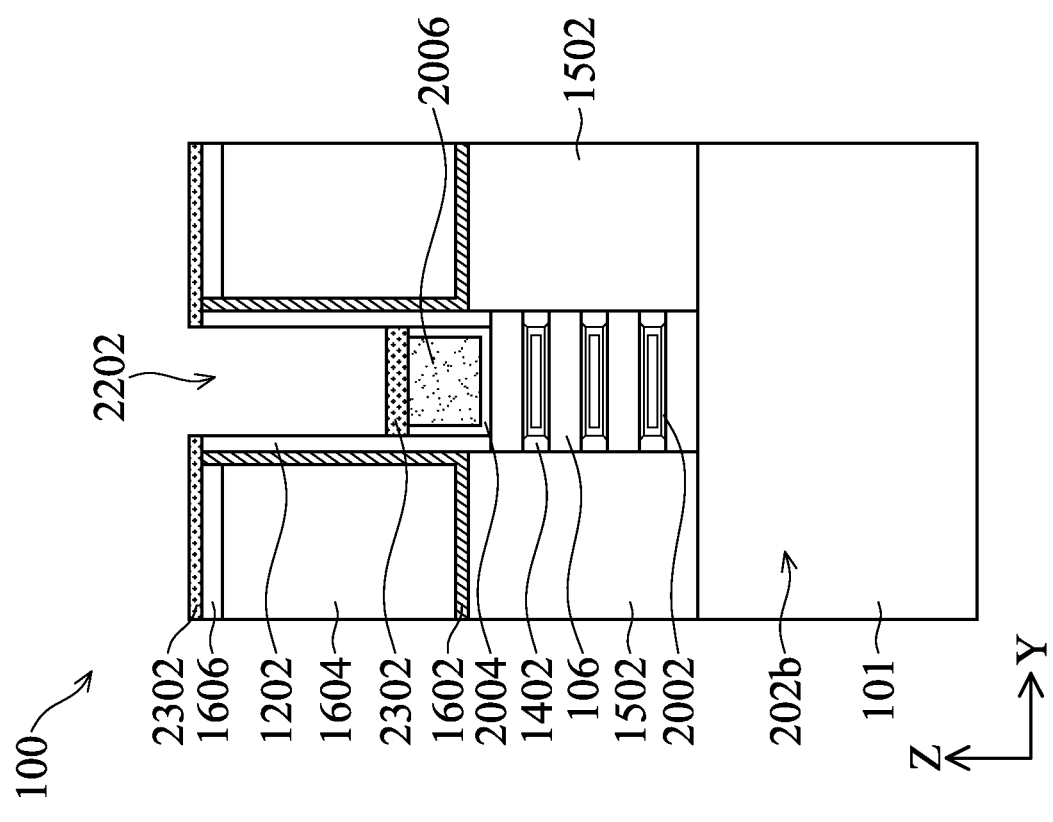
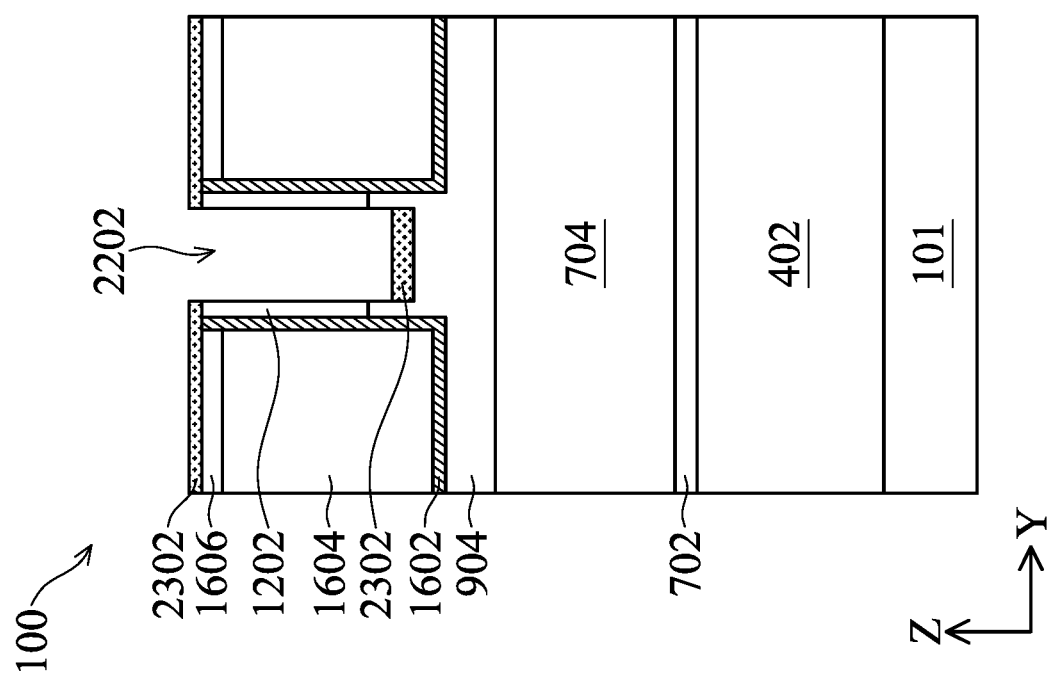
FIG. 24B
FIG. 24A

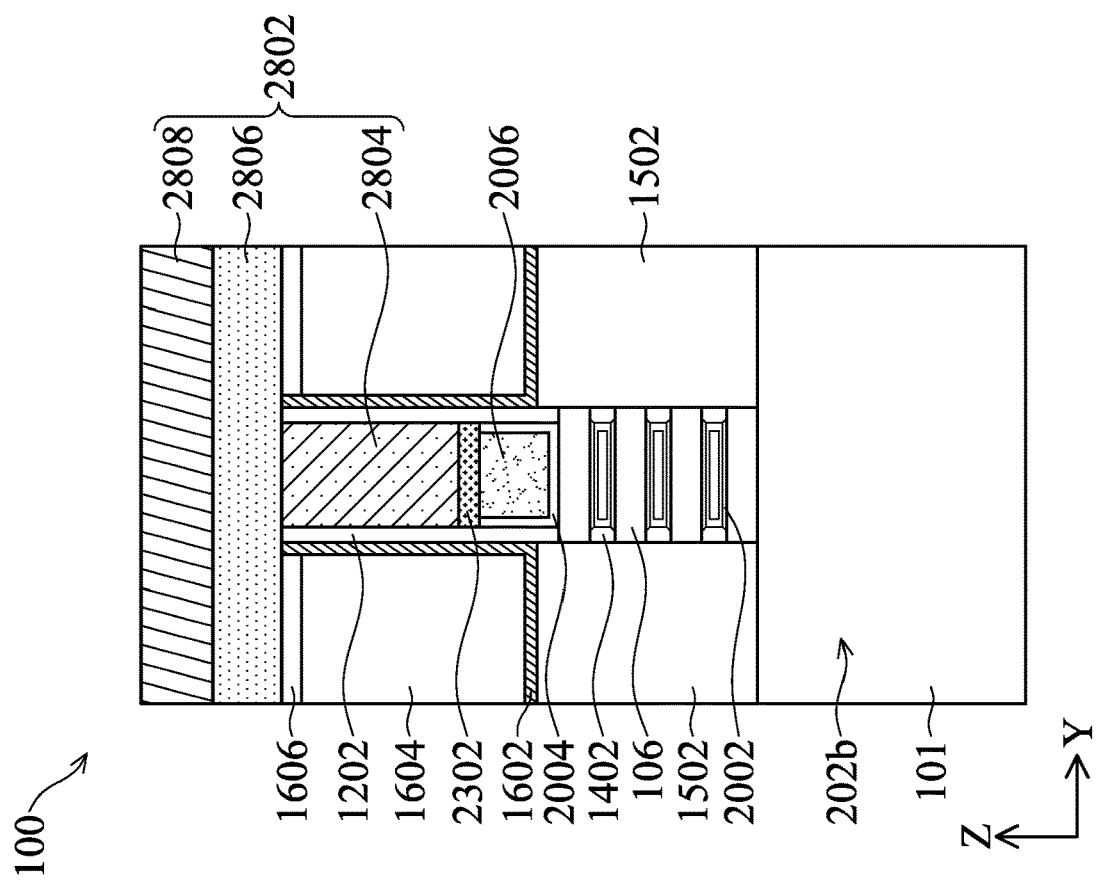
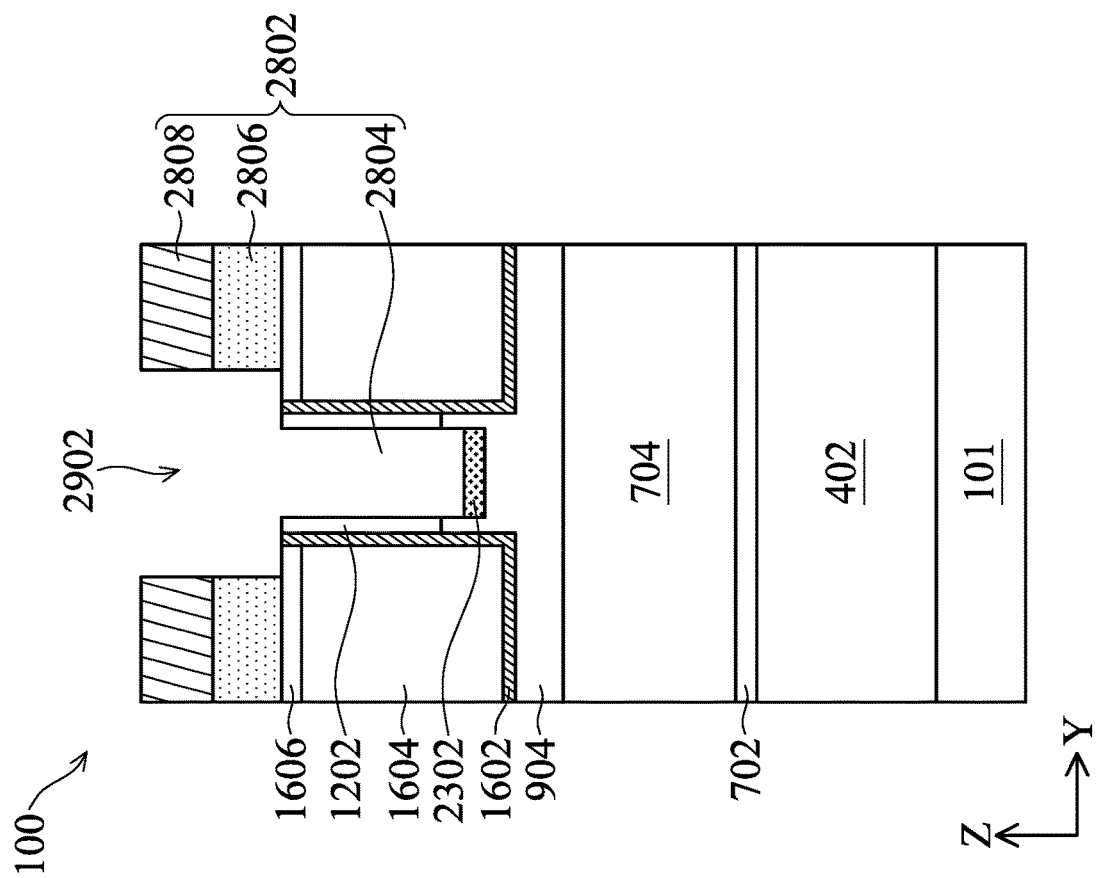
FIG. 29B
FIG. 29A

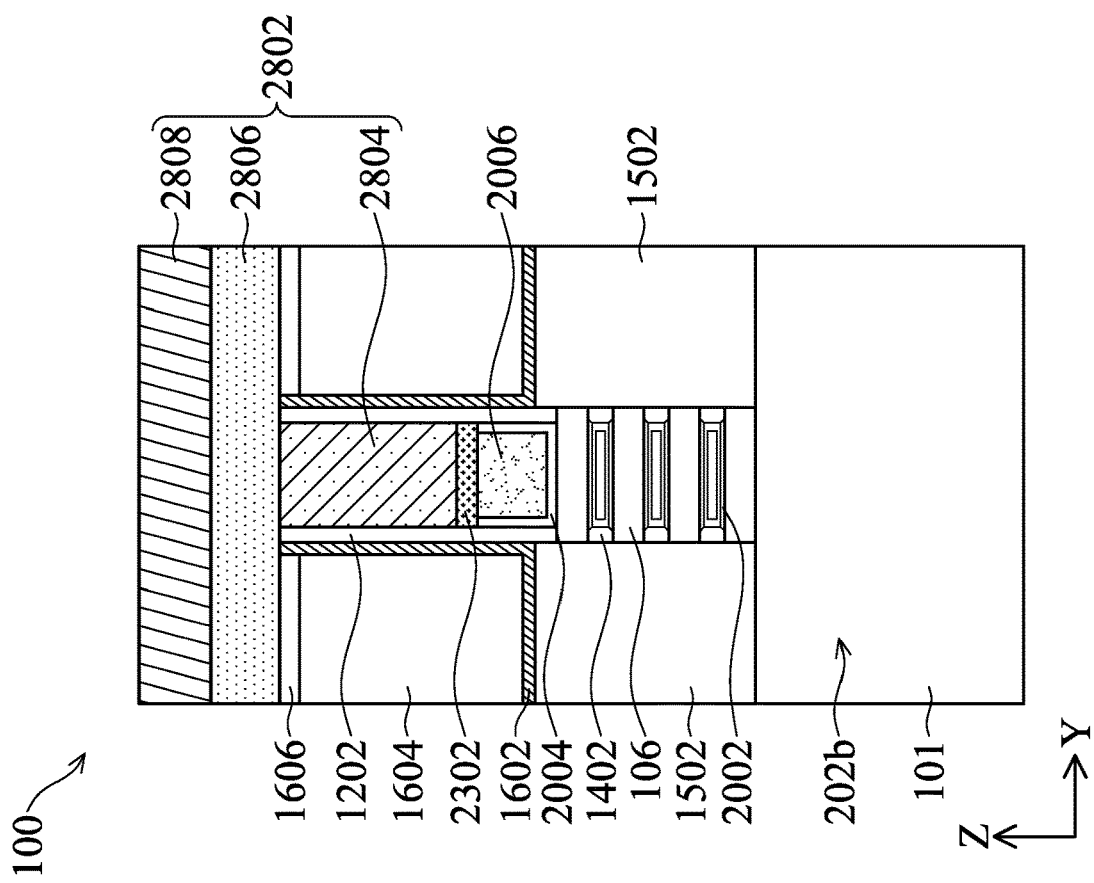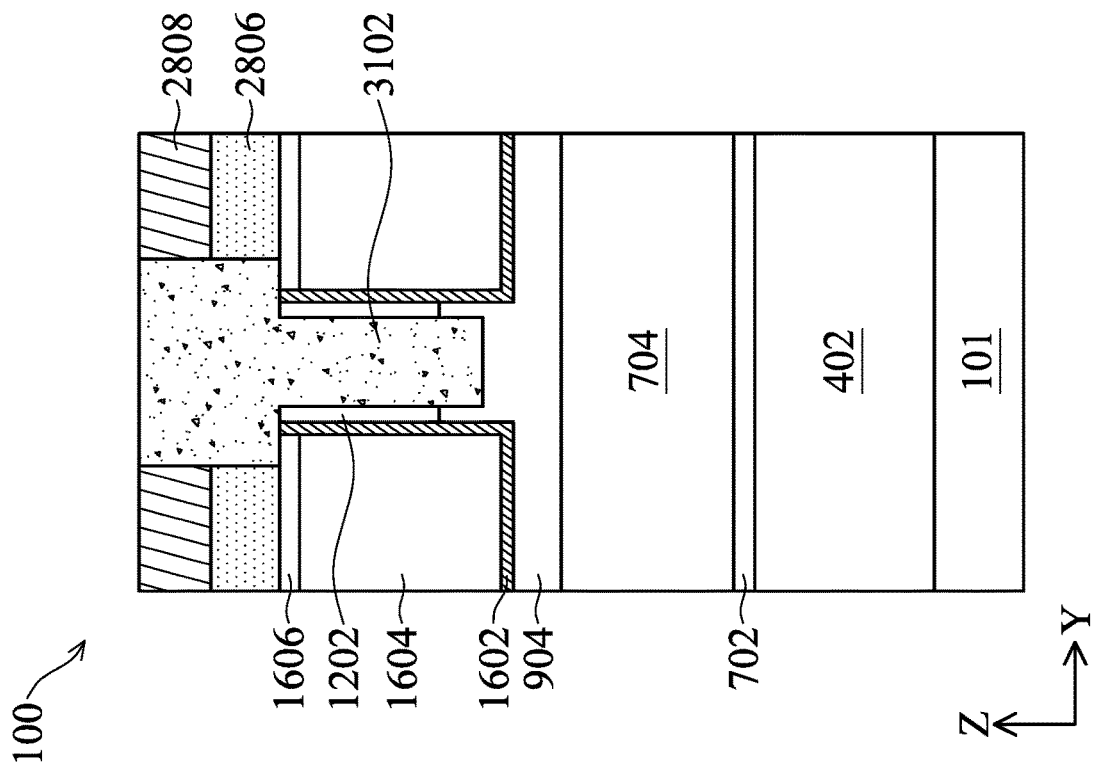

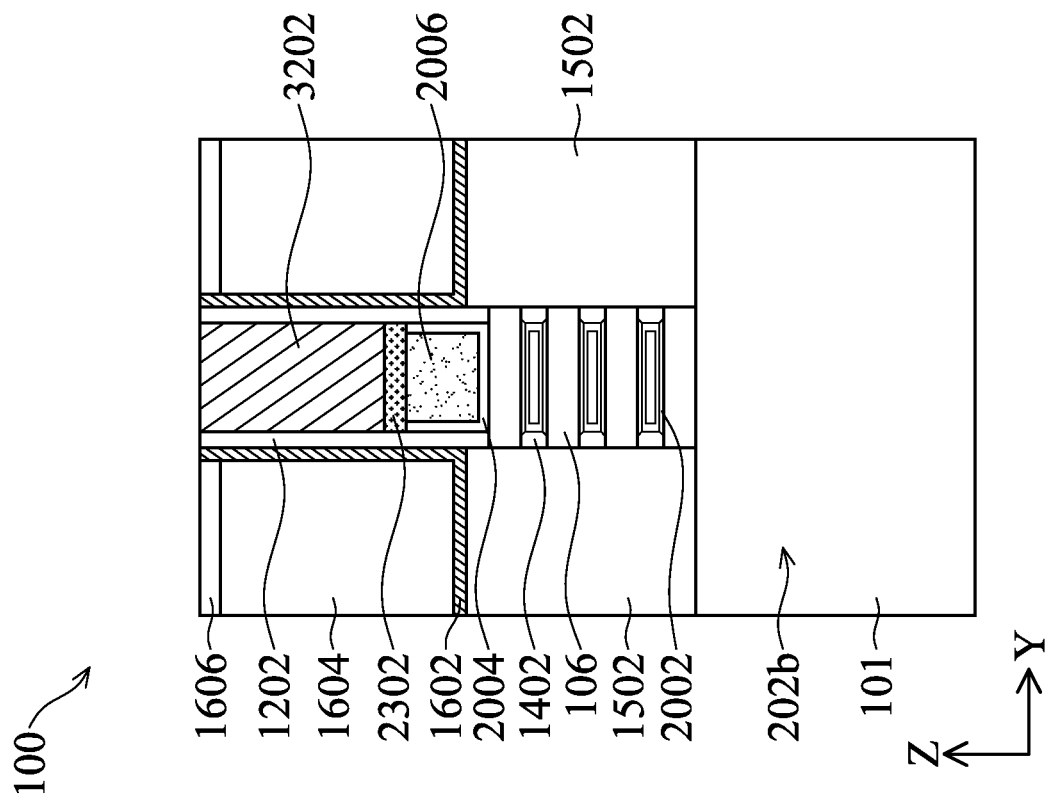
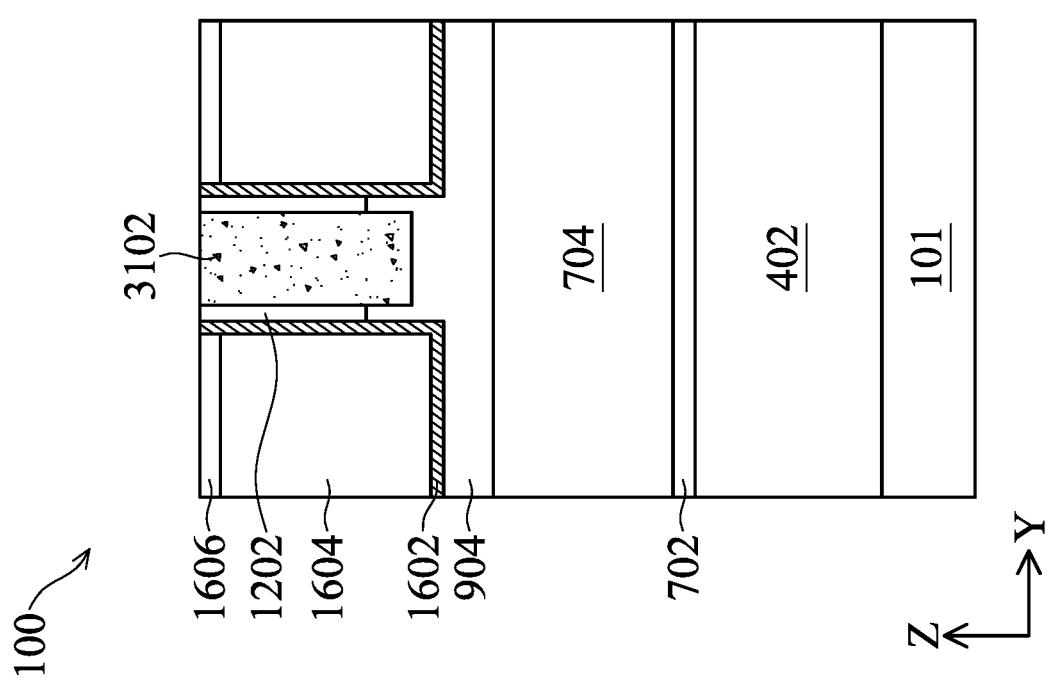
FIG. 32B
FIG. 32A

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 17A-19A are perspective views of various stages of manufacturing the semiconductor device structure, in accordance with some embodiments.

FIGS. 17B-19B are cross-sectional side views of various stages of manufacturing the semiconductor device structure taken along line A-A of FIG. 17A, in accordance with some embodiments.

FIGS. 20A-20I are cross-sectional side views of various stages of manufacturing the semiconductor device structure taken along line A-A of FIG. 17A, in accordance with some embodiments.

FIGS. 21A-32A are cross-sectional side views of various stages of manufacturing the semiconductor device structure taken along line B-B of FIG. 16, in accordance with some embodiments.

FIGS. 21B-32B are cross-sectional side views of various stages of manufacturing the semiconductor device structure taken along line C-C of FIG. 16, in accordance with some embodiments.

FIGS. 22C-32C are cross-sectional side views of various stages of manufacturing the semiconductor device structure taken along line D-D of FIG. 16, in accordance with some embodiments.

DETAILED DESCRIPTION

Figure 1:
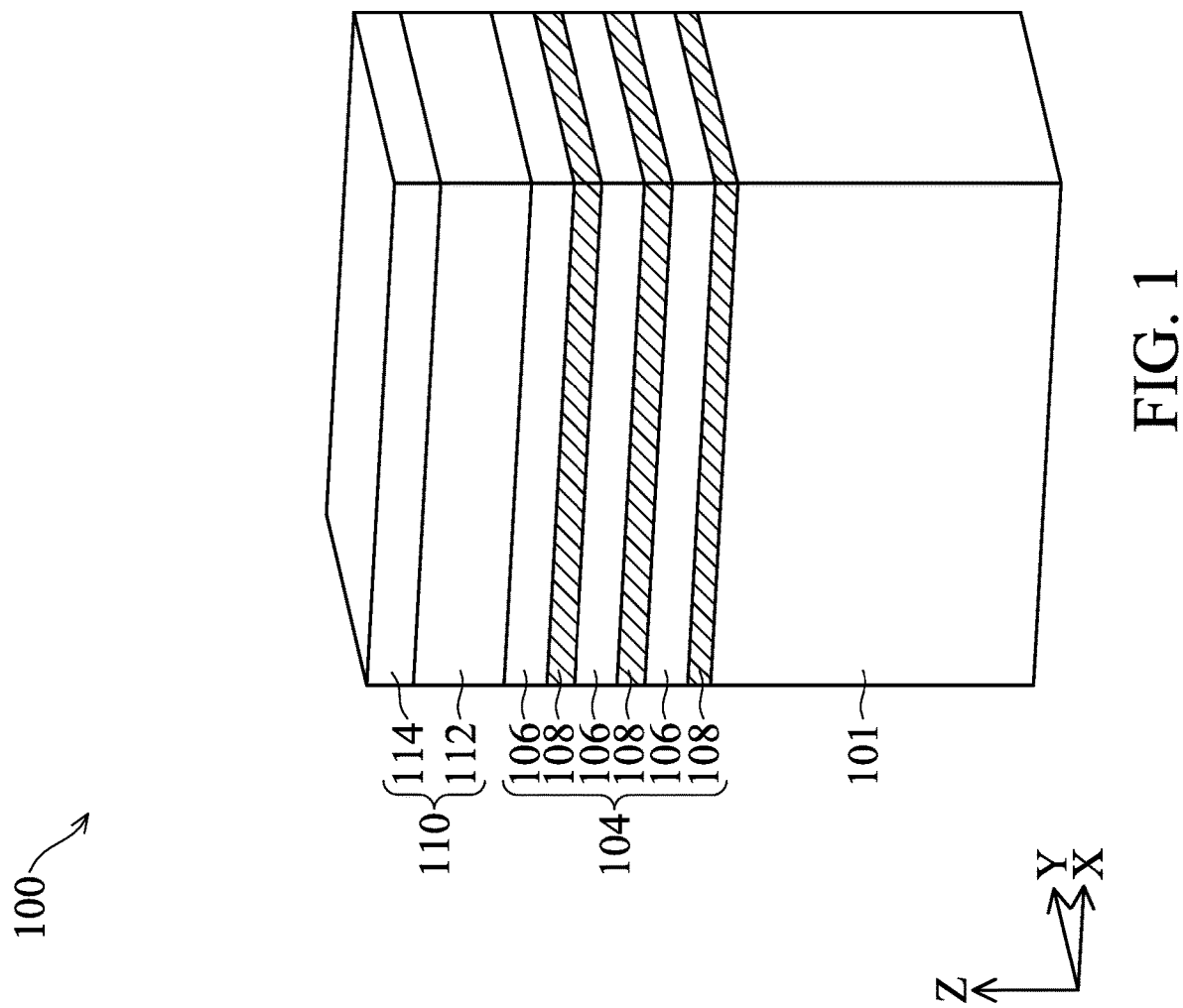
FIGS. 1-16 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-33E show exemplary sequential processes for manufacturing a semiconductor device structure 100, in accordance with some embodiments. It is understood that additional operations can be provided before, during, and after processes shown by FIGS. 1-33E and some of the operations described below can be replaced or eliminated, for additional embodiments of the method. The order of the operations/processes may be interchangeable.

FIGS. 1-16 are perspective views of various stages of manufacturing a semiconductor device structure, in accordance with some embodiments. As shown in FIG. 1, a stack of semiconductor layers 104 is formed over a substrate 101. The substrate 101 may be a semiconductor substrate. In some embodiments, the substrate 101 includes a single crystalline semiconductor layer on at least the surface of the substrate 101. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include one or more buffer layers (not shown) on the surface of the substrate 101. The buffer layers can serve to gradually change the lattice constant from that of the substrate to that of the source/drain (S/D) regions to be grown on the substrate 101. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, and InP. In one embodiment, the substrate 101 includes SiGe buffer layers epitaxially grown on the silicon substrate 101. The germanium concentration of the SiGe buffer layers may increase from 30 atomic percent germanium for the bottom-most buffer layer to 70 atomic percent germanium for the top-most buffer layer.

The substrate 101 may include various regions that have been suitably doped with impurities (e.g., p-type or n-type impurities). The dopants are, for example boron for a p-type field effect transistor (FET) and phosphorus for an n-type FET.

The stack of semiconductor layers 104 includes first semiconductor layers 106 and second semiconductor layers 108. The first semiconductor layers 106 and the second semiconductor layers 108 are made of semiconductor materials having different etch selectivity and/or oxidation rates. For example, the first semiconductor layers 106 are made of Si and the second semiconductor layers 108 are made of SiGe. In some embodiments, the stack of semiconductor layers 104 includes alternating first and second semiconductor layers 106, 108. The first semiconductor layers 106 or portions thereof may form nanostructure channel(s) of the semiconductor device structure 100 at a later stage. The semiconductor device structure 100 may include a nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanostructure channel(s) of the semiconductor device structure 100 may be surrounded by the gate electrode layer. The nanostructure transistors may be referred to as nanosheet transistors, nanowire transistors, gate-all-around (GAA) transistors, multi-bridge channel (MBC) transistors, or any transistors having the gate electrode layer surrounding the channels. The use of the first semiconductor layers 106 to define a channel or channels of the semiconductor device structure 100 is further discussed below. In some embodiments, the first and second semiconductor layers 106, 108 are replaced with a single semiconductor material connected to the substrate 101, and the device is a FinFET. The nanostructure transistors may be used in any suitable application. In some embodiments, the nanostructure transistors may form static random-access memory (SRAM).

It is noted that 3 layers of the first semiconductor layers 106 and 3 layers of the second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104; the number of layers depending on the predetermined number of channels for the semiconductor device structure 100. In some embodiments, the number of first semiconductor layers 106, which is the number of channels, is between 3 and 8.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

A mask structure 110 is formed over the stack of semiconductor layers 104. The mask structure 110 may include an oxygen-containing layer 112 and a nitrogen-containing layer 114. The oxygen-containing layer 112 may be a pad oxide layer, such as a SiO$_2$ layer. The nitrogen-containing layer 114 may be a pad nitride layer, such as Si$_3$N$_4$. The mask structure 110 may be formed by any suitable deposition process, such as chemical vapor deposition (CVD) process.

Figure 2:
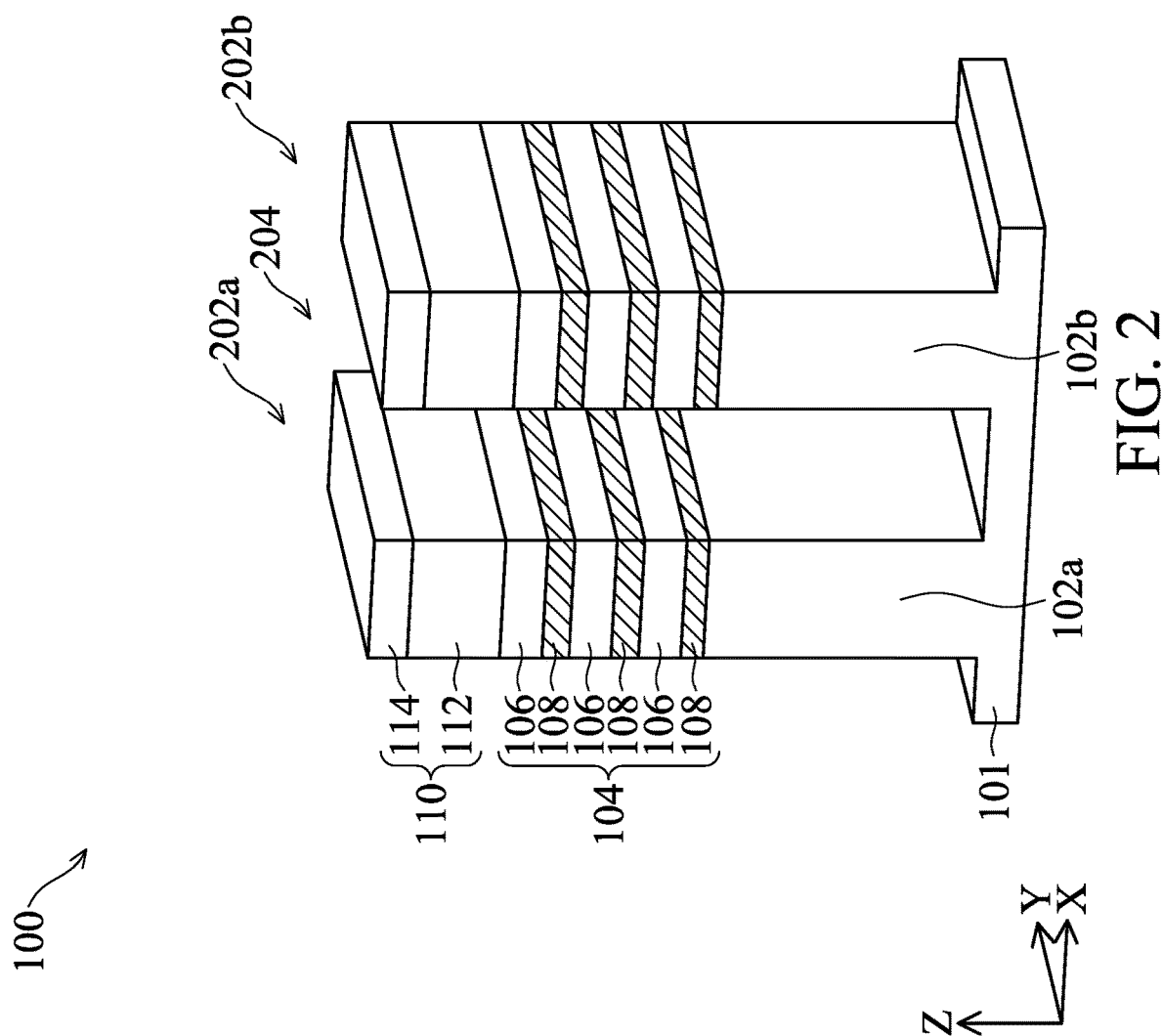

FIG. 2 is a perspective view of one of the various stages of manufacturing the semiconductor device structure 100, in accordance with some embodiments. As shown in FIG. 2, fins 202a and 202b are formed. In some embodiments, each fin 202a, 202b includes a substrate portion 102a, 102b formed from the substrate 101, a portion of the stack of semiconductor layers 104, and a portion of the mask structure 110. The fins 202a, 202b may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 202a, 202b by etching the stack of semiconductor layers 104 and the substrate 101. The etch process can include dry etch, wet etch, reactive ion etch (RIE), and/or other suitable processes. As shown in FIG. 2, two fins are formed, but the number of the fins is not limited to two.

In some embodiments, the fins 202a, 202b may be fabricated using suitable processes including photolithography and etch processes. The photolithography process may include forming a photoresist layer (not shown) over the mask structure 110, exposing the resist to a pattern, performing post-exposure bake processes, and developing the resist to form a patterned resist. In some embodiments, patterning the resist to form the patterned resist may be performed using an electron beam (e-beam) lithography process. The patterned resist may then be used to protect regions of the substrate 101, and layers formed thereupon, while an etch process forms trenches 204 in unprotected regions through the mask structure 110, the stack of semiconductor layers 104, and into the substrate 101, thereby leaving the extending fins 202a, 202b. The trenches 204 may be etched using a dry etch (e.g., RIE), a wet etch, and/or combination thereof.

Figure 3:
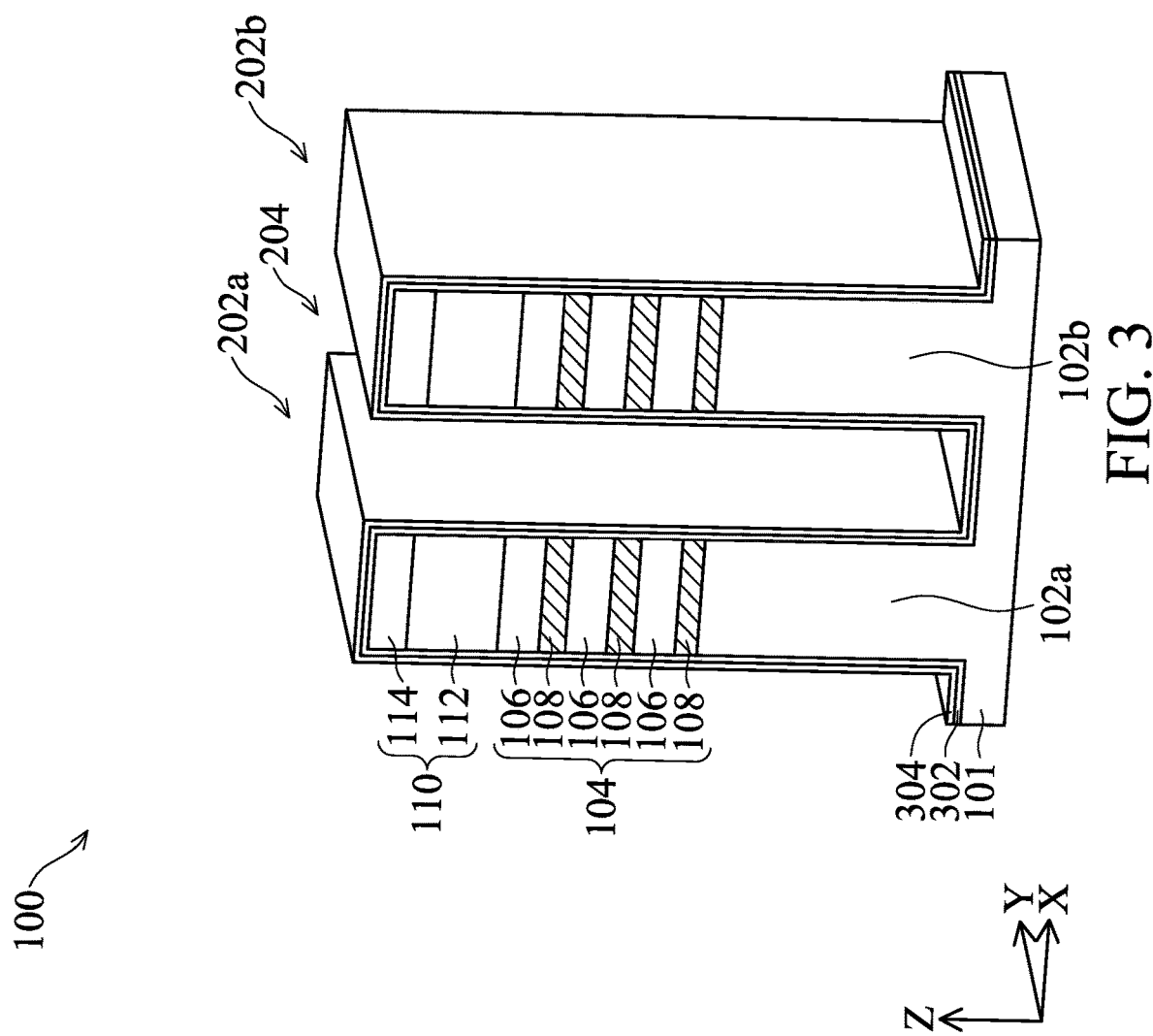

FIG. 3 is a perspective view of one of the various stages of manufacturing the semiconductor device structure 100, in accordance with some embodiments. As shown in FIG. 3, a liner 304 is formed over the substrate 101 and the fins 202a, 202b. In some embodiments, an optional liner 302 may be formed on the substrate 101 and fins 202a, 202b, and the liner 304 is formed on the optional liner 302. The liner 304 may be made of a semiconductor material, such as Si. In some embodiments, the liner 304 is made of the same material as the substrate 101. The optional liner 302 may be made of an oxygen-containing material, such as an oxide. The liner 304 may be a conformal layer and may be formed by a conformal process, such as an atomic layer deposition (ALD) process. The term "conformal" may be used herein for ease of description upon a layer having substantial same thickness over various regions. The optional liner 302 may be a conformal layer and may be formed by a conformal process, such as an ALD process.

Figure 4:
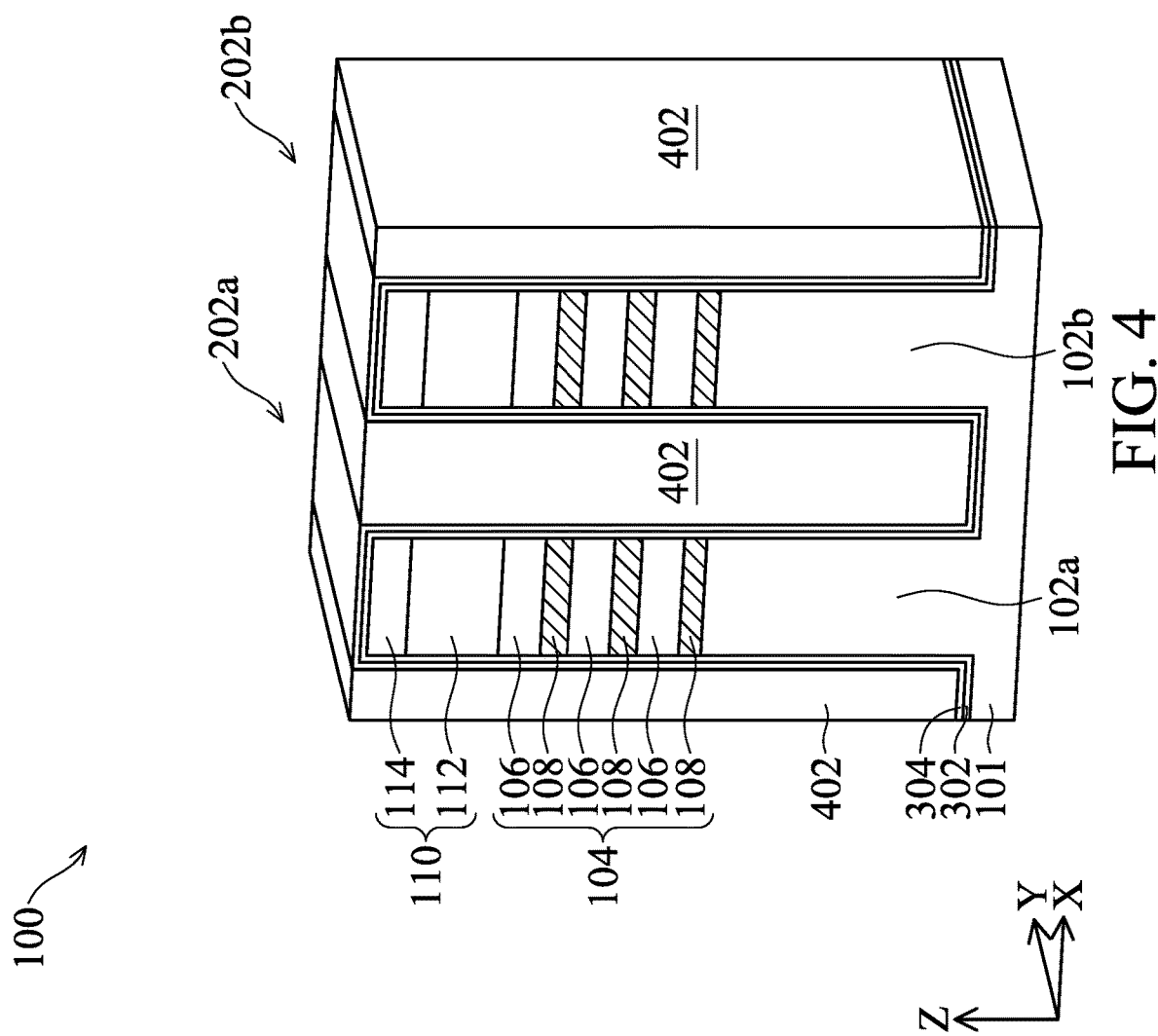

FIG. 4 is a perspective view of one of the various stages of manufacturing the semiconductor device structure 100, in accordance with some embodiments. As shown in FIG. 4, an insulating material 402 is formed on the substrate 101. The insulating material 402 fills the trench 204 (FIG. 2). The insulating material 402 may be first formed over the substrate 101 so that the fins 202a, 202b are embedded in the insulating material 402. Then, a planarization operation, such as a chemical mechanical polishing (CMP) process and/or an etch-back process, is performed such that the tops of the fins 202a, 202b (e.g., the liner 304) are exposed from the insulating material 402, as shown in FIG. 4. The insulating material 402 may be made of an oxygen-containing material, such as silicon oxide or fluorine-doped silicate glass (FSG); a nitrogen-containing material, such as silicon nitride, silicon oxynitride (SiON), SiOCN, SiCN; a low-K dielectric material; or any suitable dielectric material. The insulating material 402 may be formed by any suitable method, such as low-pressure chemical vapor deposition (LPCVD), plasma enhanced CVD (PECVD) or flowable CVD (FCVD).

Figure 5:
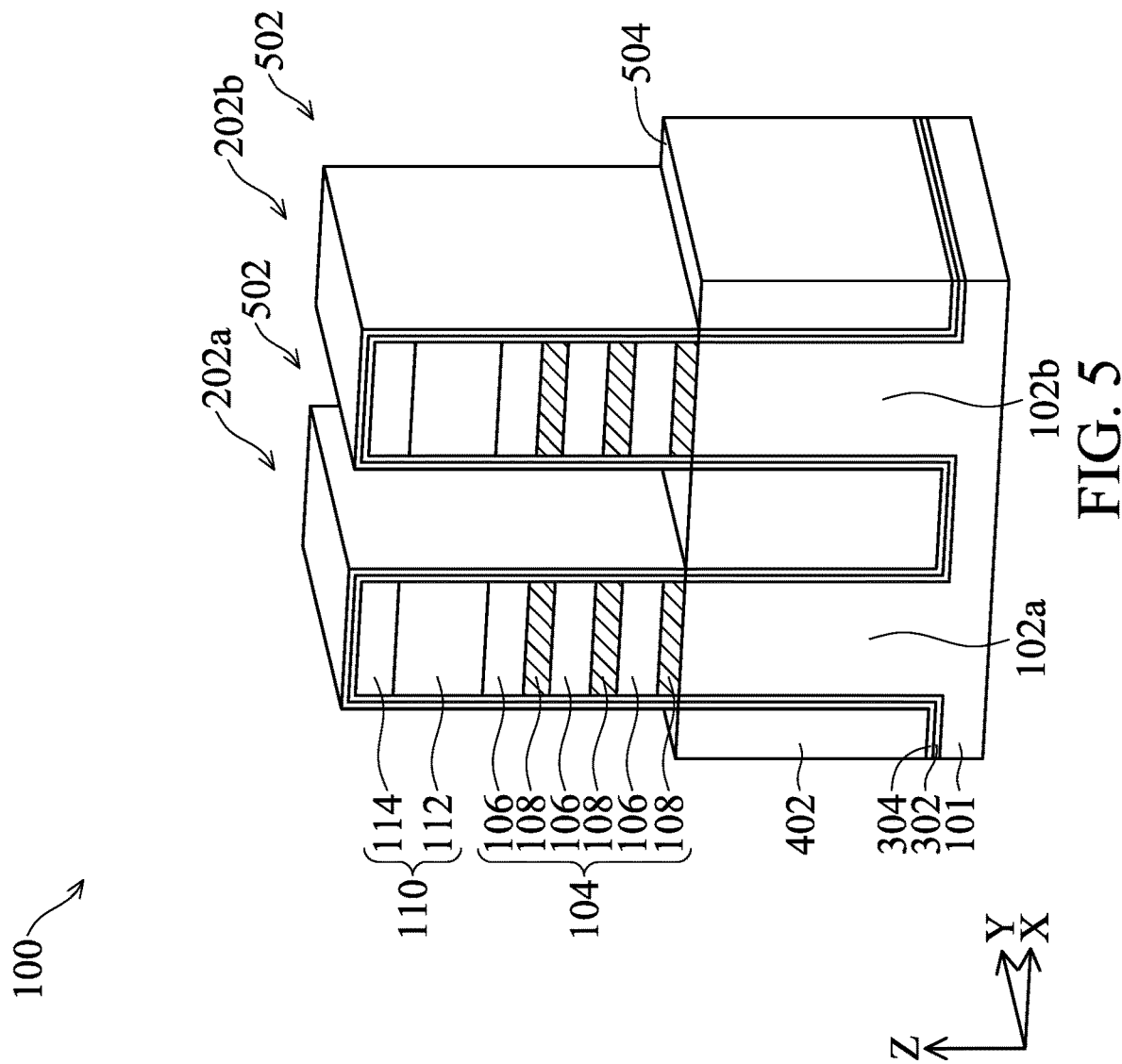

Next, as shown in FIG. 5, the insulating material 402 may be recessed by removing a portion of the insulating material 402 located between adjacent fins 202a, 202b to form trenches 502. The trenches 502 may be formed by any suitable removal process, such as dry etch or wet etch that selectively removes the insulating material 402 but not the semiconductor material of the liner 304. The recessed insulating material 402 may be the shallow trench isolation (STI). The insulating material 402 includes a top surface 504 that may be level with or below a surface of the second semiconductor layers 108 in contact with the substrate portions 102a, 102b of the substrate 101.

Figure 6:
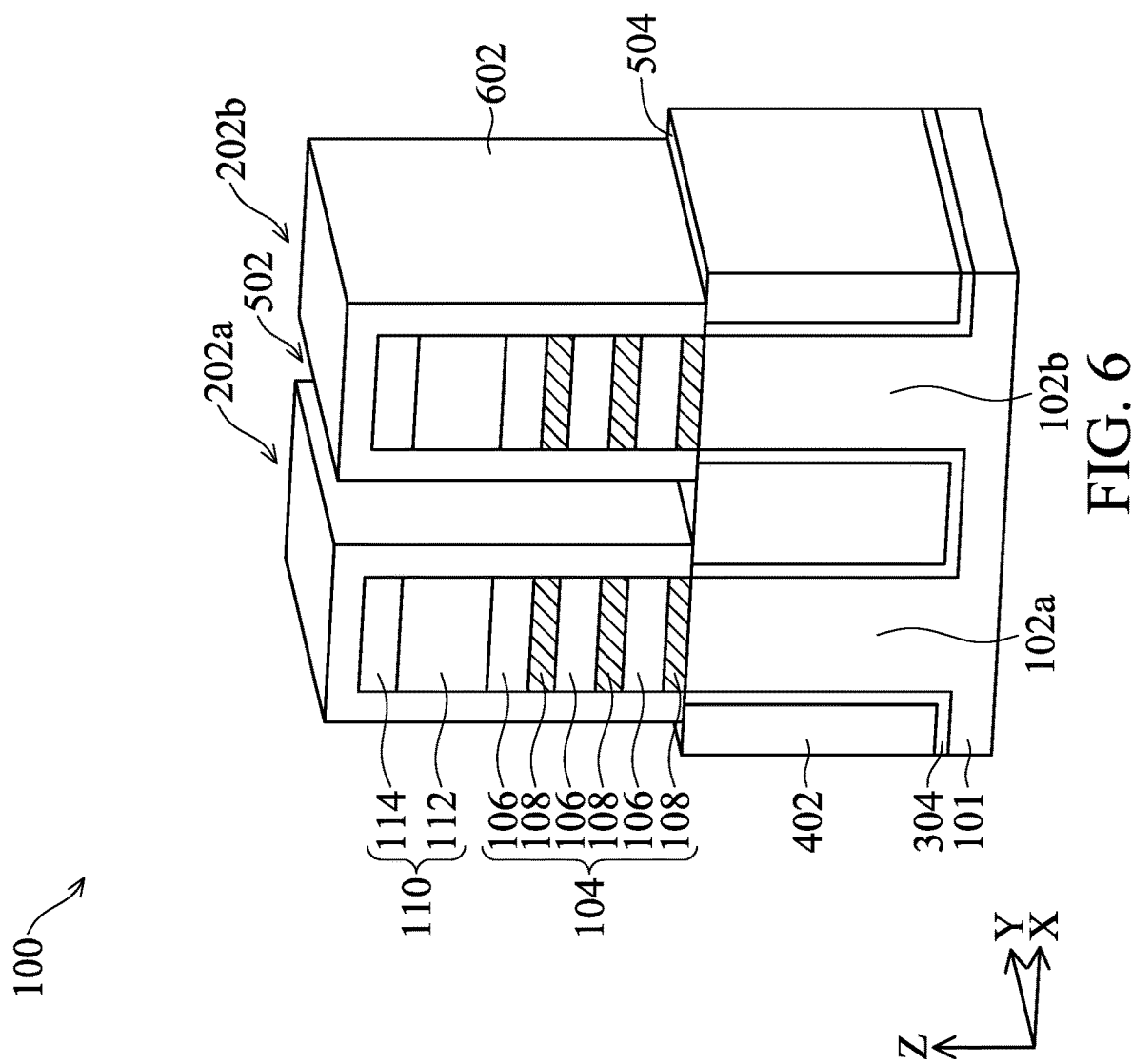

Next, as shown in FIG. 6, a cladding layer 602 is formed on the exposed surface of the liner 304 (FIG. 5), and the optional liner 302 is omitted for clarity. The liner 304 may be diffused into the cladding layer 602 during the formation of the cladding layer 602. Thus, in some embodiments where the optional liner 302 does not exist, the cladding layer 602 is in contact with the stack of semiconductor layers 104, as shown in FIG. 6. In some embodiments, the cladding layer 602 includes a semiconductor material. The cladding layer 602 grows on semiconductor materials but not on dielectric materials. For example, the cladding layer 602 includes SiGe and is grown on the Si of the liner 304 but not on the dielectric material of the insulating material 402. In some embodiments, the cladding layer 602 may be formed by first forming a semiconductor layer on the liner 304 and the insulating material 402, and followed by an etch process to remove portions of the semiconductor layer formed on the insulating material 402. The etch process may remove some of the semiconductor layer formed on the top of the fins 202a, 202b, and the cladding layer 602 formed on the top of the fins 202a, 202b may have a curved profile instead of a flat profile. In some embodiments, the cladding layer 602 and the second semiconductor layers 108 include the same material having the same etch selectivity. For example, the cladding layer 602 and the second semiconductor layers 108 include SiGe. The cladding layer 602 and the second semiconductor layer 108 may be removed subsequently to create space for the gate electrode layer.

Figure 7:
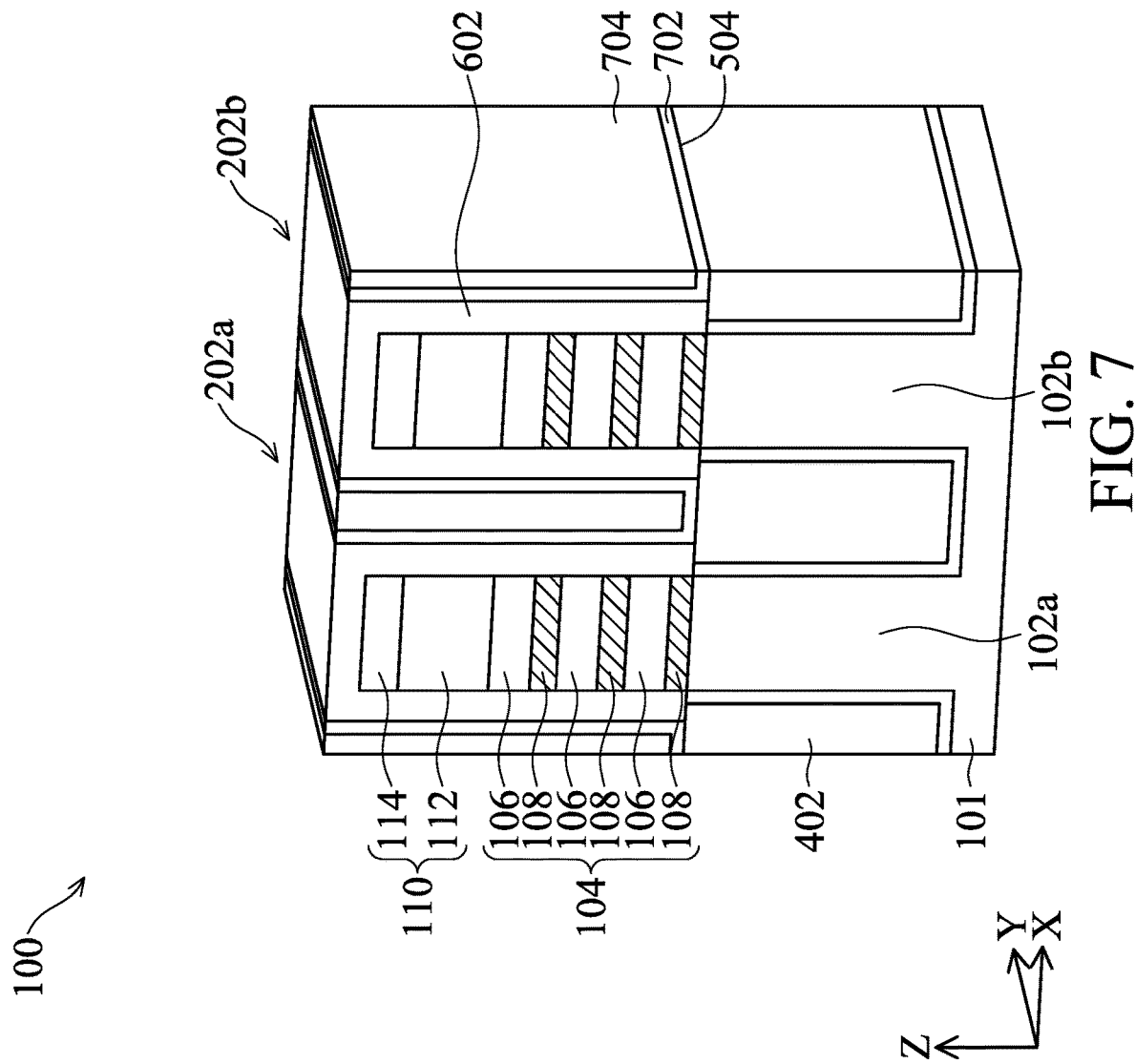

Next, as shown in FIG. 7, a liner 702 is formed on the cladding layer 602 and the top surface 504 of the insulating material 402. The liner 702 may include $SiO_2$, SiN, SiCN, SiOC, SiOCN, or a low-K dielectric material (e.g., a material having a K value lower than that of $SiO_2$). The liner 702 may be formed by a conformal process, such as an ALD process. The liner 702 may have a thickness ranging from about 1 nm to about 6 nm. The liner 702 may function as a shell to protect a flowable oxide material to be formed in the trenches 502 (FIG. 5) during subsequent removal of the cladding layer 602. Thus, if the thickness of the liner 702 is less than about 1 nm, the flowable oxide material may not be sufficiently protected. On the other hand, if the thickness of the liner 702 is greater than about 6 nm, the trenches 502 (FIG. 5) may be filled.

A dielectric material 704 is formed in the trenches 502 (FIG. 5) and on the liner 702, as shown in FIG. 7. The dielectric material 704 may be an oxygen-containing material, such as an oxide, formed by FCVD. The oxygen-containing material may have a K value less than about 7, for example less than about 3. A planarization process, such as a CMP process, may be performed to remove portions of the liner 702 and the dielectric material 704 formed over the fins 202a, 202b. The portion of the cladding layer 602 disposed on the nitrogen-containing layer 114 may be exposed after the planarization process.

Figure 8:
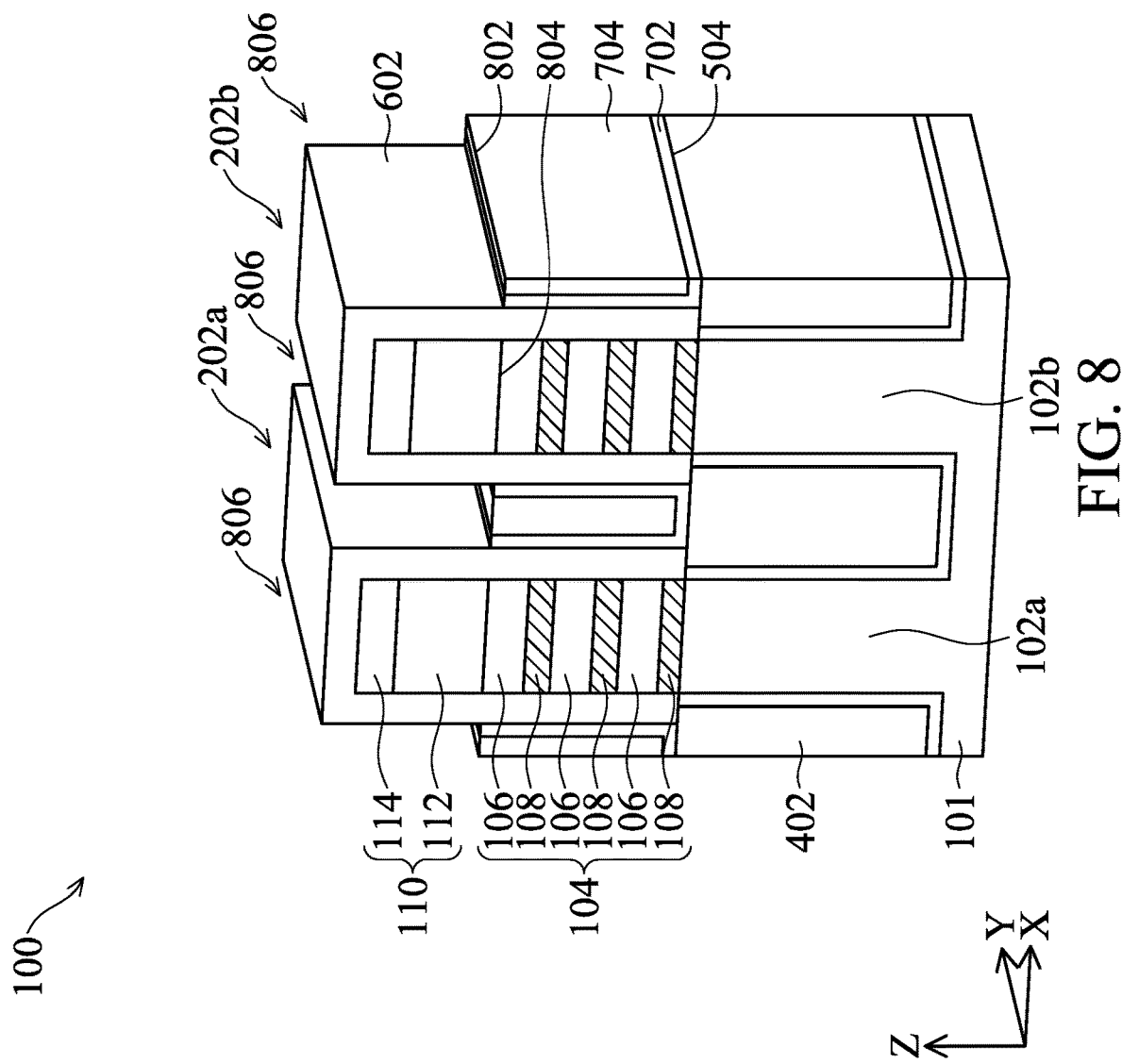

Next, as shown in FIG. 8, the liner 702 and the dielectric material 704 are recessed to the level of the topmost first semiconductor layer 106. For example, in some embodiments, after the recess process, the dielectric material 704 may include a top surface 802 that is substantially level with a top surface 804 of the topmost first semiconductor layer 106. The top surface 804 of the topmost first semiconductor layer 106 may be in contact with the mask structure 110, such as in contact with the oxygen-containing layer 112. The liner 702 may be recessed to the same level as the dielectric material 704. The recess of the liners 702 and the dielectric material 704 may be performed by any suitable process, such as dry etch, wet etch, or a combination thereof. In some embodiments, a first etch process may be performed to recess the dielectric material 704 followed by a second etch process to recess the liner 702. The etch processes may be selective etch processes that do not remove the semiconductor material of the cladding layer 602. As a result of the recess process, trenches 806 are formed between the fins 202a, 202b.

Figure 9:
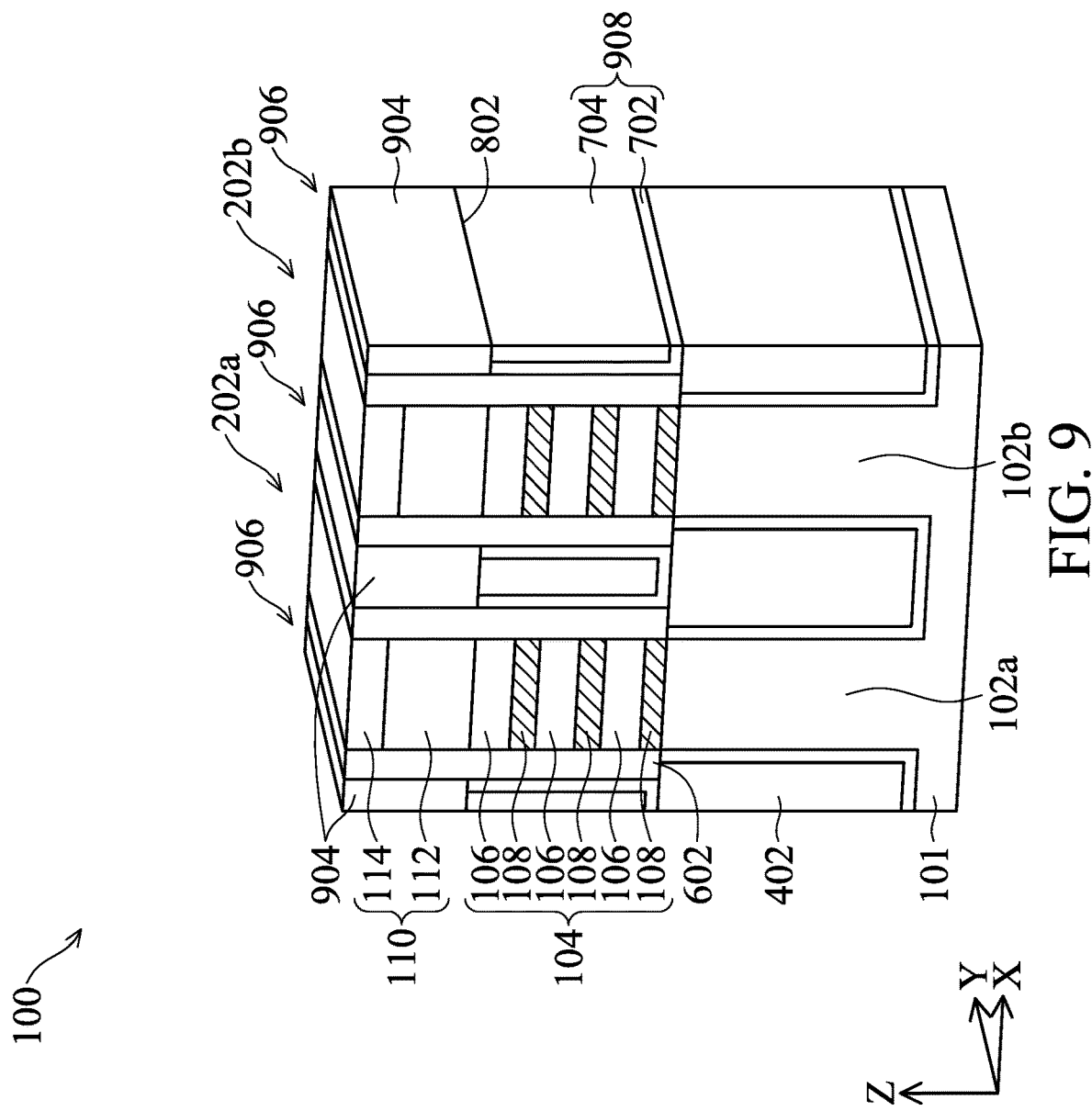

A dielectric material 904 is formed in the trenches 806 (FIG. 8) and on the dielectric material 704, the liner 702, as shown in FIG. 9. The dielectric material 904 may include SiO, SiN, SiC, SiCN, SiON, SiOCN, AlO, AlN, AlON, ZrO, ZrN, ZrAlO, HfO, or other suitable dielectric material. In some embodiments, the dielectric material 904 includes a high-K dielectric material (e.g., a material having a K value higher than that of $SiO_2$). The dielectric material 904 may be formed by any suitable process, such as a CVD, PECVD, FCVD, or ALD process. The dielectric material 904 may have a thickness ranging from about 5 nm to about 20 nm. The dielectric material 904 may fill the trenches 806 (FIG. 8). Thus, if the thickness of the dielectric material 904 is less than about 5 nm, the trenches 806 may not be filled. On the other hand, if the thickness of the dielectric material 904 is greater than about 20 nm, the manufacturing cost is increased without significant advantage.

A planarization process is performed to expose the nitrogen-containing layer 114 of the mask structure 110, as shown in FIG. 9. The planarization process may be any suitable process, such as a CMP process. The planarization process removes portions of the dielectric material 904 and the cladding layer 602 disposed over the mask structure 110. The liner 702, the dielectric material 704, and the dielectric material 904 together may be referred to as a dielectric feature 906. The dielectric feature 906 includes a bottom portion 908 having a shell, which is the liner 702, and a core, which is the dielectric material 704. The dielectric feature further includes a top portion, which is the dielectric material 904. The dielectric feature 906 may be a dielectric fin that separates adjacent source/drain (S/D) epitaxial features 1502 (FIG. 15) and adjacent gate electrode layers 2006 (FIG. 20F).

Figure 10:
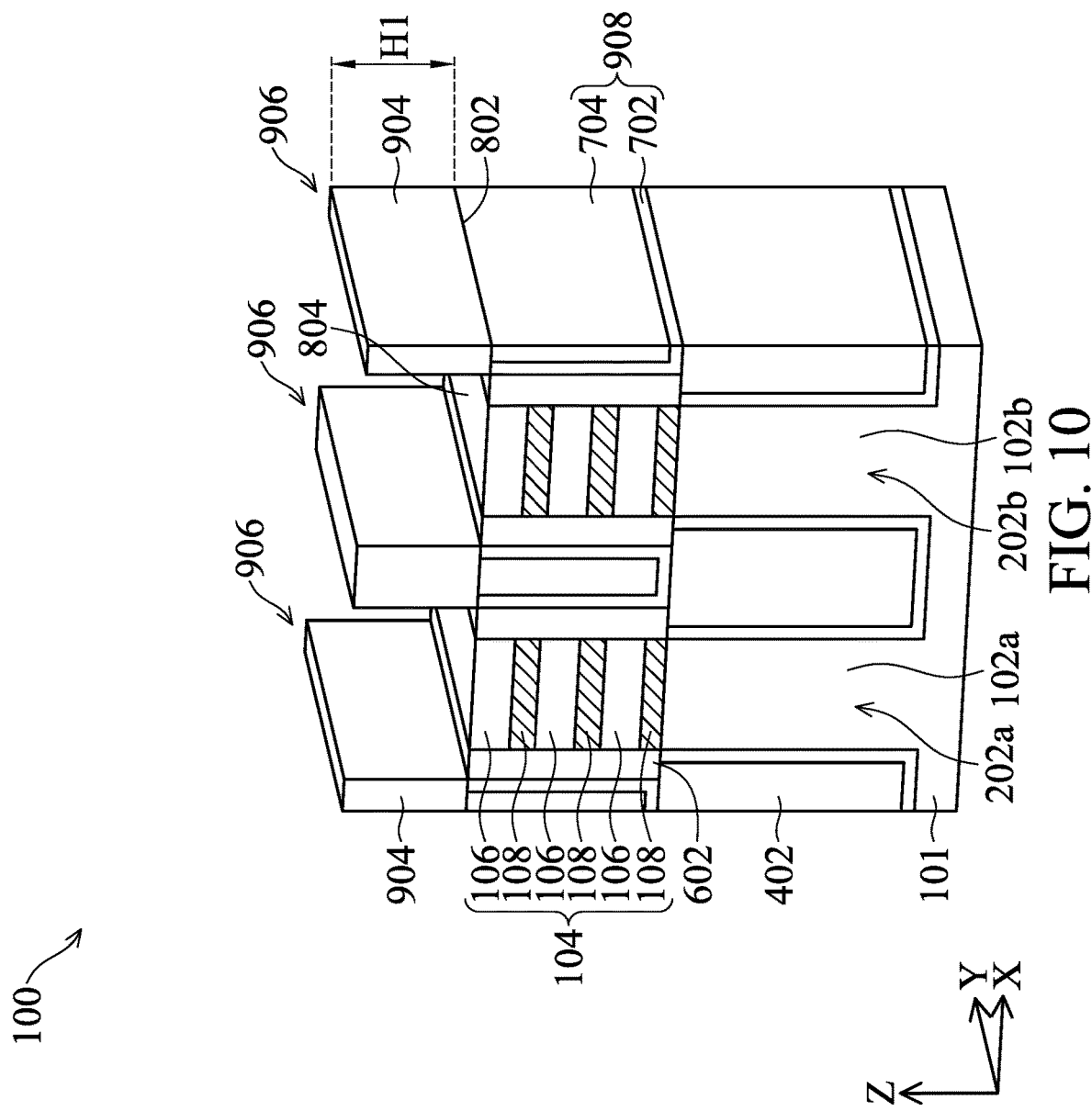

Next, as shown in FIG. 10, the cladding layers 602 are recessed, and the mask structures 110 are removed. The recess of the cladding layers 602 may be performed by any suitable process, such as dry etch, wet etch, or a combination thereof. The recess process may be controlled so that the remaining cladding layers 602 are substantially at the same level as the top surface 804 of the topmost first semiconductor layer 106 in the stack of semiconductor layers 104. The etch process may be a selective etch process that does not remove the dielectric material 904. The removal of the mask structures 110 may be performed by any suitable process, such as dry etch, wet etch, or a combination thereof. The removal of the mask structure 110 exposes the top surfaces 804 of the topmost first semiconductor layers 106 in the stacks of semiconductor layers 104.

The top portion of the dielectric feature 906 (e.g., the dielectric material 904) may have a height H1 along the Z direction. The height H1 may range from about 15 nm to about 50 nm. The dielectric material 904 may be disposed on the top surface 802 of the dielectric material 704, and the top surface 802 may be coplanar with the top surface 804 of the topmost first semiconductor layer 106 of the stack of semiconductor layers 104.

Figure 11:
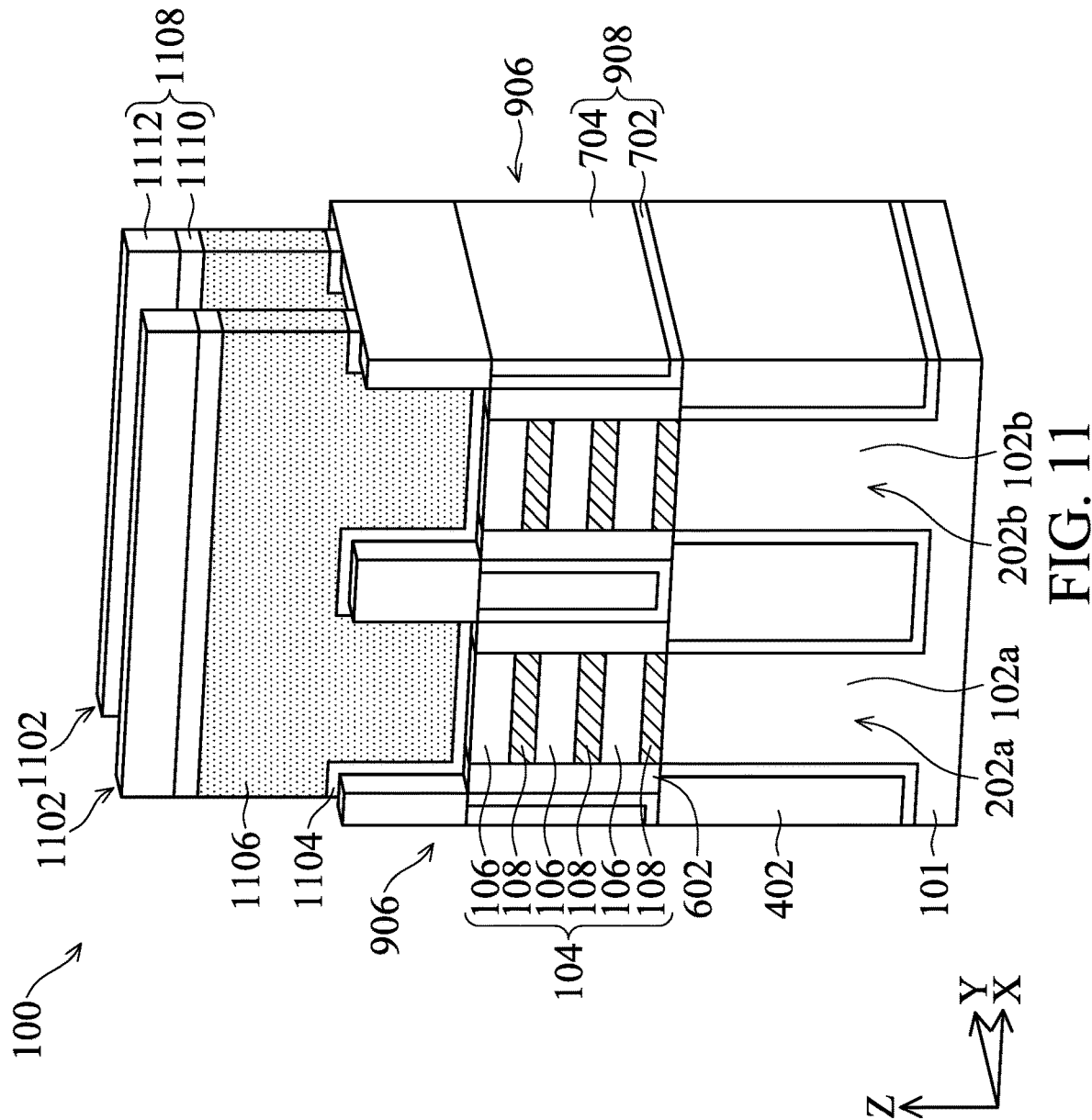

Next, as shown in FIG. 11, one or more sacrificial gate stacks 1102 are formed on the semiconductor device structure 100. The sacrificial gate stack 1102 may include a sacrificial gate dielectric layer 1104, a sacrificial gate electrode layer 1106, and a mask structure 1108. The sacrificial gate dielectric layer 1104 may include one or more layers of dielectric material, such as $SiO_2$, SiN, a high-K dielectric material, and/or other suitable dielectric material. In some embodiments, the sacrificial gate dielectric layer 1104 includes a material different than that of the dielectric material 904. In some embodiments, the sacrificial gate dielectric layer 1104 may be deposited by a CVD process, a sub-atmospheric CVD (SACVD) process, a FCVD process, an ALD process, a PVD process, or other suitable process. The sacrificial gate electrode layer 1106 may include polycrystalline silicon (polysilicon). The mask structure 1108 may include an oxygen-containing layer 1110 and a nitrogen-containing layer 1112. In some embodiments, the sacrificial gate electrode layer 1106 and the mask structure 1108 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 1102 may be formed by first depositing blanket layers of the sacrificial gate dielectric layer 1104, the sacrificial gate electrode layer 1106, and the mask structure 1108, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stack 1102, the stacks of semiconductor layers 104 of the fins 202a, 202b are partially exposed on opposite sides of the sacrificial gate stack 1102. As shown in FIG. 11, two sacrificial gate stacks 1102 are formed, but the number of the sacrificial gate stacks 1102 is not limited to two. More than two sacrificial gate stacks 1102 are arranged along the Y direction in some embodiments.

Figure 12:
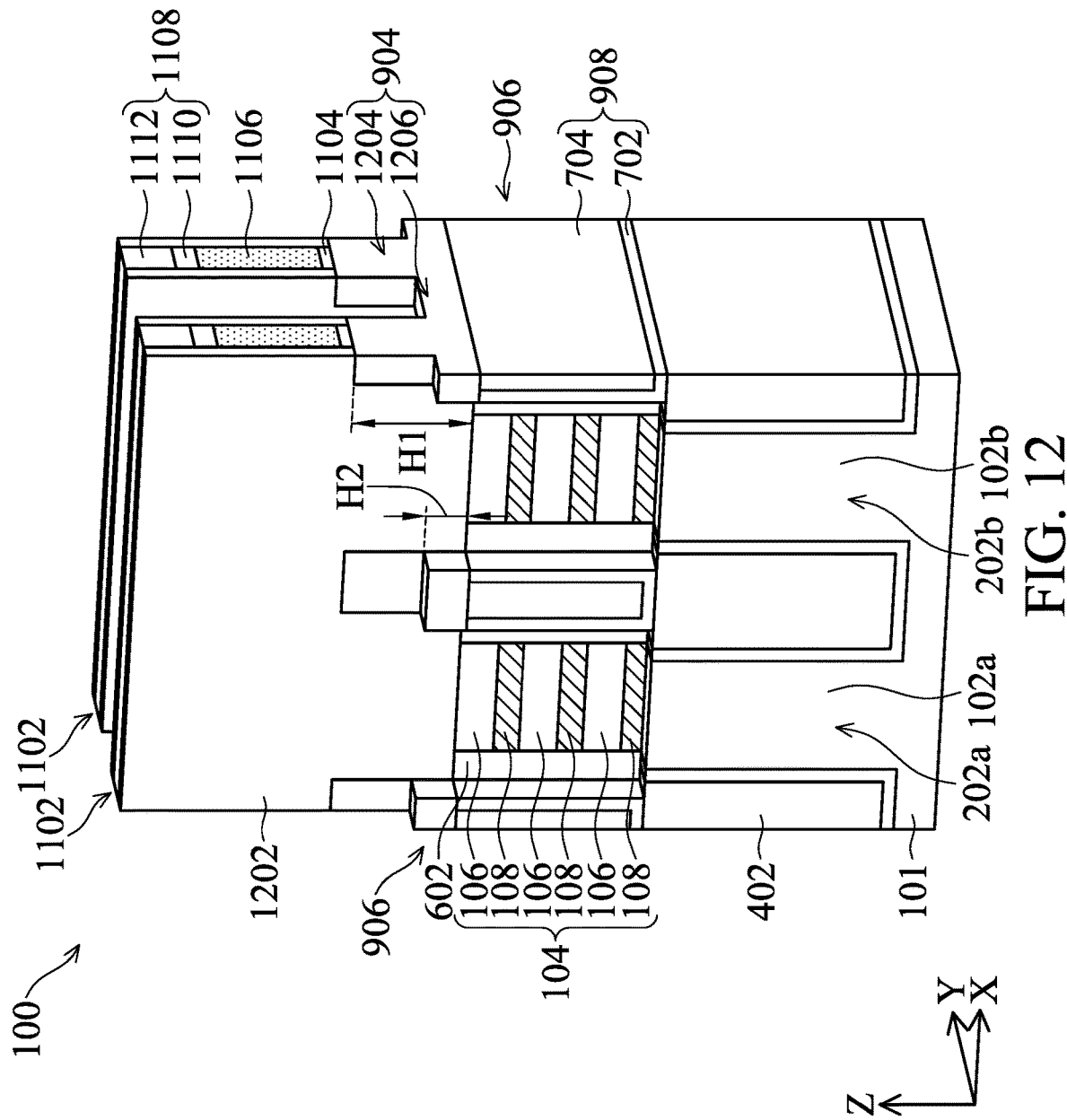

As shown in FIG. 12, a spacer 1202 is formed on the sidewalls of the sacrificial gate stacks 1102. The spacer 1202 may be formed by first depositing a conformal layer that is subsequently etched back to form sidewall spacers 1202. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fins 202a, 202b, the cladding layer 602, the dielectric material 904, leaving the spacers 1202 on the vertical surfaces, such as the sidewalls of sacrificial gate stack 1102. The spacer 1202 may be made of a dielectric material such as silicon oxide, silicon nitride, silicon carbide, silicon oxynitride, SiCN, silicon oxycarbide, SiOCN, and/or combinations thereof. In some embodiments, the spacer 1202 includes multiple layers, such as main spacer walls, liner layers, and the like.

Next, exposed portions of the fins 202a, 202b, exposed portions of the cladding layers 602, exposed portions of the dielectric material 904 not covered by the sacrificial gate stacks 1102 and the spacers 1202 are selectively recessed by using one or more suitable etch processes, such as dry etch, wet etch, or a combination thereof. In some embodiments, exposed portions of the stacks of semiconductor layers 104 of the fins 202a, 202b are removed, exposing portions of the substrate portions 102a, 102b, respectively. As shown in FIG. 12, the exposed portions of the fins 202a, 202b are recessed to a level at or below the top surface 504 of the insulating material 402. The recess processes may include an etch process that recesses the exposed portions of the fins 202a, 202b and the exposed portions of the cladding layers 602.

In some embodiments, the etch process may reduce the height of the exposed top portion (e.g., the dielectric material 904) of the dielectric feature 906 from H1 to H2, as shown in FIG. 12. Thus, a first portion 1204 of the dielectric material 904 under the sacrificial gate stack 1102 and the spacers 1202 has the height H1, while a second portion 1206 of the dielectric material 904 located between S/D epitaxial features 1502 (FIG. 15) has the height H2 less than the height H1.

At this stage, end portions of the stacks of semiconductor layers 104 under the sacrificial gate stacks 1102 and the spacers 1202 have substantially flat surfaces which may be flush with corresponding spacers 1202. In some embodiments, the end portions of the stacks of semiconductor layers 104 under the sacrificial gate stacks 1102 and spacers 1202 are slightly horizontally etched.

Figure 13:
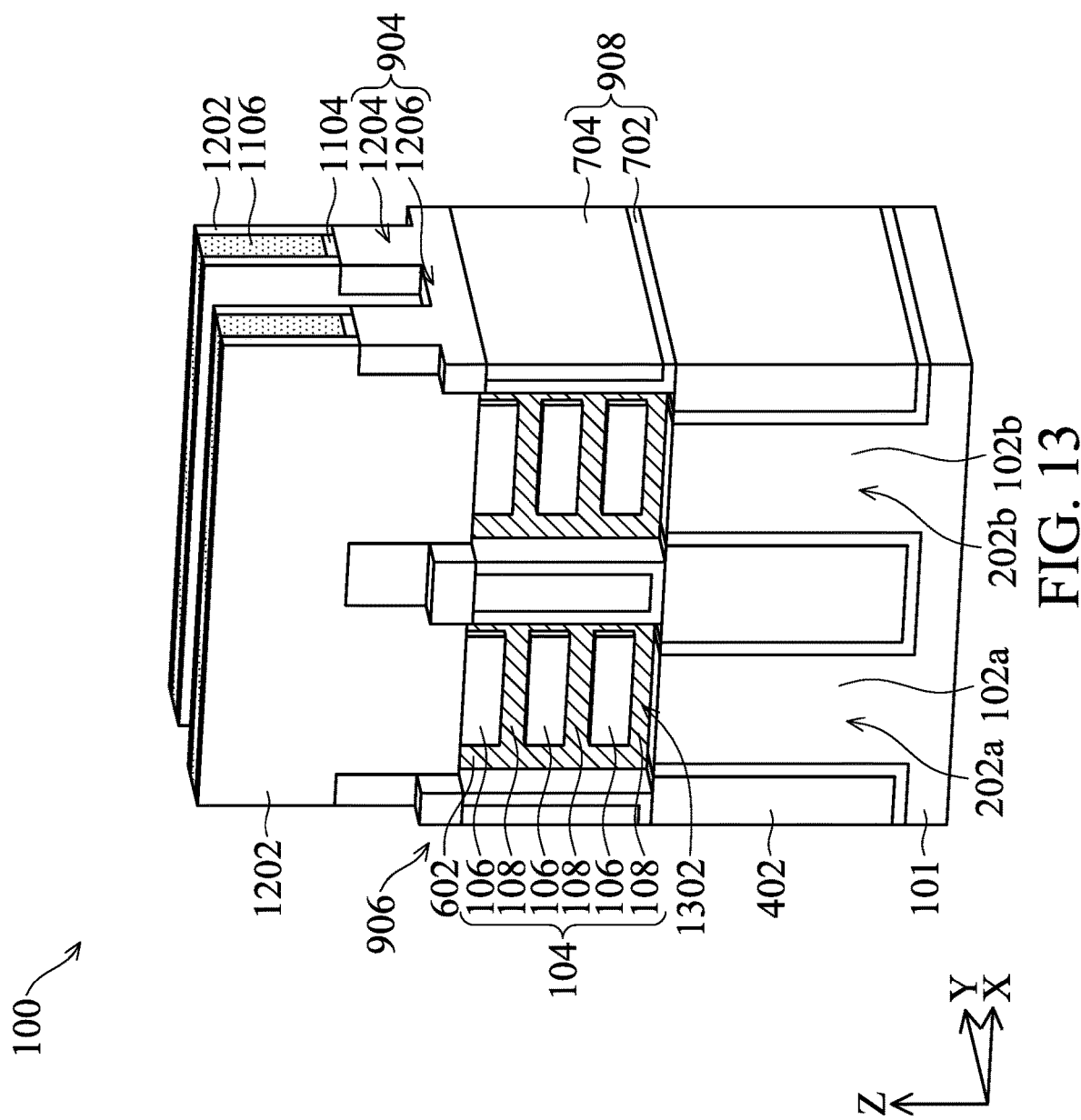

Next, as shown in FIG. 13, the edge portions of each second semiconductor layer 108 and edge portions of the cladding layers 602 are removed, forming gaps 1302. In some embodiments, the portions of the second semiconductor layers 108 and cladding layers 602 are removed by a selective wet etch process that does not remove the first semiconductor layers 106. For example, in cases where the second semiconductor layers 108 are made of SiGe, and the first semiconductor layers 106 are made of silicon, a selective wet etch including an ammonia and hydrogen peroxide mixtures (APM) may be used.

Figure 14:
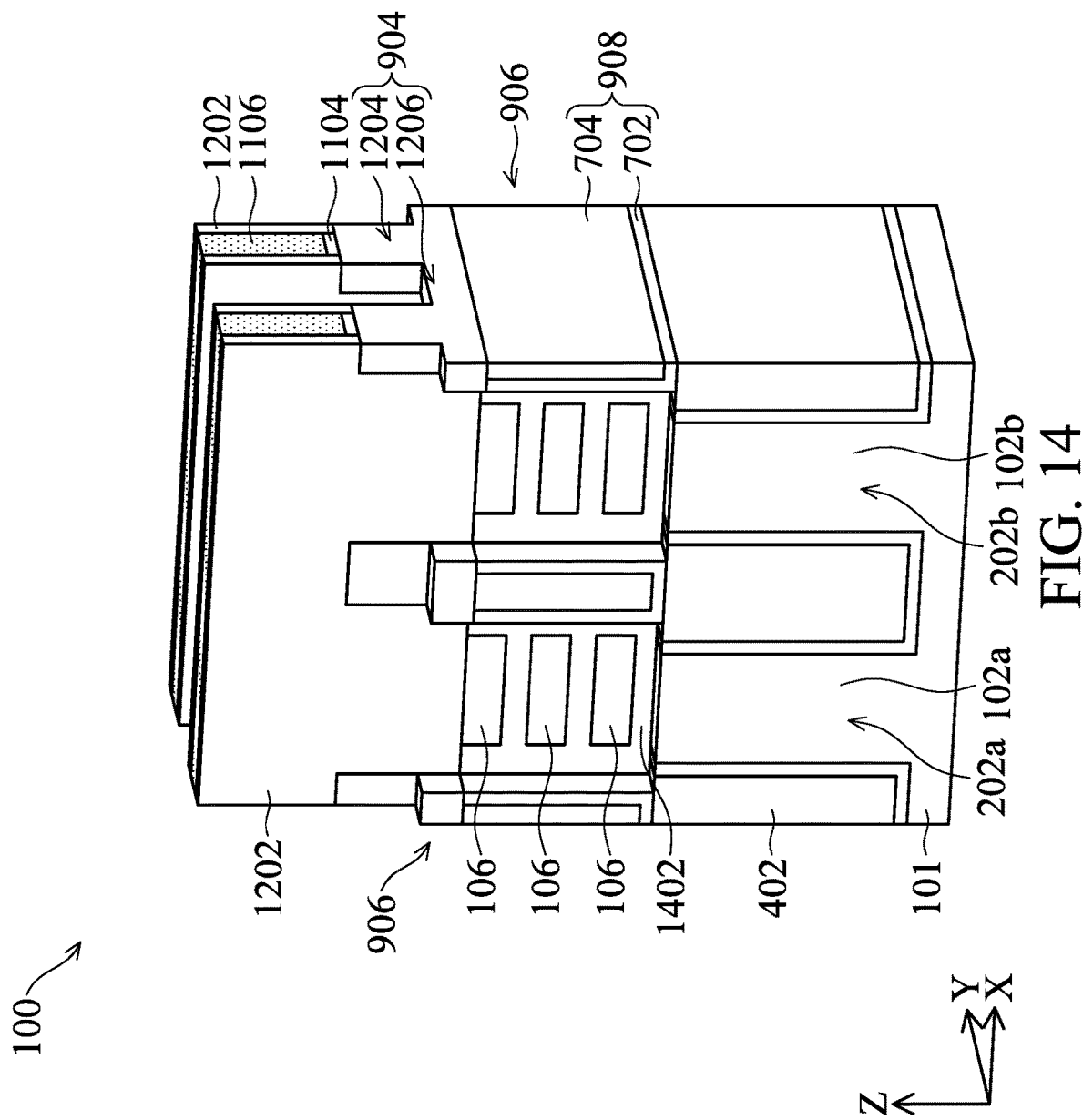

Next, as show in FIG. 14, dielectric spacers 1402 are formed in the gaps 1302. In some embodiments, the dielectric spacers 1402 may be made of a low-K dielectric material, such as SiON, SiCN, SiOC, SiOCN, or SiN. In some embodiments, the dielectric spacers 1402 may be formed by first forming a conformal dielectric layer using a conformal deposition process, such as ALD, followed by an anisotropic etch to remove portions of the conformal dielectric layer other than the dielectric spacers 1402. The dielectric spacers 1402 may be protected by the first semiconductor layers 106 and the spacers 1202 during the anisotropic etch process. In some embodiments, the dielectric spacers 1402 may be flush with the spacers 1202.

Figure 15:
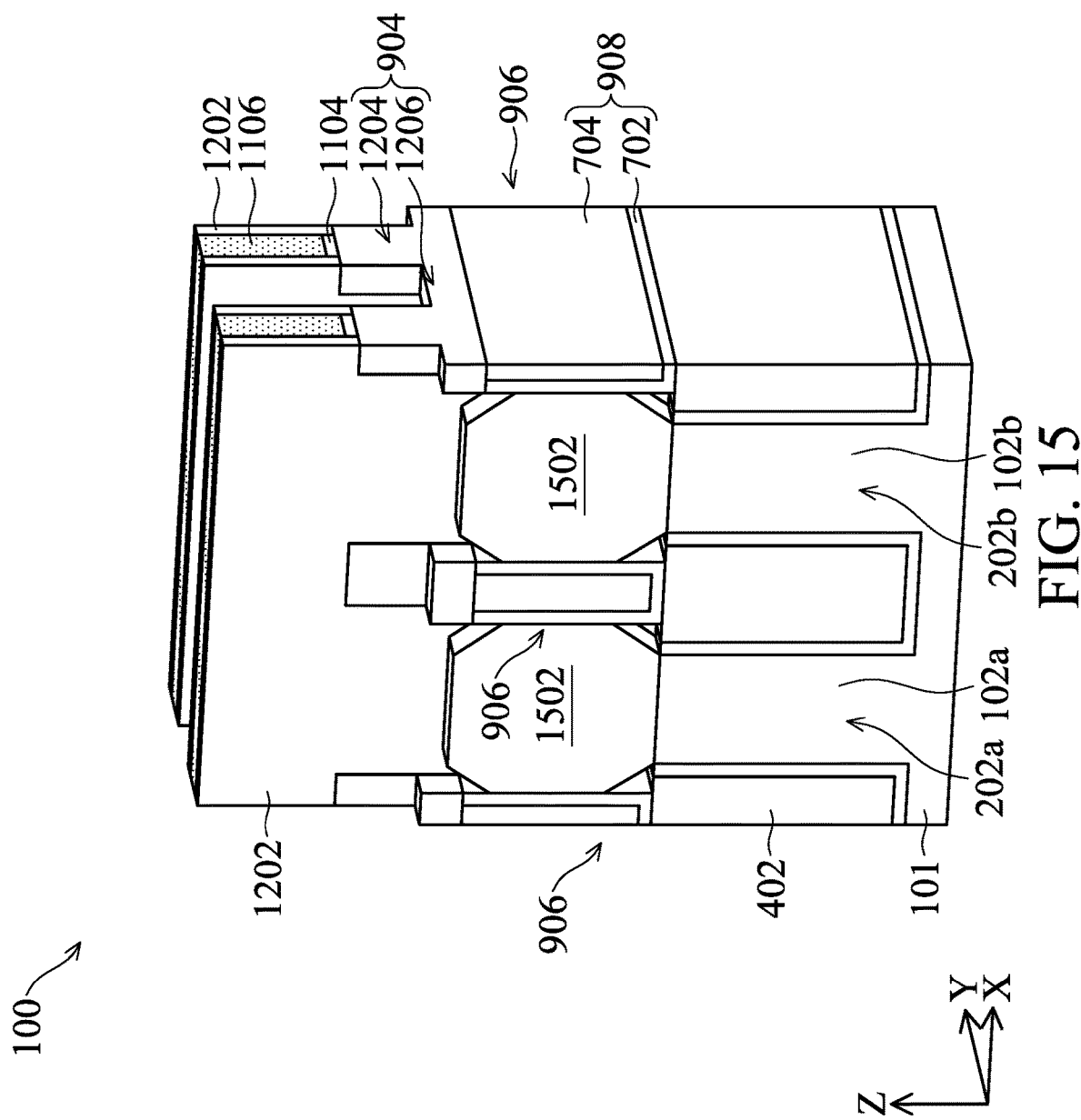

Next, as shown in FIG. 15, S/D epitaxial features 1502 are formed on the substrate portions 102*a*, 102*b* of the fins 202*a*, 202*b*. The S/D epitaxial feature 1502 may include one or more layers of Si, SiP, SiC and SiCP for an n-channel FET or Si, SiGe, Ge for a p-channel FET. The S/D epitaxial features 1502 may grow both vertically and horizontally to form facets, which may correspond to crystalline planes of the material used for the substrate portions 102*a*, 102*b*. The S/D epitaxial features 1502 are formed by an epitaxial growth method using CVD, ALD or MBE. The S/D epitaxial features 1502 are in contact with the first semiconductor layers 106 and dielectric spacers 1402 (FIG. 14). The S/D epitaxial features 1502 may be the S/D regions. In this disclosure, a source and a drain are interchangeably used, and the structures thereof are substantially the same.

Figure 16:
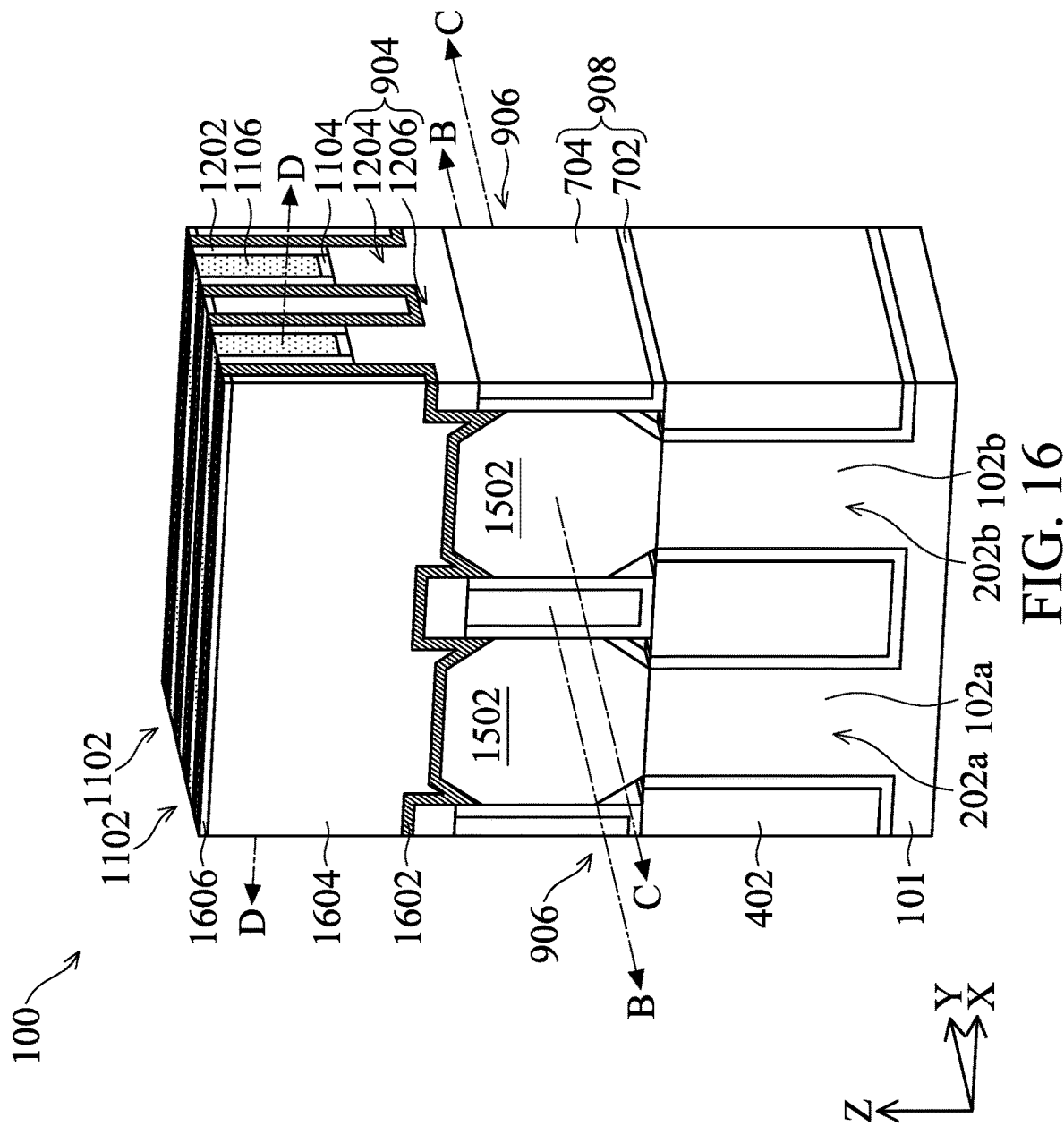

Next, as shown in FIG. 16, a contact etch stop layer (CESL) 1602 may be formed on the S/D epitaxial features 1502, the dielectric features 906, and adjacent the spacers 1202. The CESL 1602 may include an oxygen-containing material or a nitrogen-containing material, such as silicon nitride, silicon carbon nitride, silicon oxynitride, carbon nitride, silicon oxide, silicon carbon oxide, the like, or a combination thereof. The CESL 1602 may be formed by CVD, PECVD, ALD, or any suitable deposition technique. In some embodiments, the CESL 1602 is a conformal layer formed by the ALD process. An interlayer dielectric (ILD) layer 1604 may be formed on the CESL 1602. The materials for the ILD layer 1604 may include an oxide formed by tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1604 may be deposited by a PECVD process or other suitable deposition technique. In some embodiments, after formation of the ILD layer 1604, the semiconductor device structure 100 may be subject to a thermal process to anneal the ILD layer 1604.

A planarization process is performed to expose the sacrificial gate electrode layer 1106, as shown in FIG. 16. The planarization process may be any suitable process, such as a CMP process. The planarization process removes portions of the ILD layer 1604 and the CESL 1602 disposed on the sacrificial gate stacks 1102. The planarization process may also remove the mask structure 1108 (FIG. 11). The ILD layer 1604 may be recessed to a level below the top of the sacrificial gate electrode layer 1106, and a nitrogen-containing layer 1606, such as a SiCN layer, may be formed on the recessed ILD layer 1604, as shown in FIG. 16. The nitrogen-containing layer 1606 may protect the ILD layer 1604 during subsequent etch processes.

FIGS. 17A-19A are perspective views of various stages of manufacturing the semiconductor device structure 100, in accordance with some embodiments. FIGS. 17B-19B are cross-sectional side views of various stages of manufacturing the semiconductor device structure 100 taken along line A-A of FIG. 17A, in accordance with some embodiments.

Figure 17A:
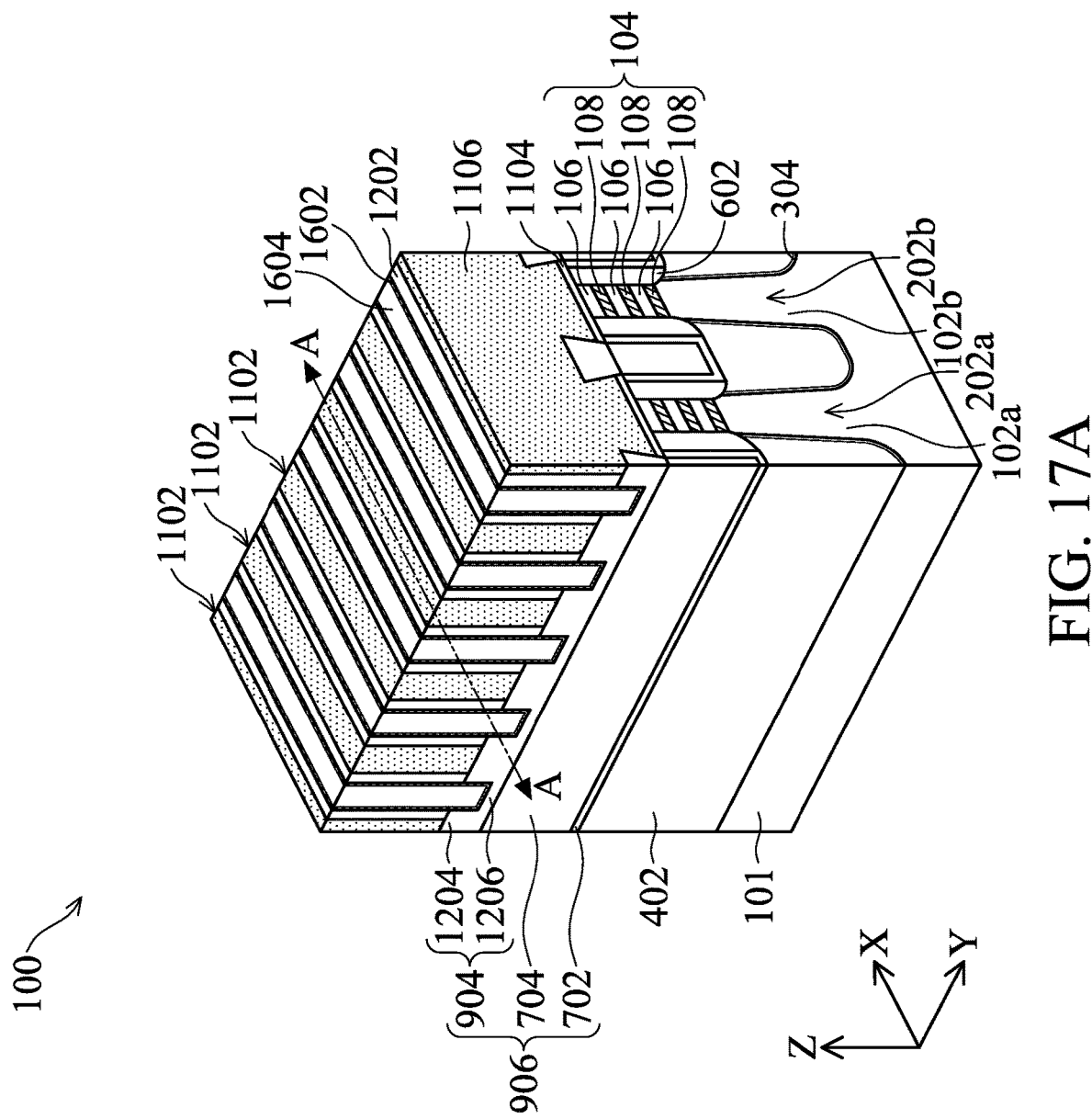
Figure 17B:
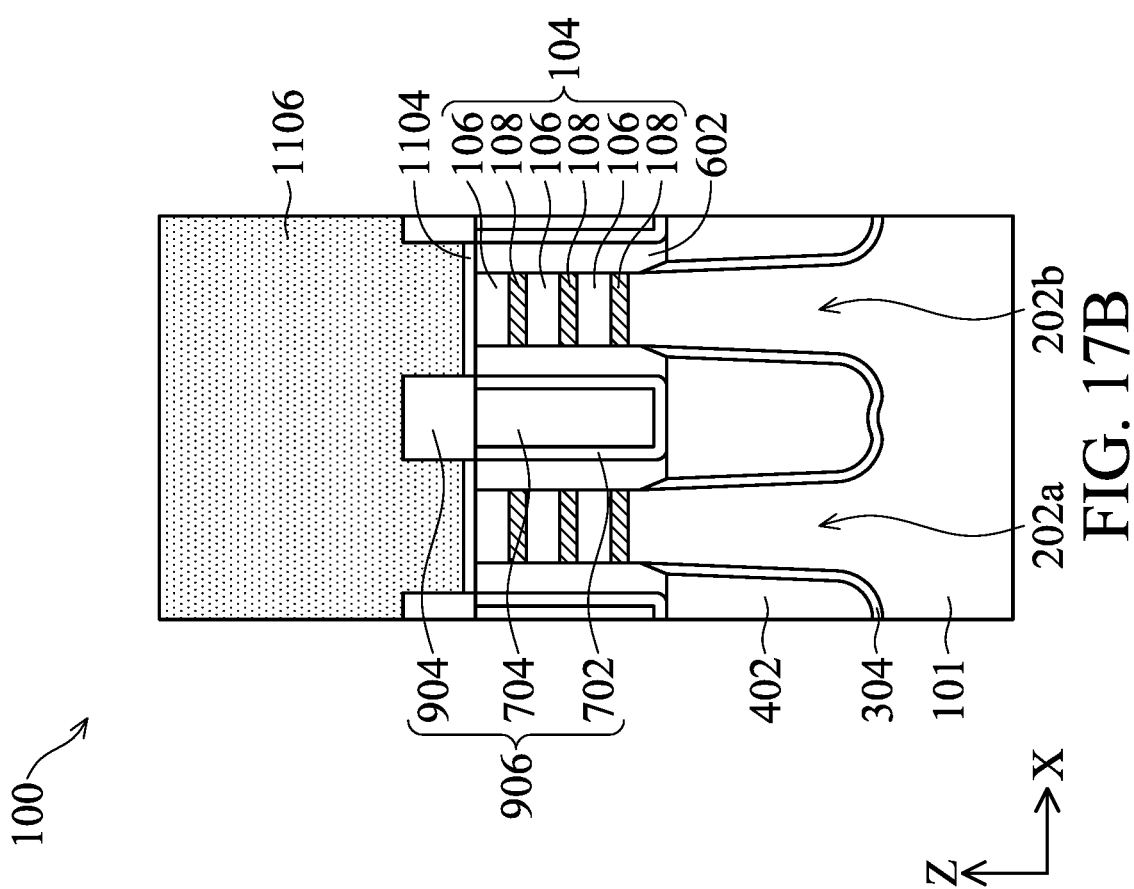

FIG. 17A illustrates a perspective view of the semiconductor device structure 100 of FIG. 16, and FIG. 17A shows a cross-section of the stack of semiconductor layers 104 and the sacrificial gate electrode layer 1106 and a cross-section of the insulating material 402 and dielectric feature 906. FIG. 17B is a cross-sectional side view of the semiconductor device structure 100 taken along line A-A of FIG. 17A. As shown in FIG. 17A, a plurality of sacrificial gate stacks 1102 are disposed over the fins 202*a*, 202*b*. The nitrogen-containing layers 1606 are omitted for clarity in FIGS. 17A-19A.

Figure 18A:
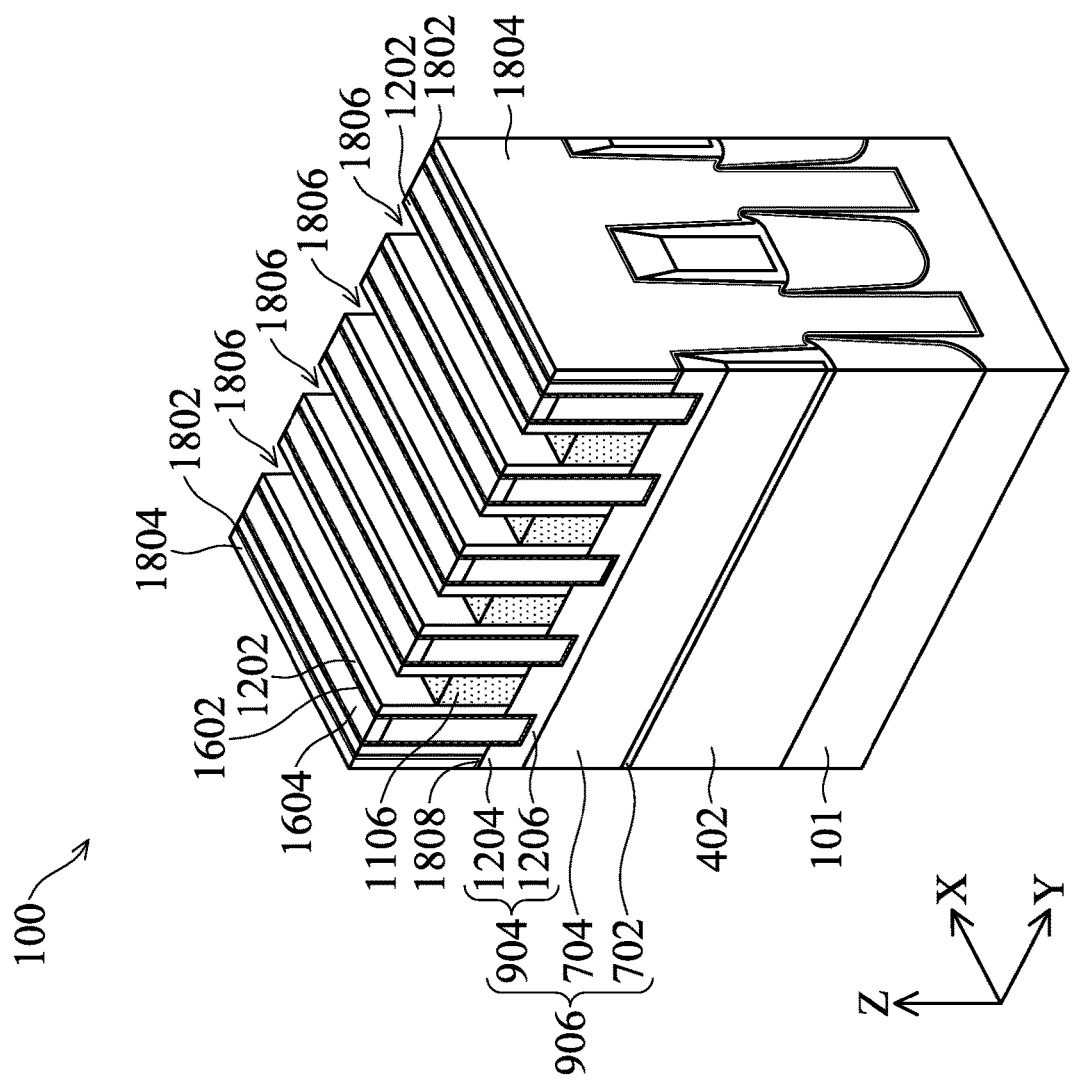

As shown in FIG. 18A, one or more of the sacrificial gate electrode layers 1106 are removed, and the portions of the stacks of semiconductor layers 104 and the portions of the fins 202*a*, 202*b* disposed thereunder are also removed. The removal process may be one or more etch processes. In some embodiments, because the sacrificial gate electrode layers 1106, the portions of the stacks of semiconductor layers 104, and the portions of the fins 202*a*, 202*b* are all made from a semiconductor material, a single etch process is performed to remove the sacrificial gate electrode layers 1106, the portions of the stacks of semiconductor layers 104, and the portions of the fins 202*a*, 202*b*. In some embodiments, multiple etch processes are performed to remove the sacrificial gate electrode layers 1106, the portions of the stacks of semiconductor layers 104, and the portions of the fins 202*a*, 202*b*. A mask (not shown) is disposed on the other sacrificial gate electrode layers 1106 to protect them from the removal process. A dielectric material 1804 is formed in the opening formed from the removal of the sacrificial gate electrode layers 1106, the portions of the stacks of semiconductor layers 104, and the portions of the fins 202*a*, 202*b*. The dielectric material 1804 may be any suitable dielectric material, such as SiN. In some embodiments, a liner 1802 is formed in the opening, and the dielectric material 1804 is formed on the liner 1802. The dielectric material 1804 functions to isolate devices, such as a group of transistors.

Figure 18B:
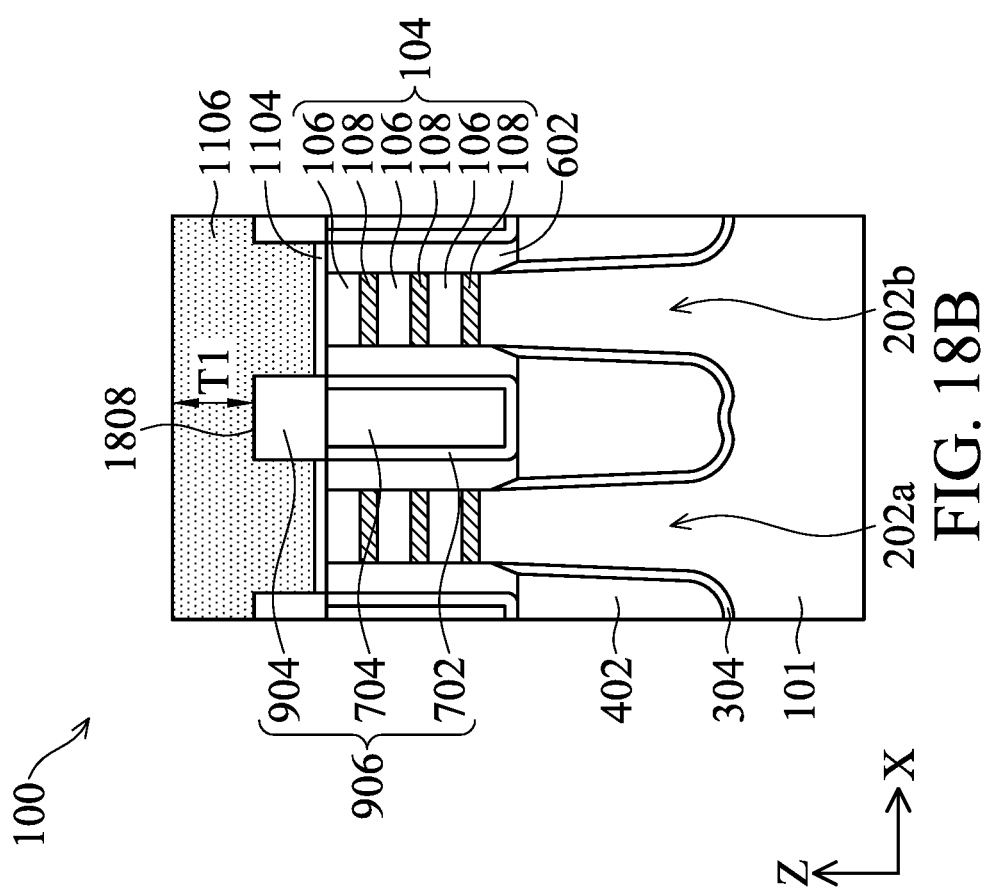

After forming the liner 1802 and the dielectric material 1804, the mask (not shown) is removed to expose the remaining sacrificial gate electrode layers 1106. As shown in FIGS. 18A and 18B, the sacrificial gate electrode layers 1106 are recessed to a level just above a top surface 1808 of the dielectric material 904. In some embodiments, the portion of the recessed sacrificial gate electrode layer 1106 disposed on the top surface 1808 of the dielectric material 904 has a thickness T1. The thickness T1 may be the same as or less than the height H1 of the dielectric material 904 (FIG. 12), such as from about 0.5 times H1 to about 1.5 times H1. Trenches 1806 are formed between adjacent portions of the ILD layer 1604 as a result of the recessing of the sacrificial gate electrode layers 1106, as shown in FIG. 18A.

Figure 19A:
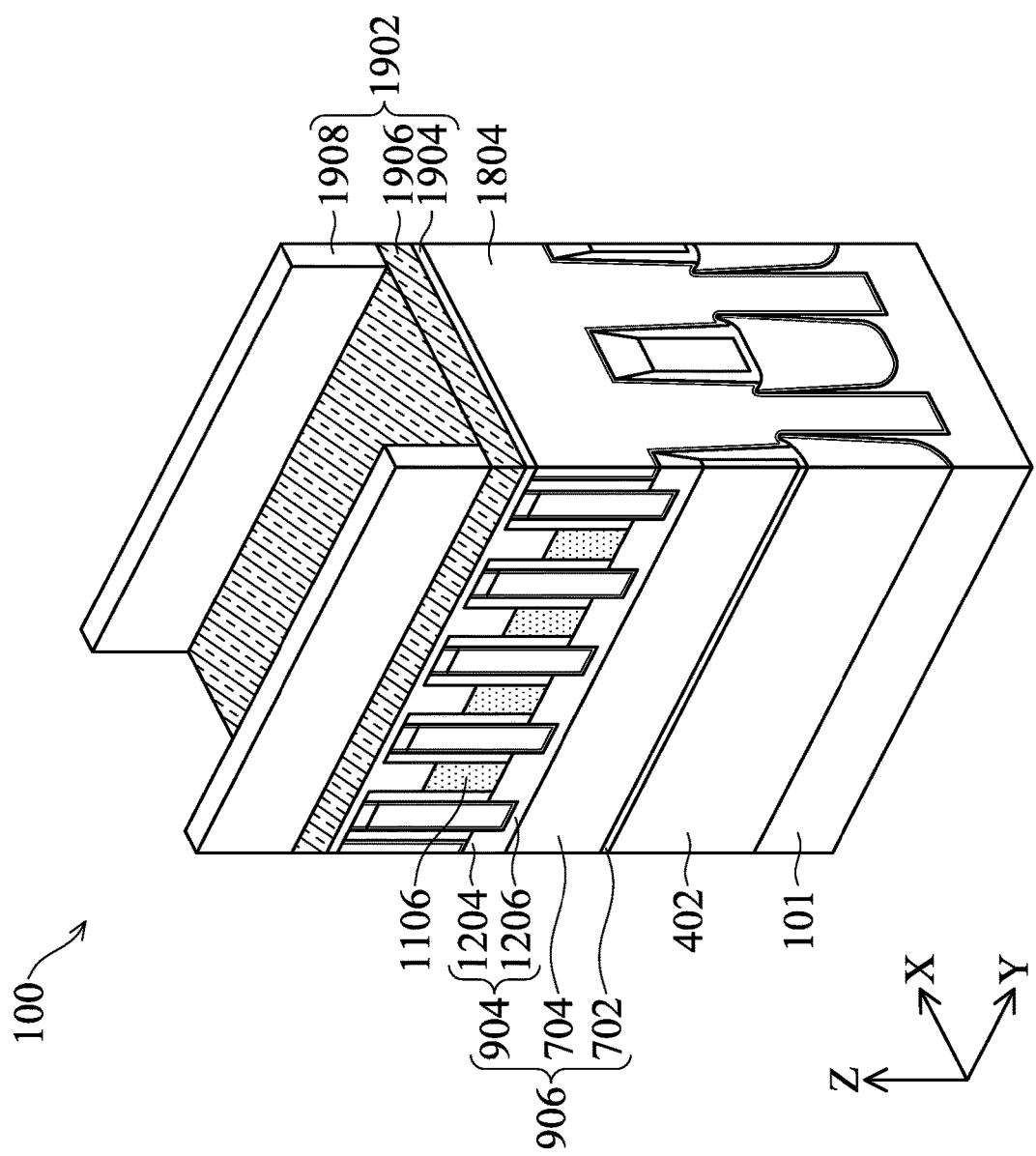
Figure 19B:
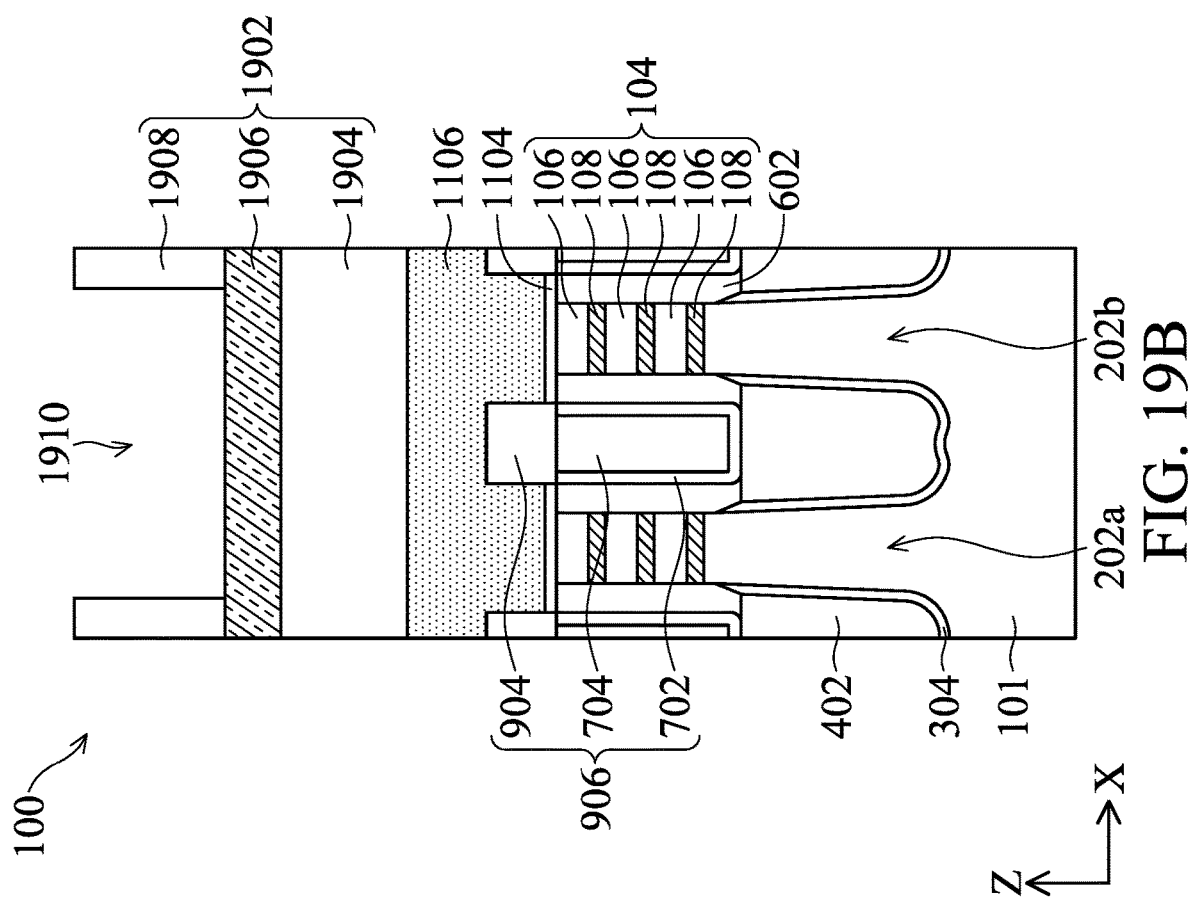

As shown in FIGS. 19A and 19B, a mask structure 1902 is formed on the semiconductor device structure 100. In some embodiments, the mask structure 1902 is a tri-layer photoresist. For example, the mask structure 1902 may include a bottom layer 1904 and a middle layer 1906 disposed on the bottom layer 1904. The bottom layer 1904 and the middle layer 1906 are made of different materials such that the optical properties and/or etching properties of the bottom layer 1904 and the middle layer 1906 are different from each other. In some embodiments, the bottom layer 1904 may be an absorber layer, such as a chromium layer, and the middle layer 1906 may be a silicon-rich layer designed to provide an etch selectivity between the middle layer 1906 and the bottom layer 1904. The mask structure 1902 further includes a photoresist layer 1908 that may be a chemically amplified photoresist layer and can be a positive tone photoresist or a negative tone photoresist. The photoresist layer 1908 may include a polymer, such as phenol formaldehyde resin, a poly(norbornene)-co-malaic anhydride (COMA) polymer, a poly(4-hydroxystyrene) (PHS) polymer, a phenol-formaldehyde (bakelite) polymer, a polyethylene (PE) polymer, a polypropylene (PP) polymer, a polycarbonate polymer, a polyester polymer, or an acrylate-based polymer, such as a poly (methyl methacrylate) (PMMA) polymer or poly (methacrylic acid) (PMAA). The photoresist layer 1908 may be formed by spin-on coating.

As shown in FIGS. 19A and 19B, the photoresist layer 1908 is patterned so one or more openings 1910 are formed in the photoresist layer 1908. The one or more openings 1910 are formed over the dielectric material 904 of one or more dielectric features 906. The photoresist layer 1908 is disposed over the other dielectric features 906. In other words, at least one dielectric feature 906 is disposed below the opening 1910, and the rest of the dielectric features 906 are disposed below the photoresist layer 1908. A portion of the middle layer 1906 is exposed in the opening 1910.

Figure 20A:
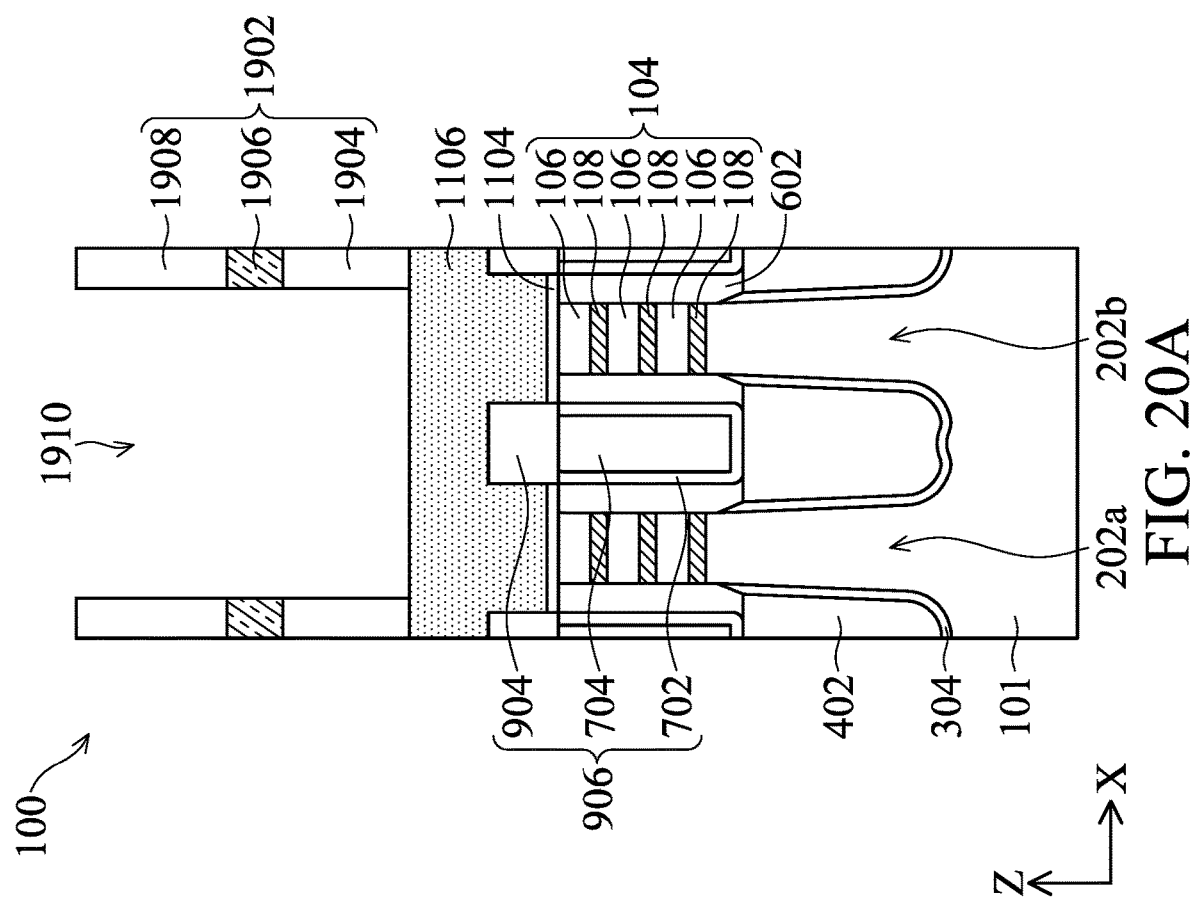

FIGS. 20A-20I are cross-sectional side views of various stages of manufacturing the semiconductor device structure 100 taken along line A-A of FIG. 17A, in accordance with some embodiments. As shown in FIG. 20A, the exposed portion of the middle layer 1906 and the portion of the bottom layer 1904 disposed thereunder are removed by any suitable process. The removal of the portions of the middle layer 1906 and the bottom layer 1904 extends the opening 1910 in the middle layer 1906 and the bottom layer 1904 to expose a portion of the sacrificial gate electrode layer 1106.

As shown in FIG. 20B, the exposed portion of the sacrificial gate electrode layer 1106 is removed by any suitable process, and the top surface 1808 of the dielectric material 904 is exposed in the opening 1910. As described above in the FIG. 18B, the sacrificial gate electrode layer 1106 is recessed so the portion of the sacrificial gate electrode layer 1106 disposed on the top surface 1808 of the dielectric material 904 has the thickness T1, which is substantially less than the thickness of the portion of the sacrificial gate electrode layer 1106 disposed on the top surface 1808 of the dielectric material 904 prior to the recess process. The thickness T1 ranges from about 0.5 times H1 to about 1.5 times H1 in order to increase the processing window for the process described in FIG. 20B. For example, if the sacrificial gate electrode layer 1106 is not recessed to a level shown in FIG. 18B, the process to remove the portion of the sacrificial gate electrode layer 1106 shown in FIG. 20B may take longer. As a result, the sacrificial gate electrode layer 1106 may be over etched, and the first semiconductor layers 106 may be damaged. With the recessed sacrificial gate electrode layer 1106 shown in FIG. 18B, the process to remove the portion of the sacrificial gate electrode layer 1106 shown in FIG. 20B has a larger processing window due to the thickness T1, which is substantially smaller than the thickness of the sacrificial gate electrode layer 1106 before the recess process. As a result, over etching of the sacrificial gate electrode layer 1106 may be avoided.

As shown in FIG. 20C, the mask structure 1902 is removed by any suitable process. In some embodiments, the mask structure 1902 is removed by multiple etch processes. Each etch process does not substantially affect the sacrificial gate electrode layer 1106 and the dielectric material 904. Next, as shown in FIG. 20D, the exposed dielectric material 904 is removed by any suitable process. In some embodiments, the dielectric material 904 includes a high-K dielectric material, such as $HfO_2$, and a chlorine based dry etch process is performed to remove the dielectric material 904. For example, the dry etch process is performed in an etch chamber with a chamber pressure ranging from about 5 mTorr to about 40 mTorr. The processing temperature ranges from about 80 degrees Celsius to about 150 degrees Celsius. The transformer coupled plasma (TCP) power range from about 200 W to about 2000 W, and a bias voltage ranges from about 0 V to about 200 V. The etchant may be $BCl_3$ with a flow rate ranging from about 10 sccm to about 250 sccm or $Cl_2$ ranging from about 0 sccm to about 200 sccm. Other gases, such as Ar, He, and/or $N_2$ may be flowed along with the chlorine containing gas. The flow rate of Ar, He, and $N_2$ may range from about 50 sccm to about 200 sccm. With the process conditions described above, the $HfO_2$ etch process with chlorine containing etchant can achieve high selectivity to Si and SiN.

Figure 20E:
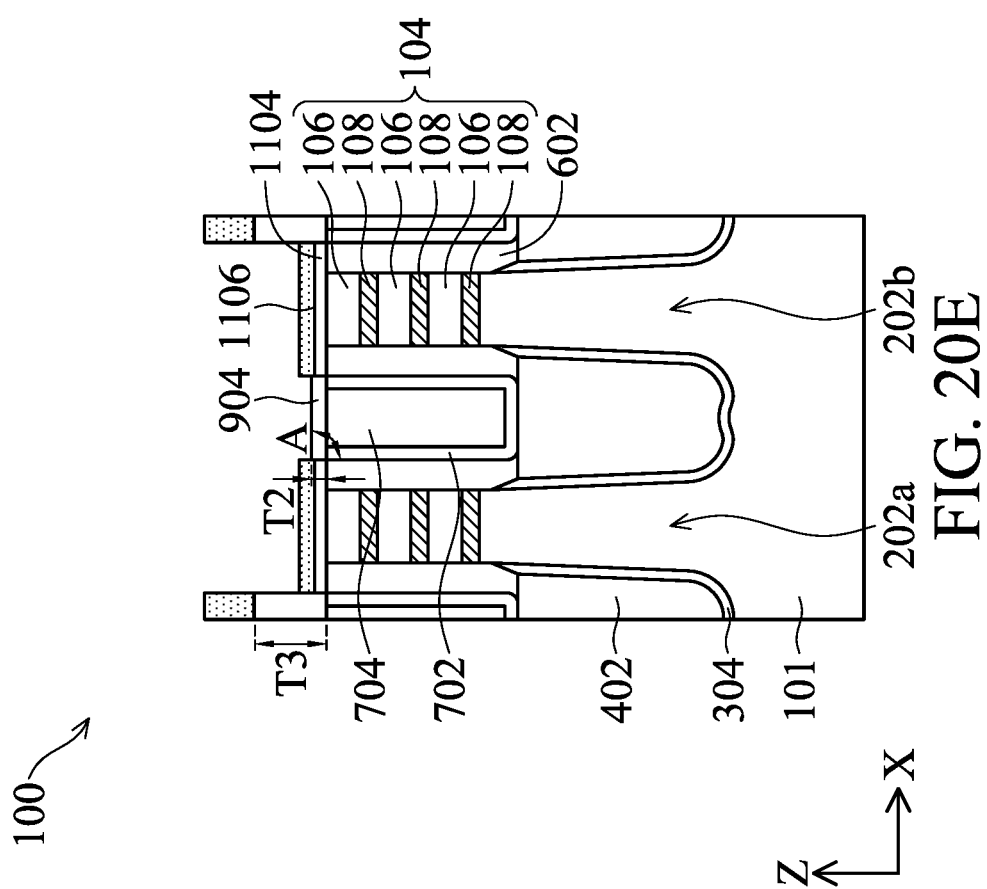

In some embodiments, as shown in FIG. 20E, the exposed dielectric material 904 is recessed and not completely removed. The remaining dielectric material 904 may have a thickness T2 ranging from about 1 nm to about 20 nm. If the thickness T2 is less than about 1 nm, the risk of over etching is increased, and the dielectric material 704 may be damaged by the recess process. On the other hand, if the thickness T2 is greater than about 20 nm, the remaining dielectric material 904 may be unintentionally cutting off a gate electrode layer, such as the gate electrode layer 2006 (FIG. 20F). The dielectric material 904 protected by the sacrificial gate electrode layer 1106 has a thickness T3 ranging from about 15 nm to about 50 nm. The thickness T3 may be the same as the height H1 (FIG. 10). The thickness T3 is substantially greater than the thickness T2. A top surface of the remaining dielectric material 904 and the side surface of the remaining dielectric material 904 may form an acute angle A. In some embodiments, the angle A ranges from about 10 degrees to about 80 degrees.

As shown in FIG. 20F, which is an enlarged view of a portion of the semiconductor device structure 100 shown in FIG. 20E, the remaining sacrificial gate electrode layer 1106, sacrificial gate dielectric layer 1104, the cladding layer 602, and the second semiconductor layers 108 are removed, and oxygen-containing layers 2002, gate dielectric layer 2004, and gate electrode layer 2006 are formed. For example, the sacrificial gate electrode layer 1106 and the sacrificial gate dielectric layer 1104 are first removed, exposing the cladding layers 602 and the stacks of semiconductor layers 104. Next, the cladding layers 602 and the second semiconductor layers 108 are removed. The removal processes expose the dielectric spacers 1402 and the first semiconductor layers 106. The removal process may be any suitable processes, such as dry etch, wet etch, or a combination thereof. The etch process may be a selective etch process that removes the cladding layers 602 and the second semiconductor layers 108 but not the spacers 1202, the CESL 1602, the nitrogen-containing layer 1606, the dielectric material 904, and the first semiconductor layers 106. Next, the oxygen-containing layers 2002 may be formed around the exposed surfaces of the first semiconductor layers 106 and the substrate portions 102a, 102b. The gate dielectric layers 2004 are then formed on the oxygen-containing layers 2002 and the dielectric features 906, as shown in FIG. 20F. The oxygen-containing layer 2002 may be an oxide layer, and the gate dielectric layer 2004 may include the same material as the sacrificial gate dielectric layer 1104 (FIG. 11). In some embodiments, the gate dielectric layer 2004 includes a high-K dielectric material. The oxygen-containing layers 2002 and the gate dielectric layers 2004 may be formed by any suitable processes, such as ALD processes. In some embodiments, the oxygen-containing layers 2002 and the gate dielectric layers 2004 are formed by conformal processes.

Next, the gate electrode layers 2006 are formed on the gate dielectric layers 2004. The gate electrode layer 2006 is formed on the gate dielectric layer 2004 to surround a portion of each first semiconductor layer 106. The gate electrode layer 2006 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layers 2006 may be formed by PVD, CVD, ALD, electroplating, or other suitable method.

Next, the gate electrode layers 2006 are recessed to a level below top surfaces 2008 of the dielectric material 904 that is not recessed, as shown in FIG. 20F. The gate electrode layers 2006 is disposed over the recessed dielectric material 904 in embodiments that the dielectric material 904 is recessed but not completely removed as described in FIG. 20E. As a result of the recess process, some adjacent channel regions (first semiconductor layers 106) may share the gate electrode layer 2006, while other adjacent channel regions may include distinct gate electrode layers 2006. For example, channel regions formed from the fin 202a and fin 202b share the gate electrode layer 2006, and channel regions formed from the fin 202b and the fin (not shown, on the other side of the dielectric feature 906) adjacent the fin 202b include distinct gate electrode layers 2006. If the gate electrode layer 2006 is shared by the adjacent channel regions, a single signal (i.e., an electrical current) sent to the gate electrode layer 2006 may control both adjacent channel regions. If the gate electrode layers 2006 are cut-off by the dielectric features 906 that are not recessed, then independent signal (i.e., independent electrical current) may be sent to each gate electrode layer 2006 to separately control each of the adjacent channel region. As described above, the recessed dielectric material 904 may have the thickness T2 ranging from about 1 nm to about 20 nm. If the thickness T2 is greater than about 20 nm, the gate electrode layer 2006 may be unintentionally cut-off by the recessed dielectric material 904. The dielectric material 904 may be removed or recessed by the processes described in FIG. 20D for the purpose of sharing the gate electrode layer 2006.

The recess of the gate electrode layers 1906 may be any suitable process, such as a dry etch, a wet etch, or a combination thereof. In some embodiments, the recess process may be a selective dry etch process that does not substantially affect the nitrogen-containing layer 1606, the spacer 1202, and the CESL 1602. As a result of the recess process, some adjacent gate electrode layers 2006 are separated, or cut-off, by the dielectric feature 906.

Figure 20G:
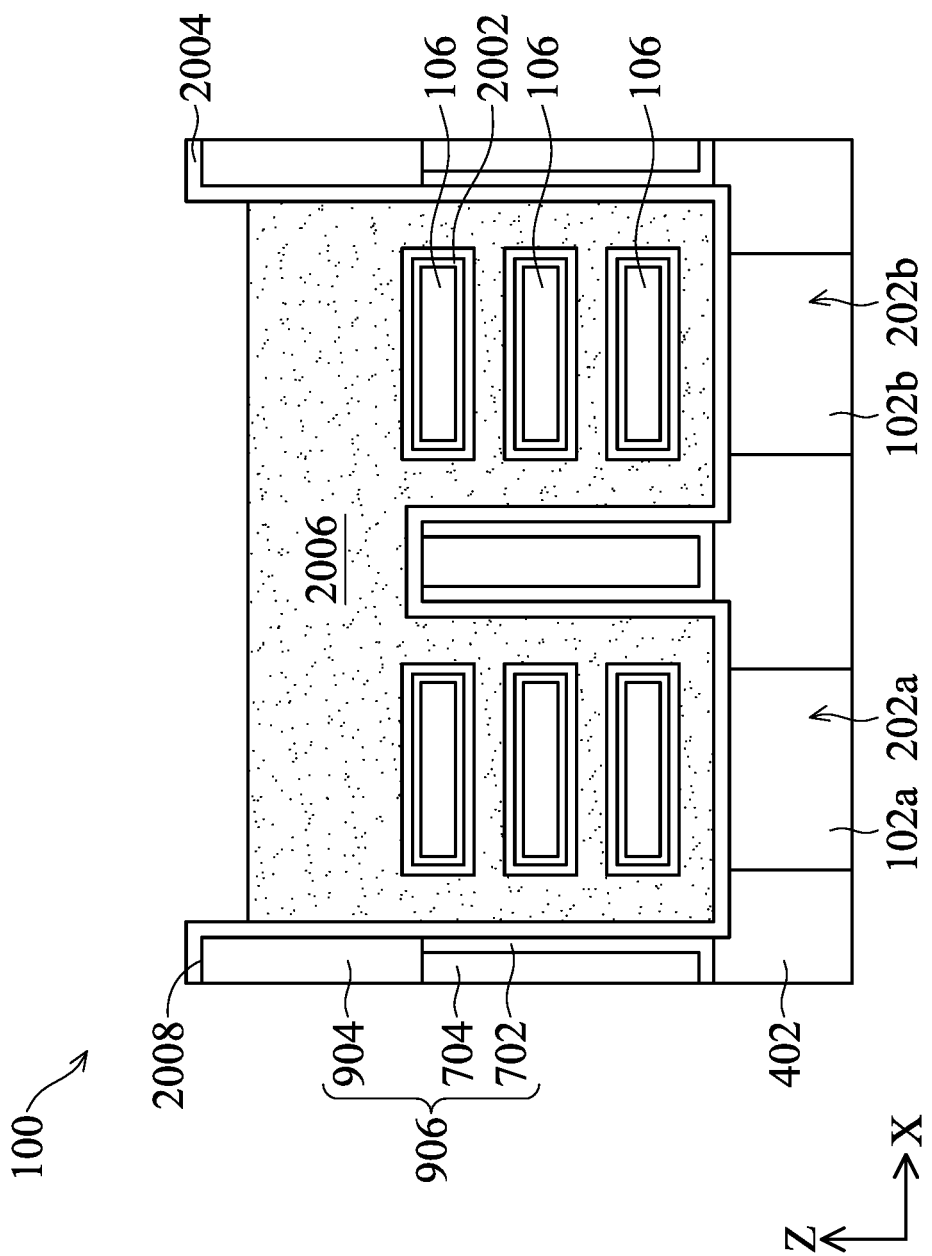

FIG. 20G shows the semiconductor device structure 100 according to an alternative embodiment in which the dielectric material 904 is completely removed as described in FIG. 20D. As shown in FIG. 20G, the gate dielectric layer 2004 is disposed on the liner 702 and the dielectric material 704.

Figure 20H:
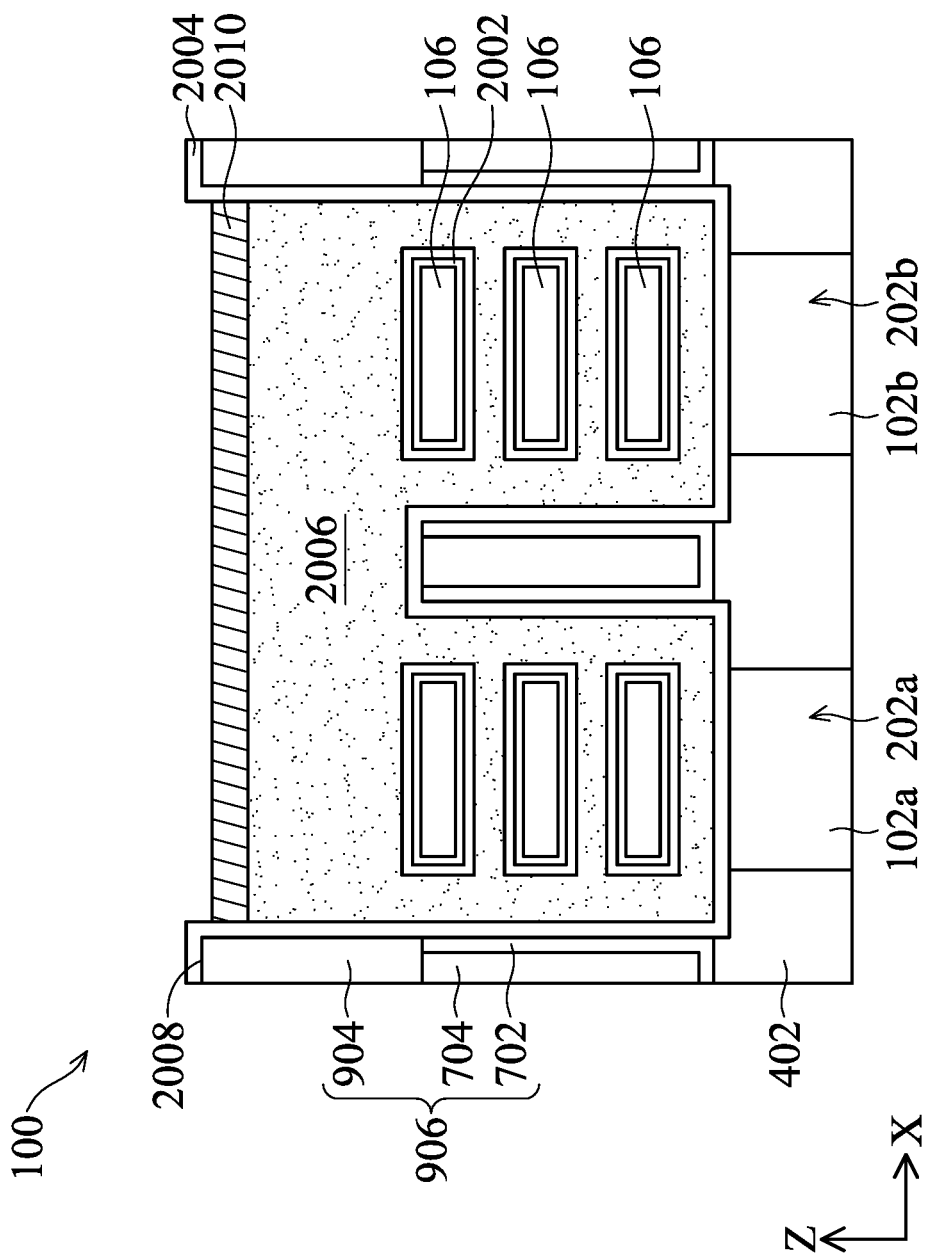
Figure 20I:
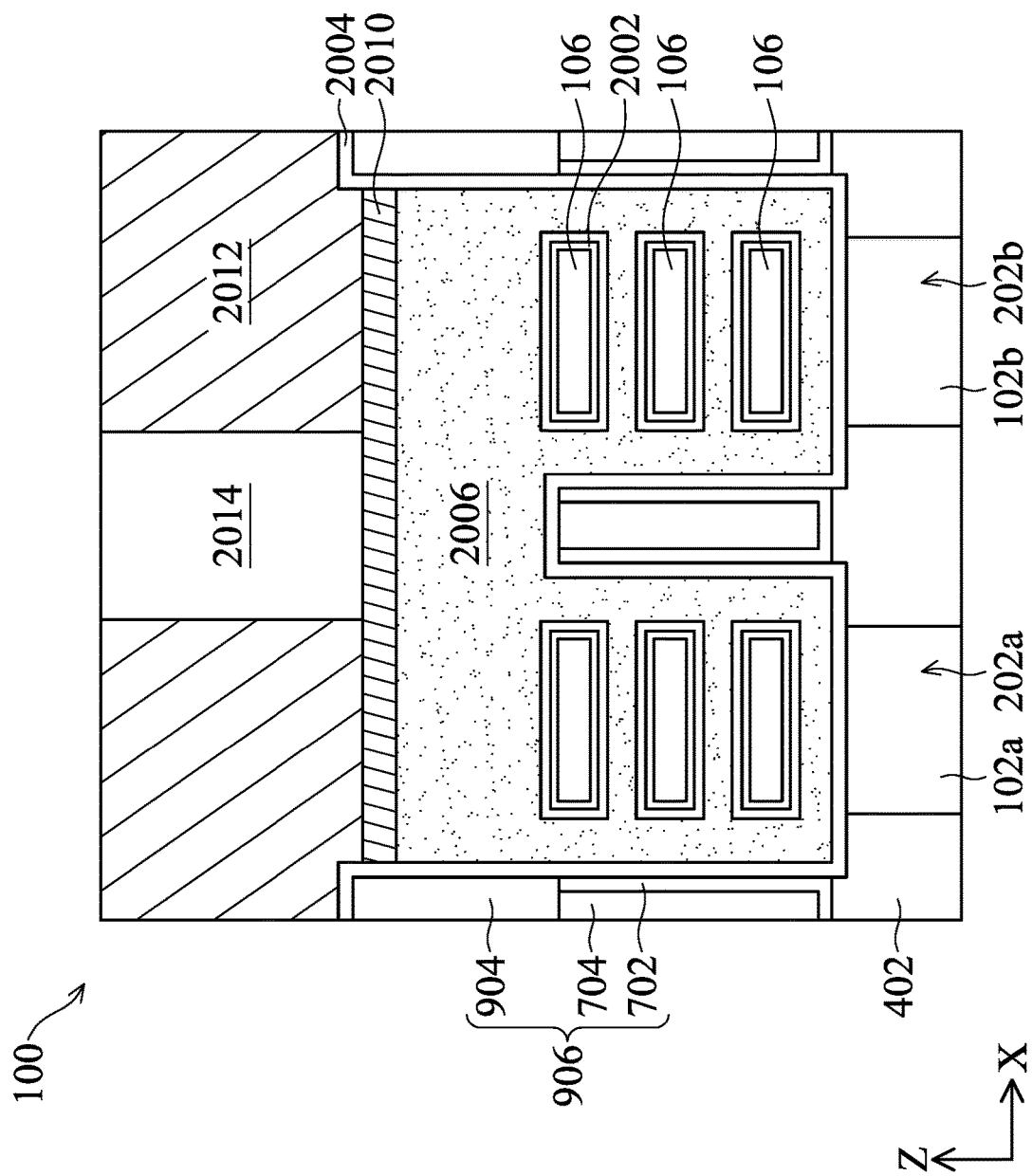

As shown in FIG. 20H, a conductive layer 2010 is selectively formed on the gate electrode layer 2006. The conductive layer 2010 may include any suitable metal, such as fluorine-free tungsten (FFW), which selectively grows on the gate electrode layer 2006 but not the gate dielectric layer 2004. As shown in FIG. 20I, a dielectric material 2012 is formed over the dielectric features 906 and the conductive layer 2010. The dielectric material 2012 may include SiO, HfSi, SiOC, AlO, ZrSi, AlON, ZrO, HfO, TiO, ZrAlO, ZnO, TaO, LaO, YO, TaCN, SiN, SiOCN, ZrN, or SiCN. The dielectric material 2012 may be formed by any suitable process, such as PECVD. A conductive feature 2014 may be formed through the dielectric material 2012 and in contact with the conductive layer 2010. The conductive feature 2014 may include a material having one or more of Ru, Mo, Co, Ni. W, Ti, Ta, Cu, Al, TiN and TaN. The conductive feature 2014 may provide a signal, such as an electrical current, to the gate electrode layer 2006 shared by the channel regions formed from the fins 202a, 202b.

The semiconductor device structure 100 shown in FIGS. 20A-20I illustrate a process to use the dielectric material 904 of the dielectric feature 906 to cut-off the gate electrode layer 2006. One or more of the dielectric features 906 may have the dielectric material 904 removed or recessed in order to share the gate electrode layer 2006 in adjacent channel regions. In some embodiments, a different approach to cut-off and to share the gate electrode layer 2006 is provided.

FIGS. 21A-32A are cross-sectional side views of various stages of manufacturing the semiconductor device structure 100 taken along line B-B of FIG. 16, in accordance with some embodiments. FIGS. 21B-32B are cross-sectional side views of various stages of manufacturing the semiconductor device structure 100 taken along line C-C of FIG. 16, in accordance with some embodiments. FIGS. 22C-32C are cross-sectional side views of various stages of manufacturing the semiconductor device structure 100 taken along line D-D of FIG. 16, in accordance with some embodiments.

Figure 21B:
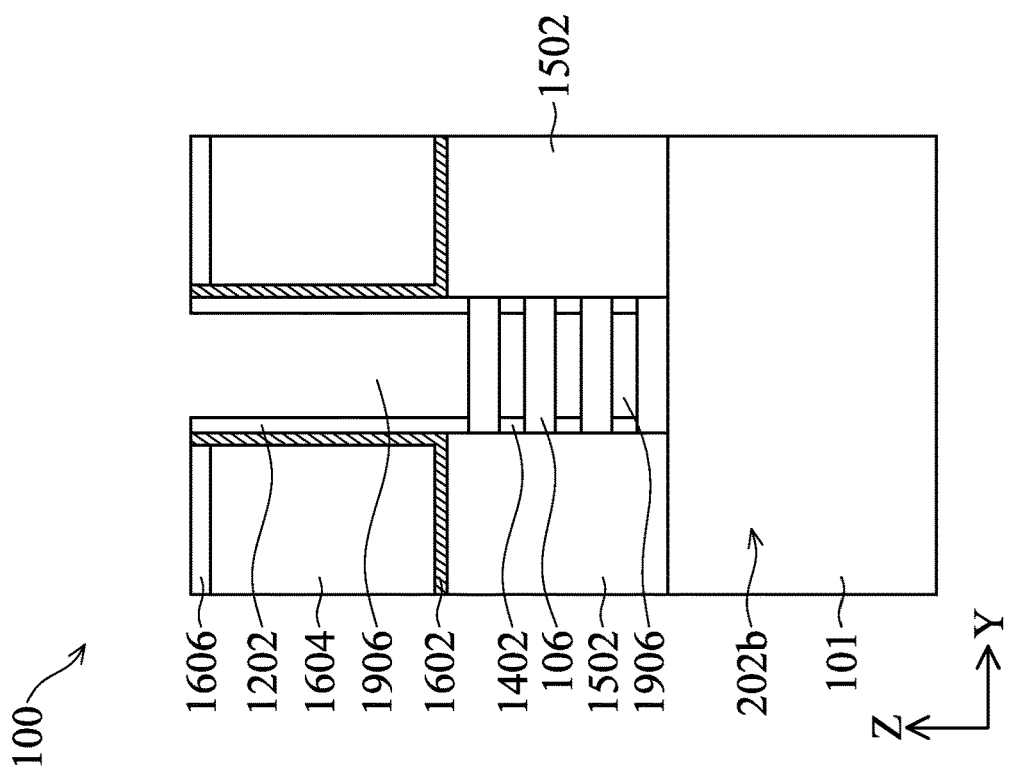
Figure 21A:
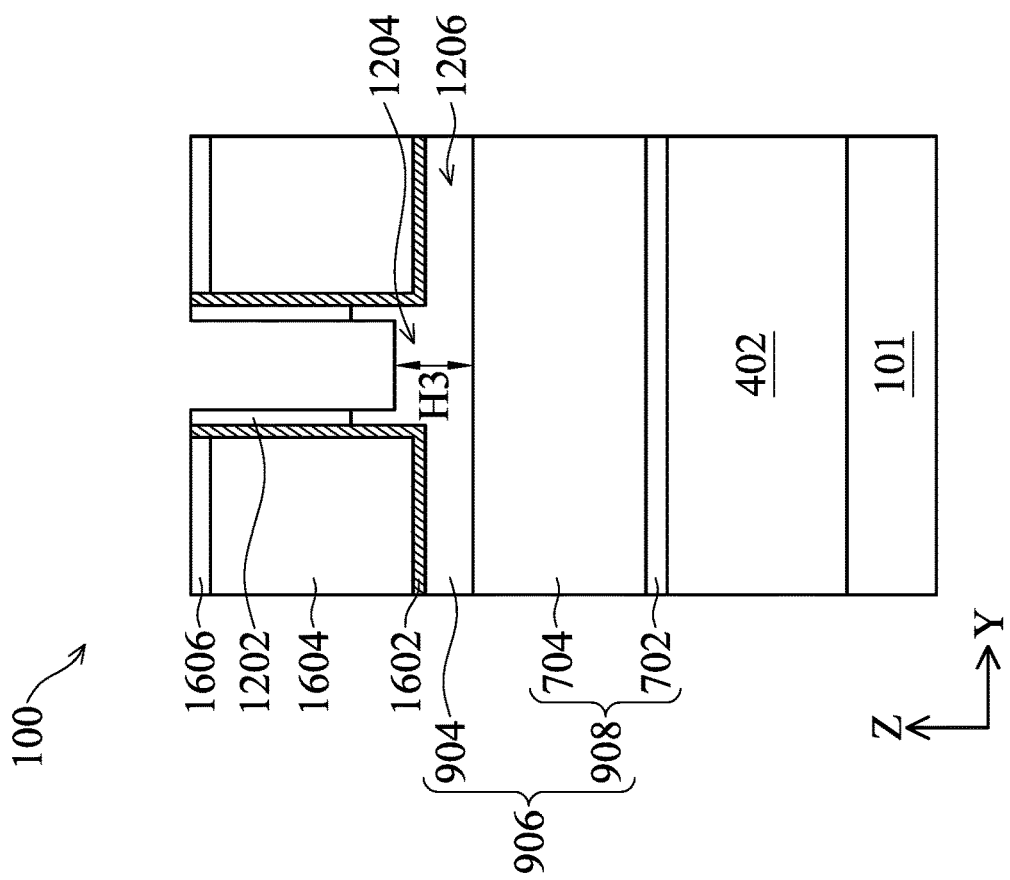

As shown in FIGS. 21A and 21B, after planarization process to expose the sacrificial gate electrode layer 1106 and the formation of the nitrogen-containing layer 1606 as shown in FIG. 16, the sacrificial gate electrode layer 1106, the sacrificial gate dielectric layer 1104, the cladding layers 602, and the second semiconductor layers 108 are removed. The processes described in FIGS. 18A to 20E are omitted. The removal of the sacrificial gate electrode layer 1106, the sacrificial gate dielectric layer 1104, the cladding layers 602, and the second semiconductor layers 108 may be performed by one or more etch processes. The one or more etch processes may remove a portion of the dielectric material 904, such as removing a portion of the first portion 1204 of the dielectric material 904. In some embodiments, the remaining first portion 1204 has a height H3 that is substantially less than the height H1 but substantially greater than the height H2. In some embodiments, the height H3 ranges from about 20 nm to about 24 nm. The portions of the dielectric material 904 disposed under the spacers 1202 are protected by the spacers 1202 during the removal of the sacrificial gate electrode layer 1106, the sacrificial gate dielectric layer 1104, the cladding layers 602, and the second semiconductor layers 108. As a result, the portion of the dielectric material 904 disposed under the spacers 1202 has the height H1.

Figure 22B:
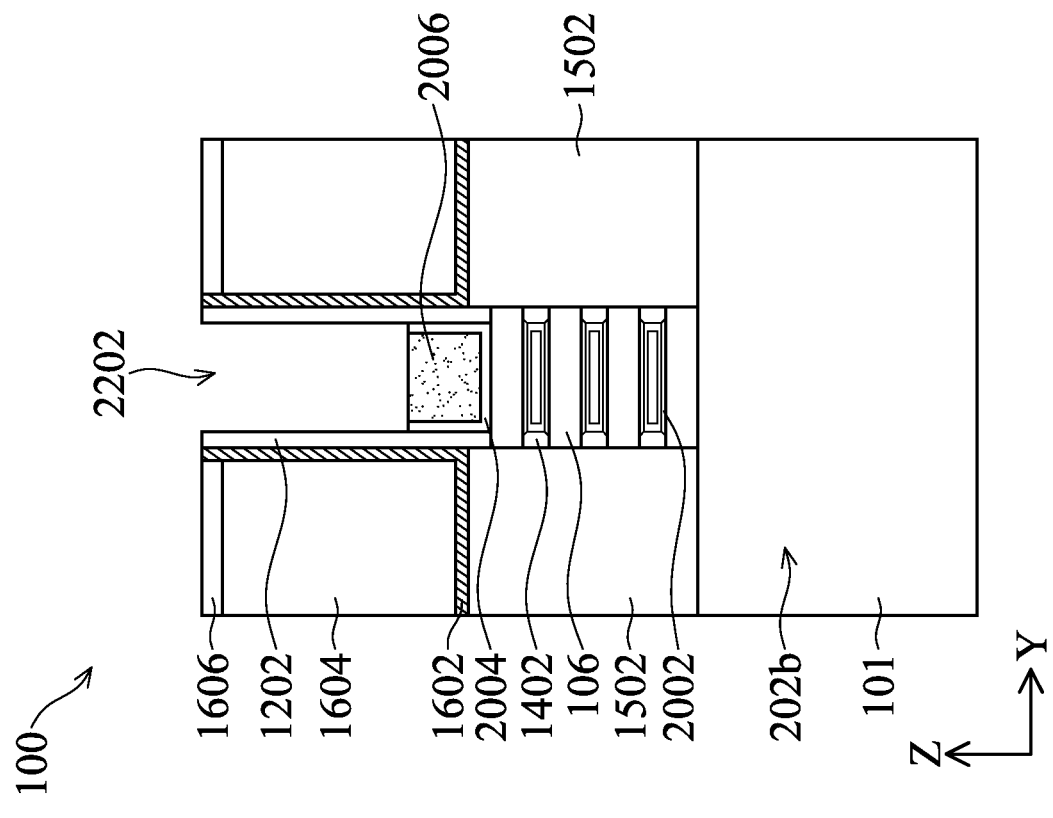
Figure 22A:
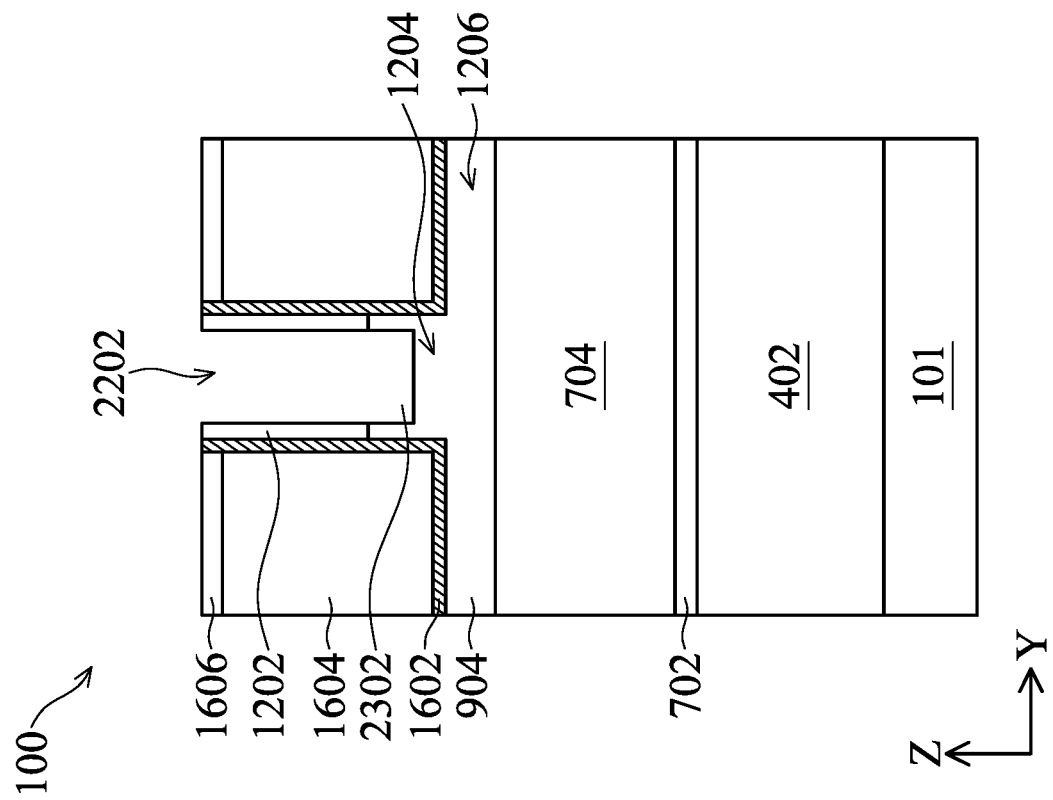
Figure 22C:
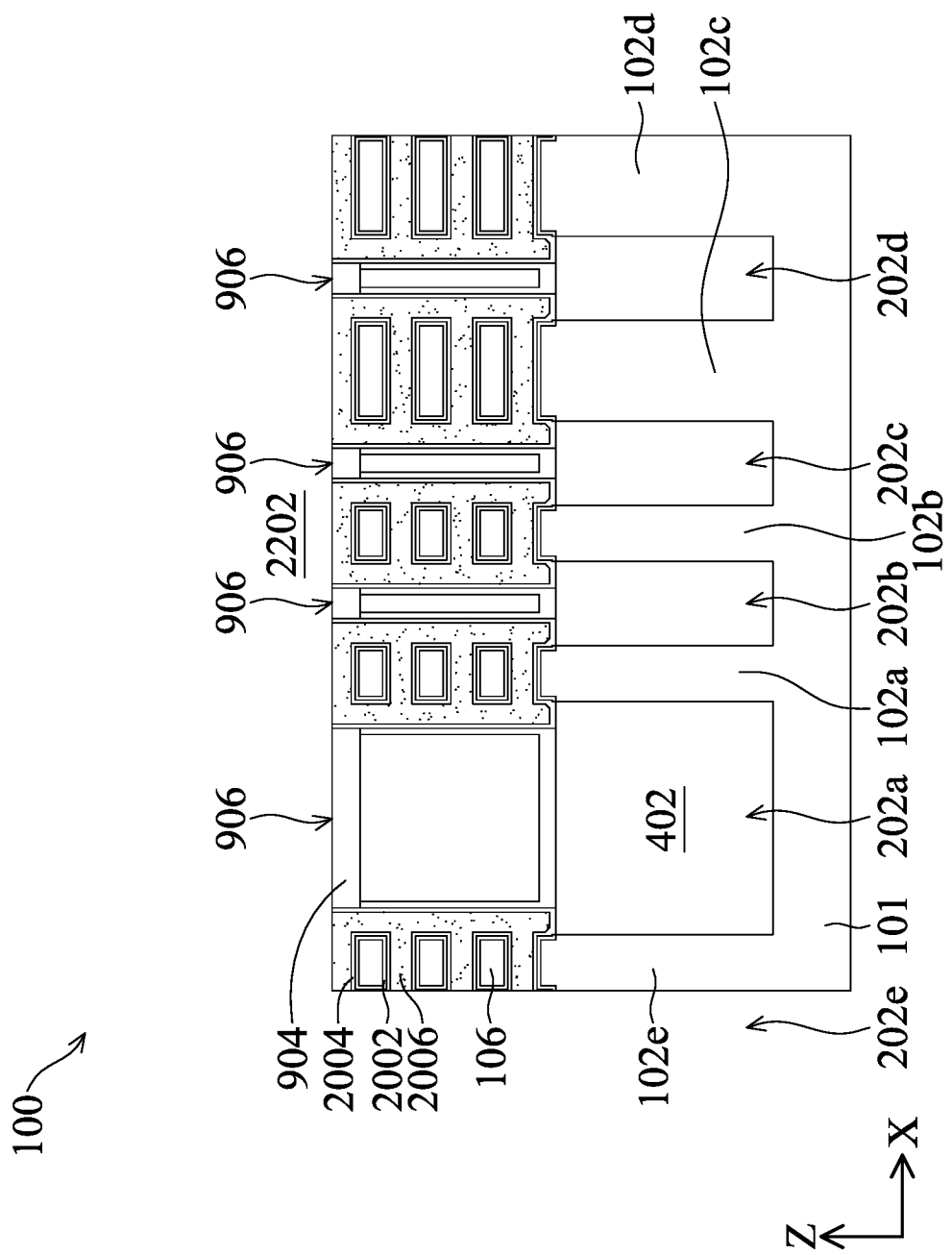

As shown in FIGS. 22A-22C, the oxygen-containing layers 2002, the gate dielectric layers 2004, and the gate electrode layers 2006 are formed. The gate electrode layers 2006 are recessed to the same level as the top surface of the first portion 1204 of the dielectric material 904. The recess of the gate electrode layers 2006 creates trenches 2202. The trench 2202 includes various sections having different bottoms, such as the first portions 1204 of the dielectric features 906 as shown in FIG. 22A and the gate electrode layer 2006 as shown in FIG. 22B. FIG. 22C illustrates the portion of the semiconductor device structure 100 under the trench 2202 along the X direction. In some embodiments, as shown in FIG. 22C, the top surfaces of the gate electrode layer 2006 and the top surfaces of the dielectric materials 904 are substantially coplanar. Thus, the gate electrode layers 2006 are not connected and are separated by the dielectric features 906. In other words, at the current stage, each channel region (first semiconductor layers 106) includes a distinct gate electrode layer 2006.

As shown in FIG. 22C, additional fins 202c, 202d, 202e may be formed from the substrate 101. The fins 202a, 202b, 202c, 202d, 202e may have different widths. For example, fins 202a, 202b each has a width less than a width of each of the fins 202c, 202d, 202e. A wider fin width leads to a wider channel, and different devices may have different channel widths. For example, devices with wider channels may be more suitable for high-speed applications, such as NAND devices. Devices with narrower channels may be more suitable for low-power and low-leakage applications, such as inverter devices. The distances between adjacent gate electrode layers 2006 may be different. In other words, the widths of the dielectric features 906 may be different. For example, the dielectric feature 906 disposed between the gate electrode layer 2006 over the substrate portion 102a and the gate electrode layer 2006 over the substrate portion 102e is wider than the dielectric feature 906 disposed between the gate electrode layer 2006 over the substrate portion 102a and the gate electrode layer 2006 over the substrate portion 102b, as shown in FIG. 22C.

Figure 23B:
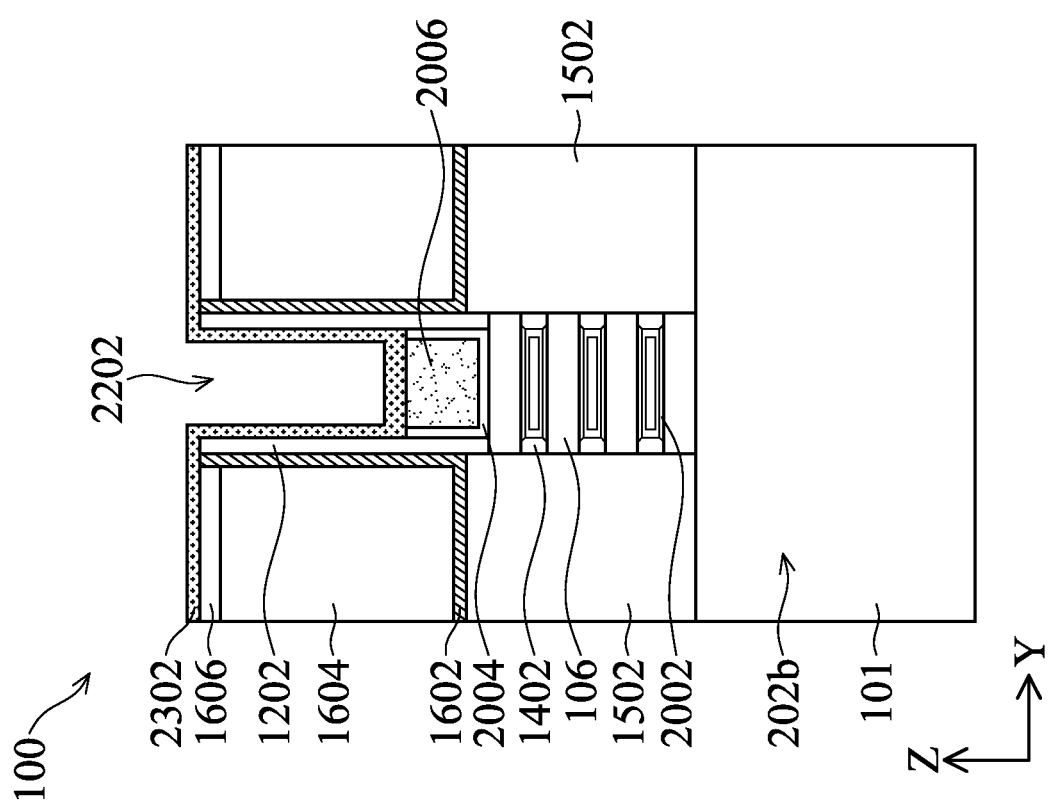
Figure 23A:
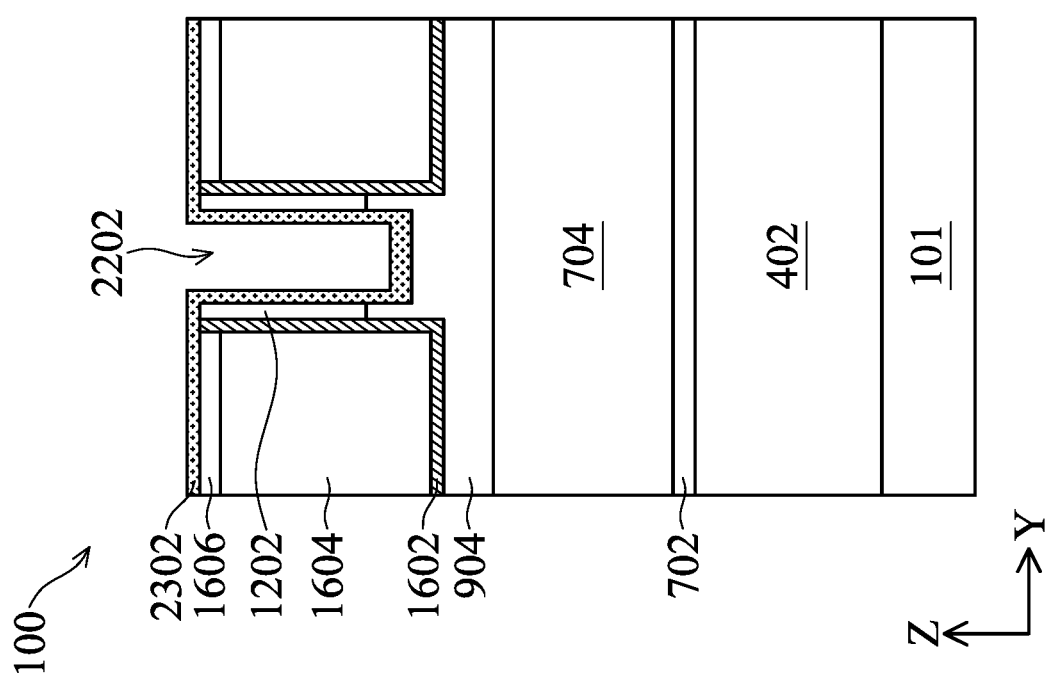
Figure 23C:
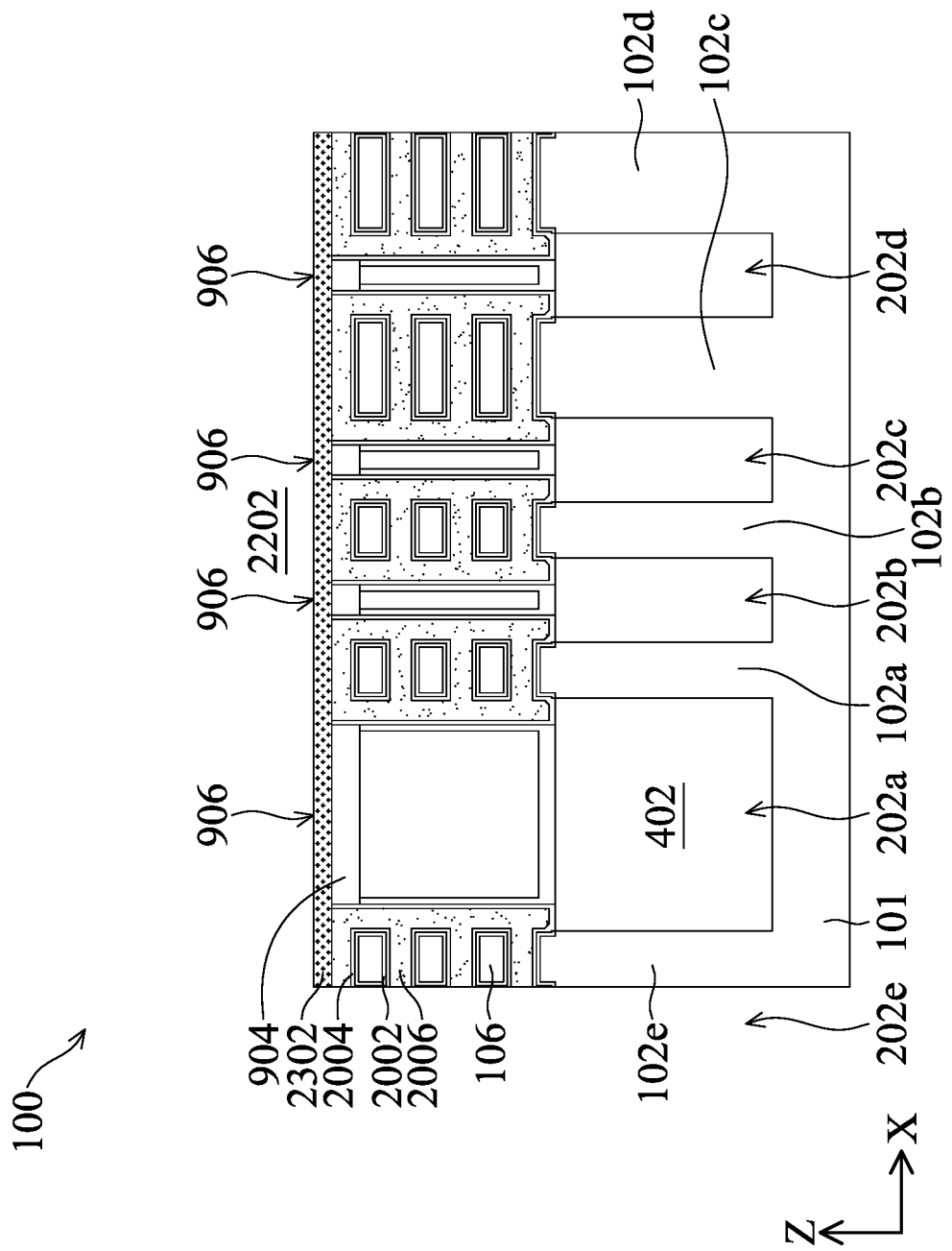

As shown in FIGS. 23A-23C, a conductive layer 2302 is formed on the nitrogen-containing layers 1606, adjacent the spacers 1202 and on the bottom of the trench 2202, such as the dielectric material 904 and the gate electrode layer 2006. The conductive layer 2302 may include the same material as the conductive layer 2010. However, the conductive layer 2302 is formed on all the exposed surfaces of the semiconductor device structure 100, while the conductive layer 2010 is selectively formed on the gate electrode layers 2006. The conductive layer 2302 may be formed by any suitable process, such as ALD, CVD, PECVD, or PVD. In some embodiments, the conductive layer 2302 is formed by PVD, and portions of the conductive layer 2302 formed on horizontal surfaces, such as the nitrogen-containing layer 1606, the dielectric material 904, and the gate electrode layer 2006, may be thicker than portions of the conductive layer 2302 formed on vertical surfaces, such as the spacers 1202, due to a less conformal deposition process.

Figure 24C:
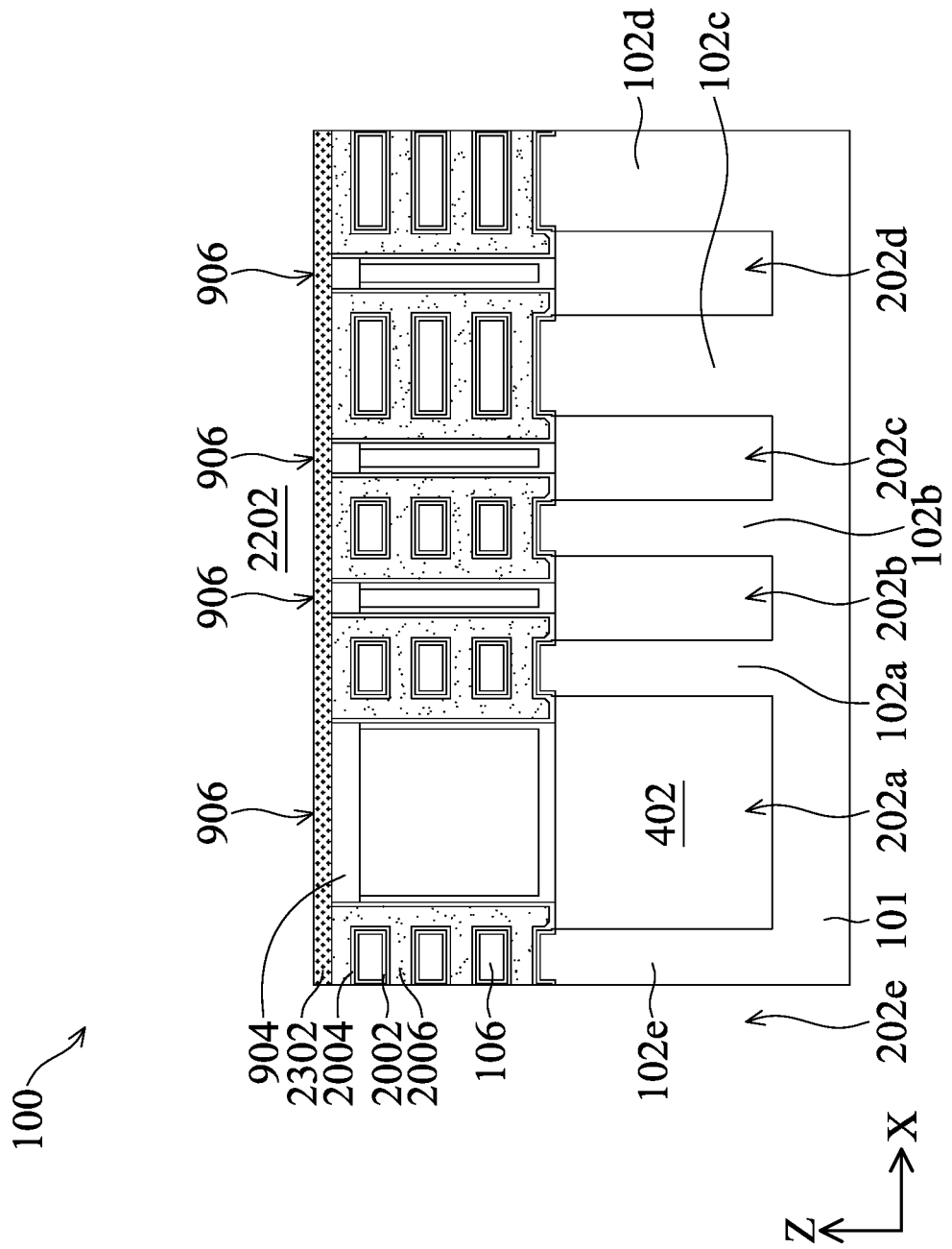

Next, as shown in FIGS. 24A-24C, portions of the conductive layer 2302 disposed adjacent the spacers 1202 are removed. The removal may be performed by any suitable process, such as a wet etch. The wet etch removes the portions of the conductive layer 2302 disposed on vertical surfaces to expose the spacers 1202. The portions of the conductive layer 2302 disposed on horizontal surfaces are not completely removed, because the portions of the conductive layer 2302 disposed on vertical surfaces are thinner than the portions of the conductive layer 2302 disposed on horizontal surfaces. The remaining conductive layer 2302 disposed on the bottom of the trench 2202 may have a thickness ranging from about 2 nm to about 10 nm.

Figure 25B:
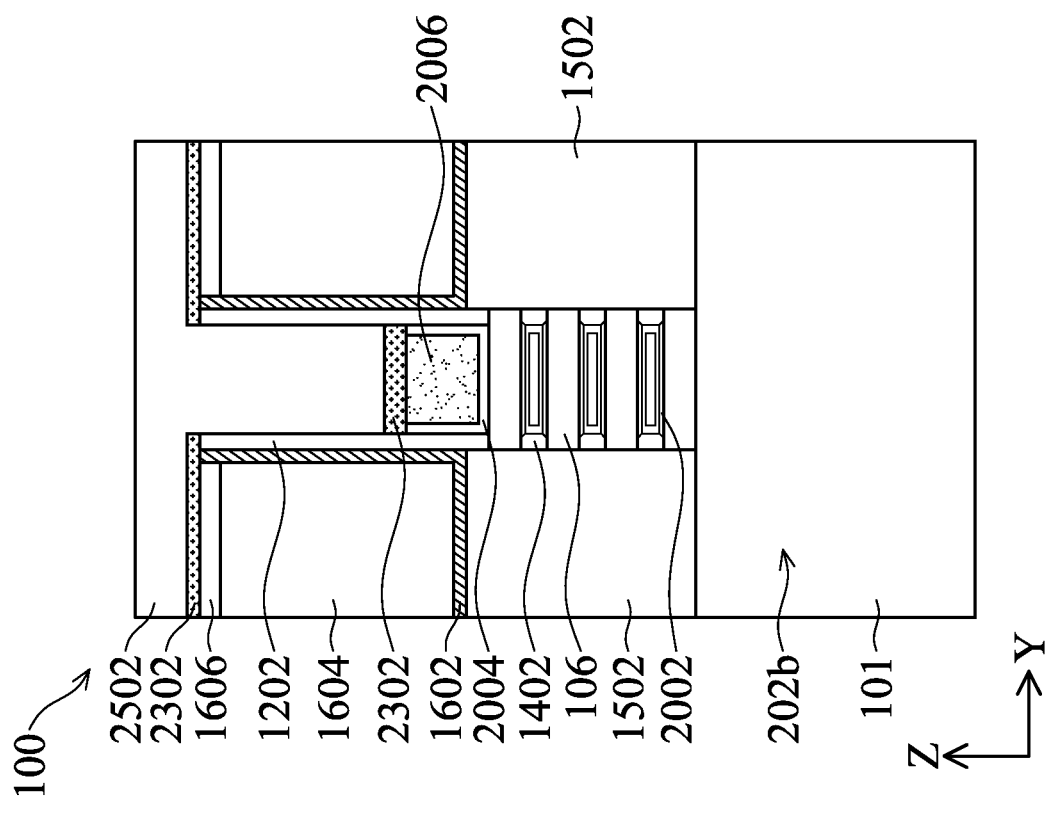
Figure 25A:
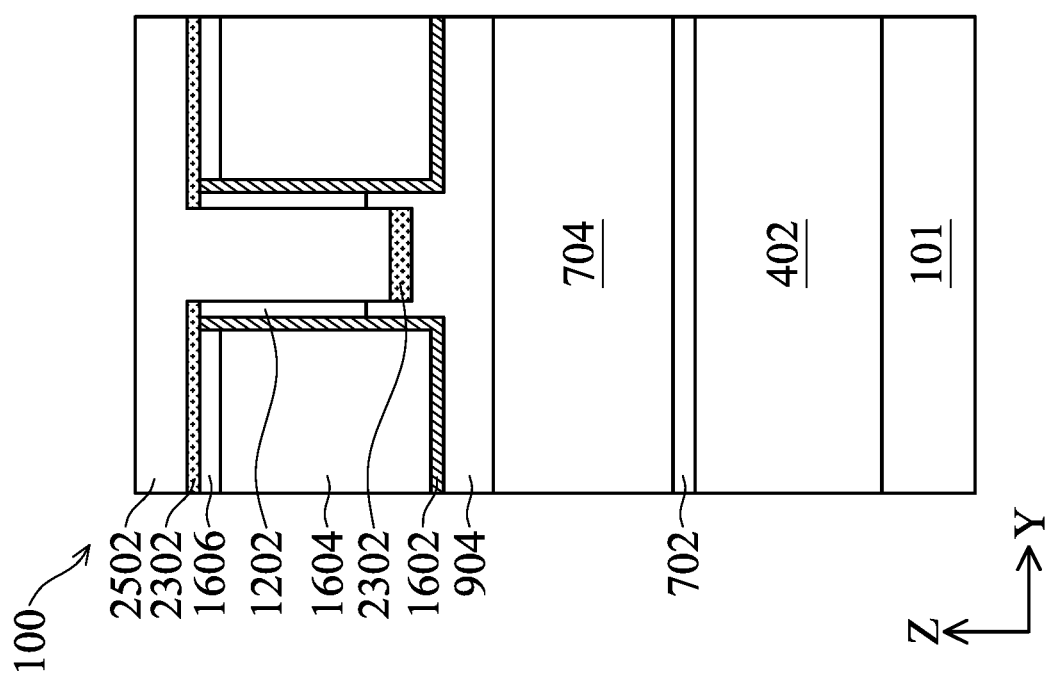
Figure 25C:
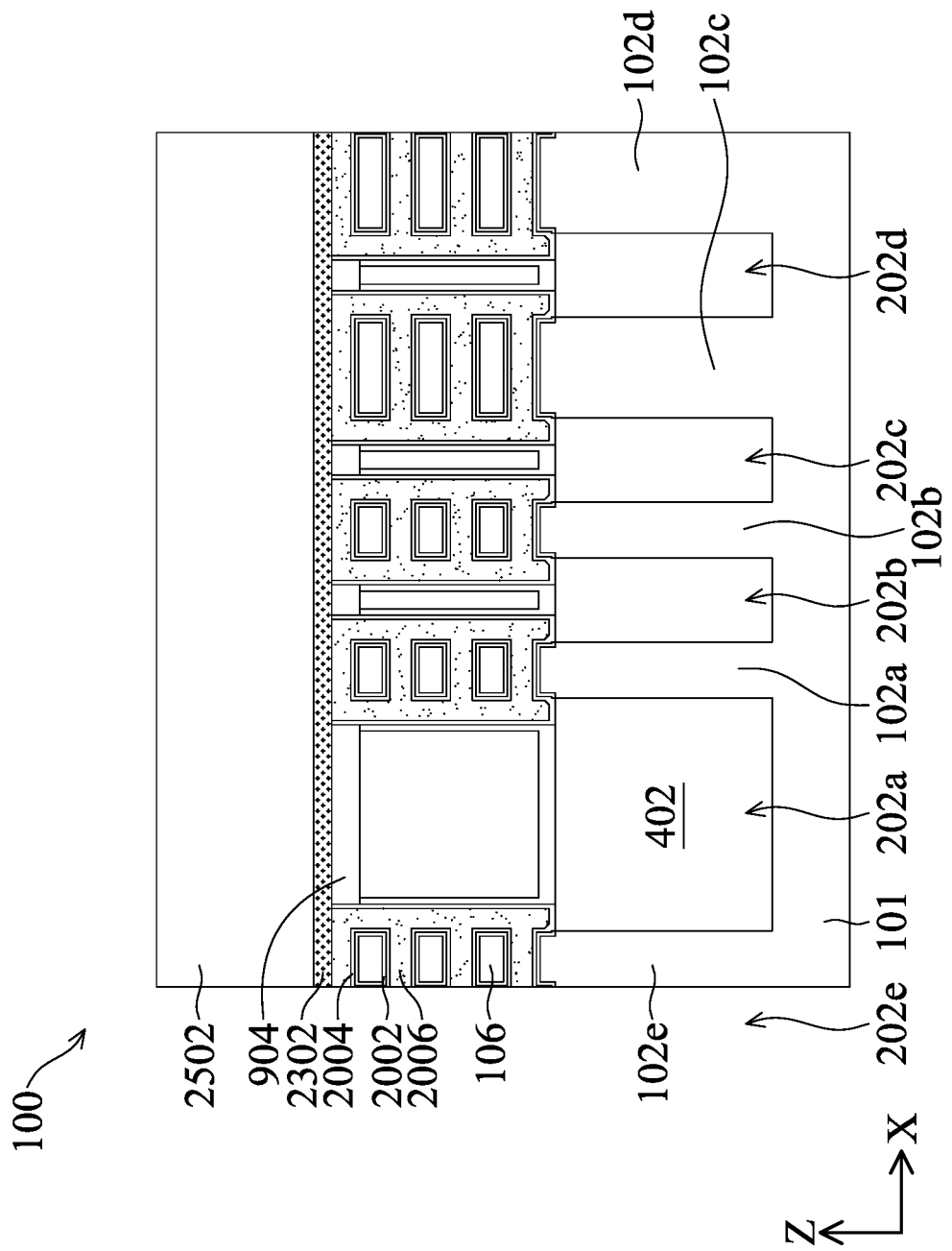
Figure 26A:
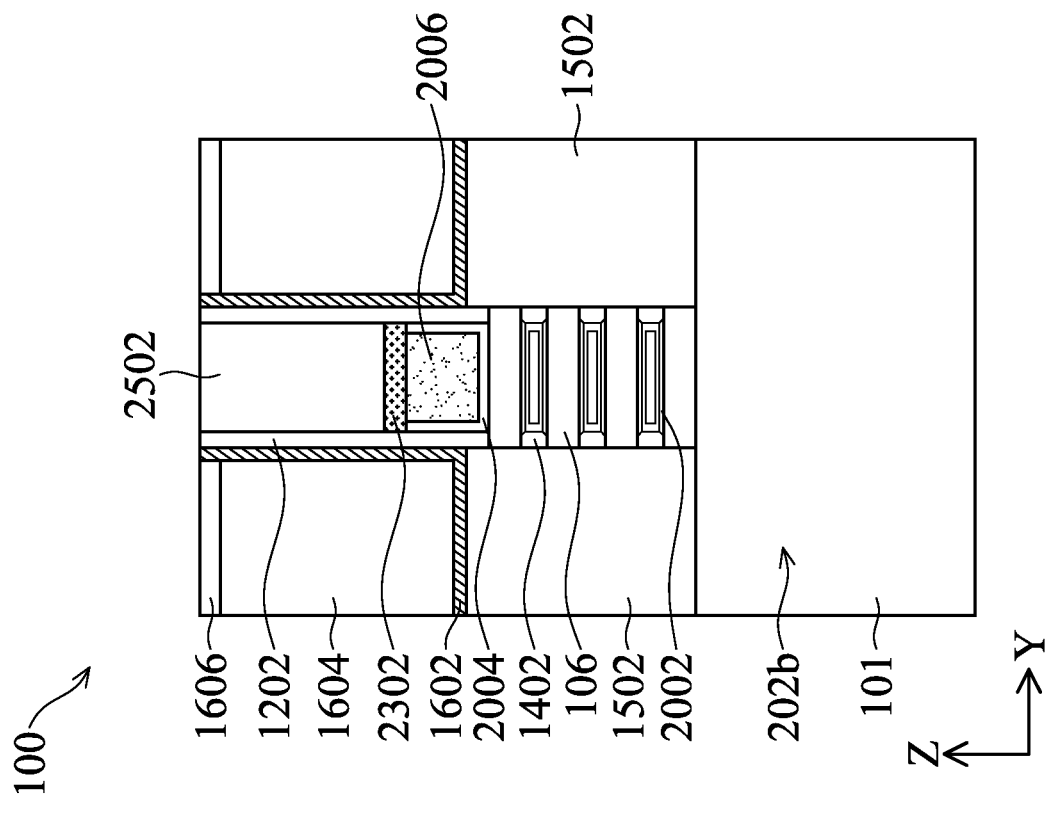
Figure 26B:
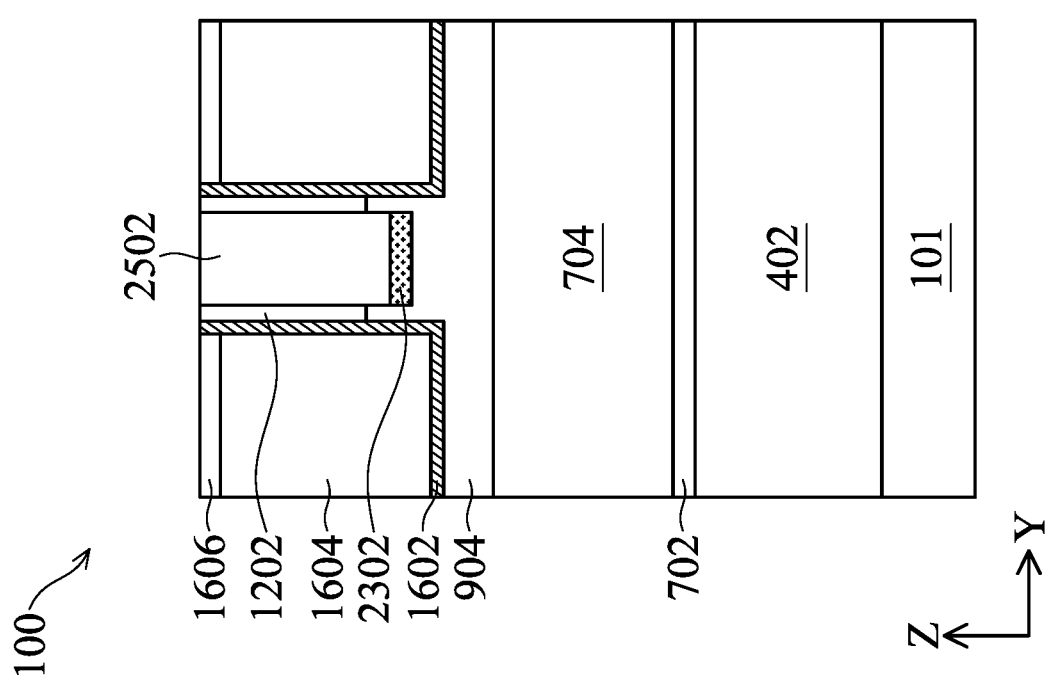
Figure 26C:
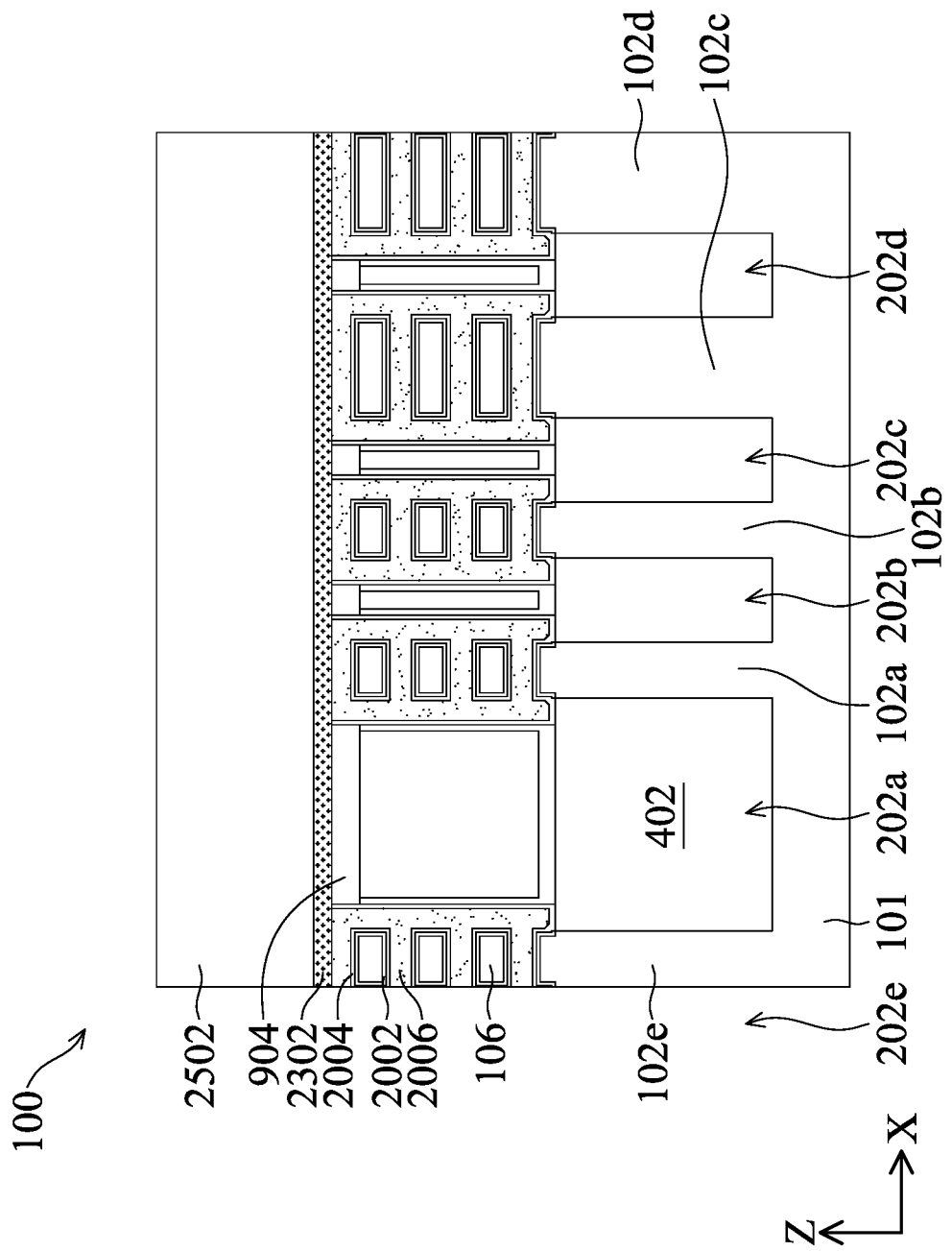

Next, a mask 2502 is formed in the trench 2202 and over the nitrogen-containing layers 1606, as shown in FIGS. 25A-25C. The mask 2502 may include an oxygen-containing material and/or a nitrogen-containing material. In some embodiments, the mask 2502 is a photoresist. Portions of the mask 2502 disposed on the conductive layer 2302 over the nitrogen-containing layers 1606 may be removed, as shown in FIGS. 26A-26C. The portions of the mask 2502 may be removed by any suitable process, such as a dry etch, a wet etch, or a combination thereof. The portion of the mask 2502 in the trench 2202 is not affected by the removal process. The removal process exposes portions of the conductive layer 2302 disposed on the nitrogen-containing layers 1606.

Figure 27B:
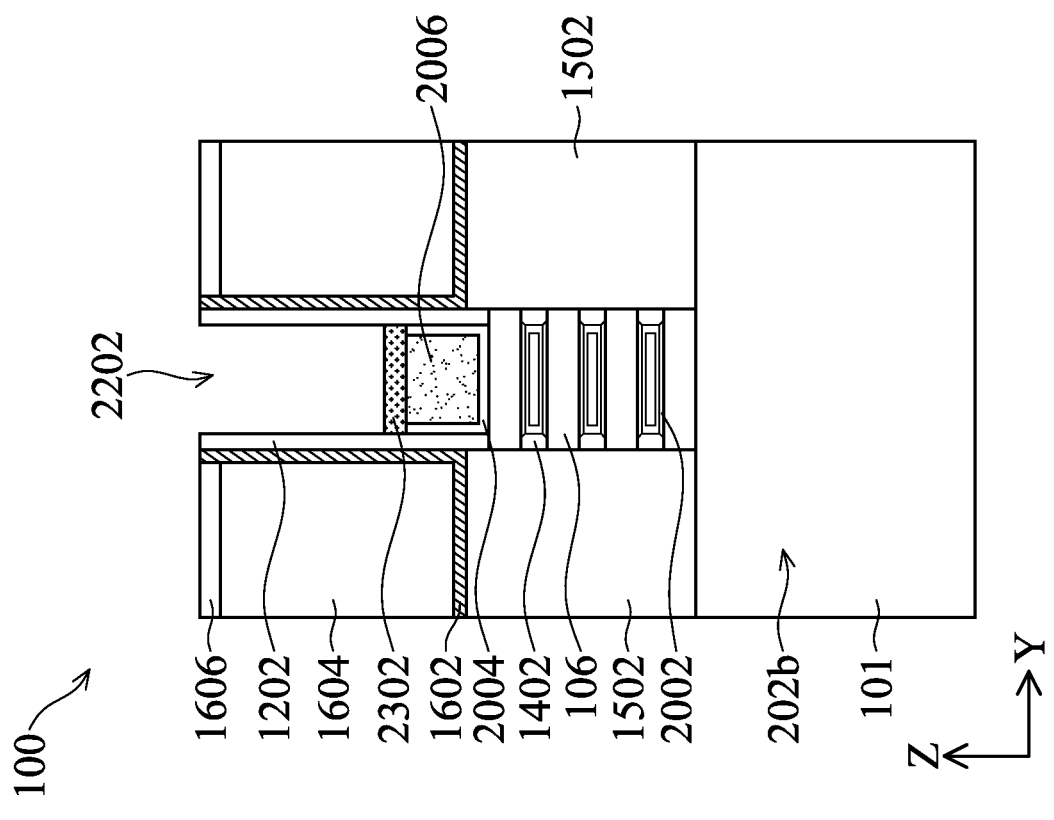
Figure 27A:
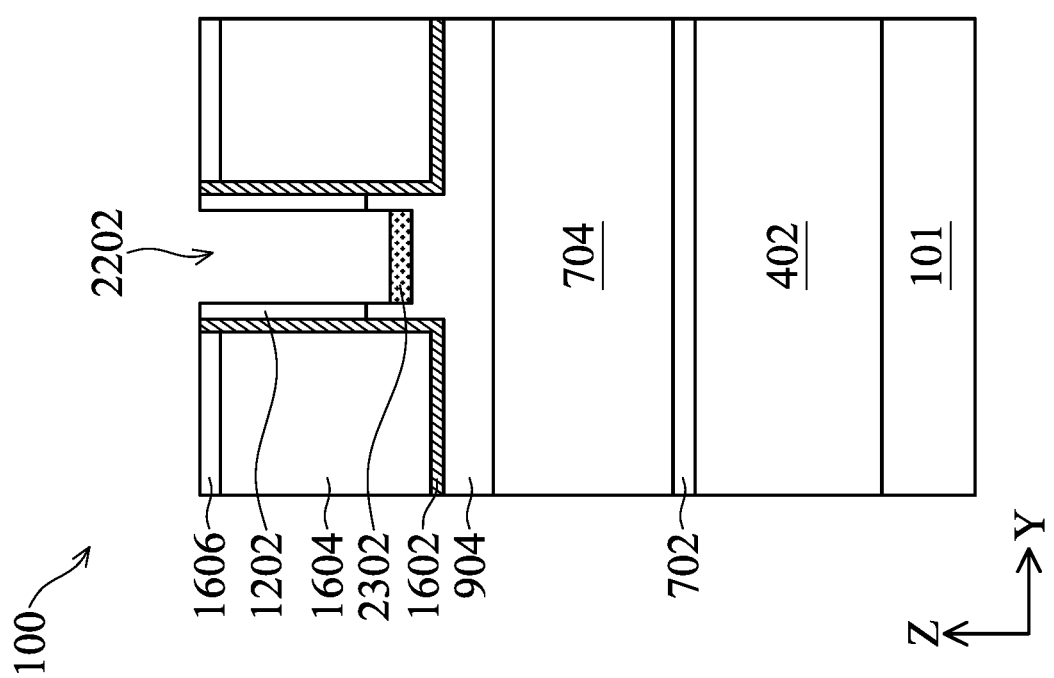
Figure 27C:
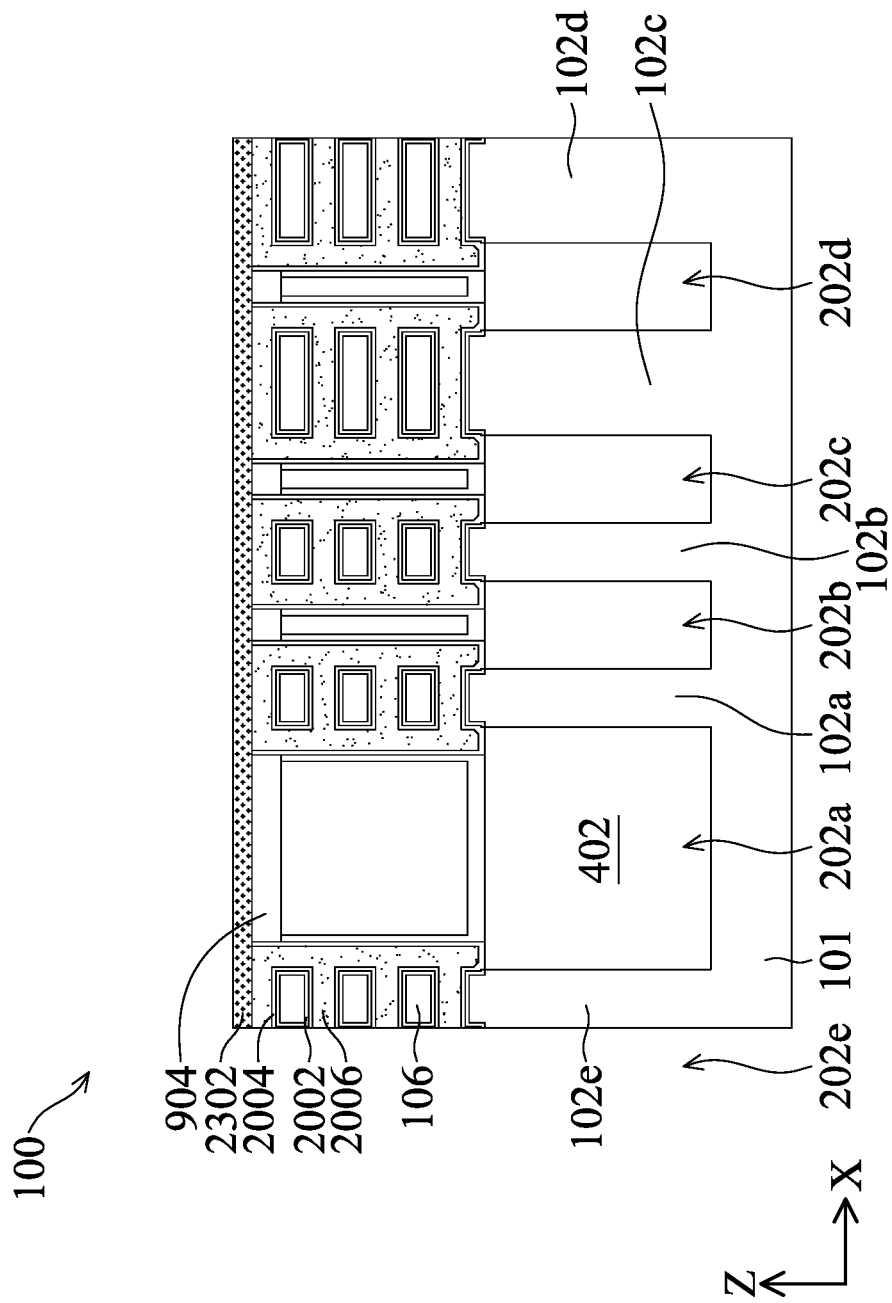

Next, as shown in FIGS. 27A-27C, the portions of the conductive layer 2302 disposed on the nitrogen-containing layers 1606 are removed, followed by the removal of the portion of the mask 2502 in the trench 2202 to expose the portion of the conductive layer 2302 formed on the bottom of the trench 2202. The portions of the conductive layer 2302 disposed on the nitrogen-containing layer 1606 may be removed by any suitable process, such as a dry etch, a wet etch, or a combination thereof. In some embodiments, as shown in FIGS. 26A-26B and 27A-27B, the portions of the mask 2502 and the portions of the conductive layer 2302 disposed on the nitrogen-containing layers 1606 are removed by two etch processes. Alternatively, the portions of the mask 2502 and the portions of the conductive layer 2302 disposed on the nitrogen-containing layer 1606 are removed by a planarization process, such as a CMP process.

The portion of the mask 2502 disposed in the trench 2202 may be removed by any suitable process, such as a dry etch, a wet etch, or a combination thereof. The removal of the portion of the mask 2502 may be selective, so the nitrogen-containing layers 1606, the spacers 1202, and the conductive layer 2302 disposed on the bottom of the trench 2202 are not substantially affected due to different etch selectivity. As shown in FIG. 27C, multiple gate electrode layers 2006 are electrically connected to the conductive layer 2302.

Figures 28A, 28B:
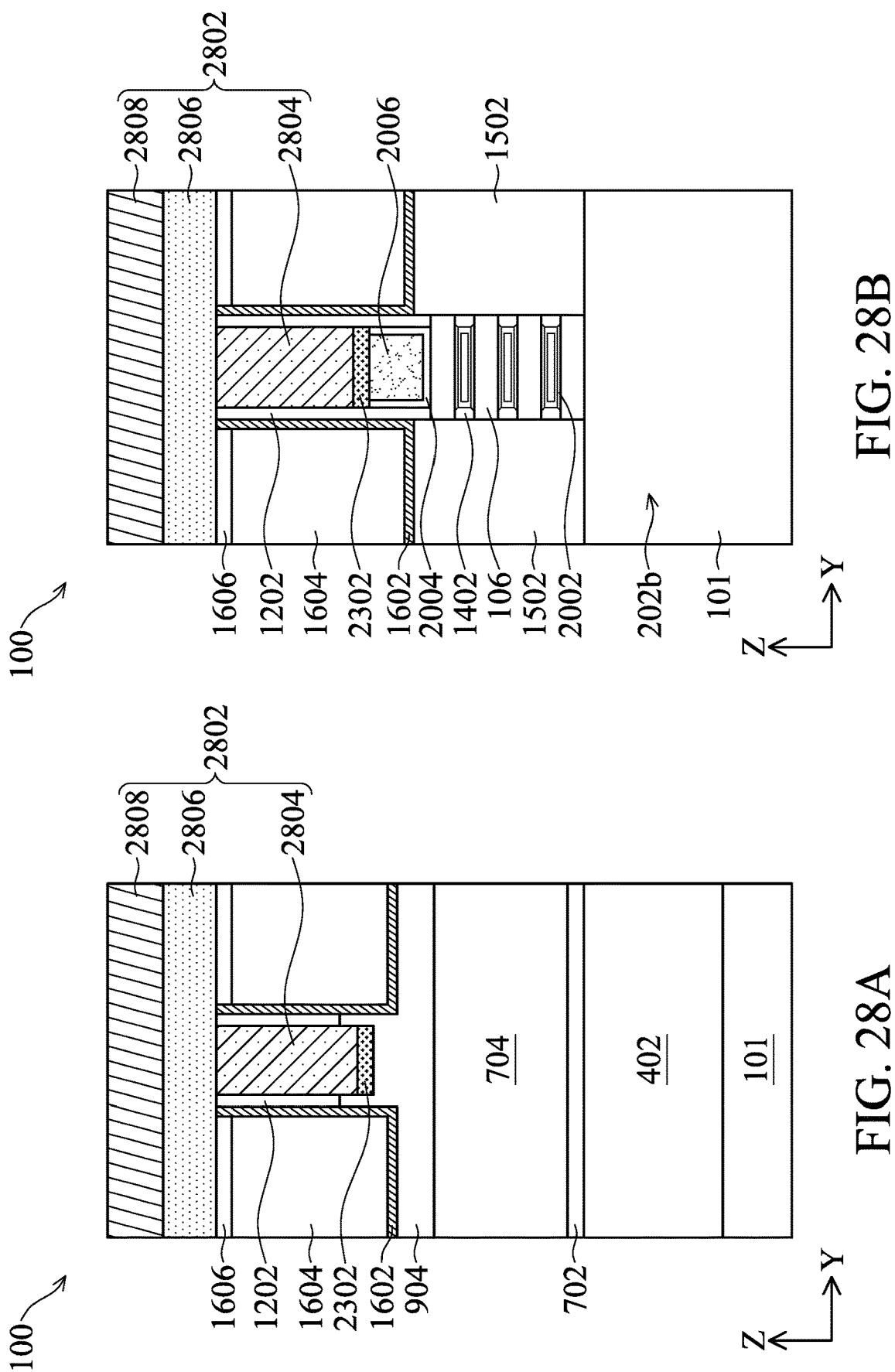
Figure 28C:
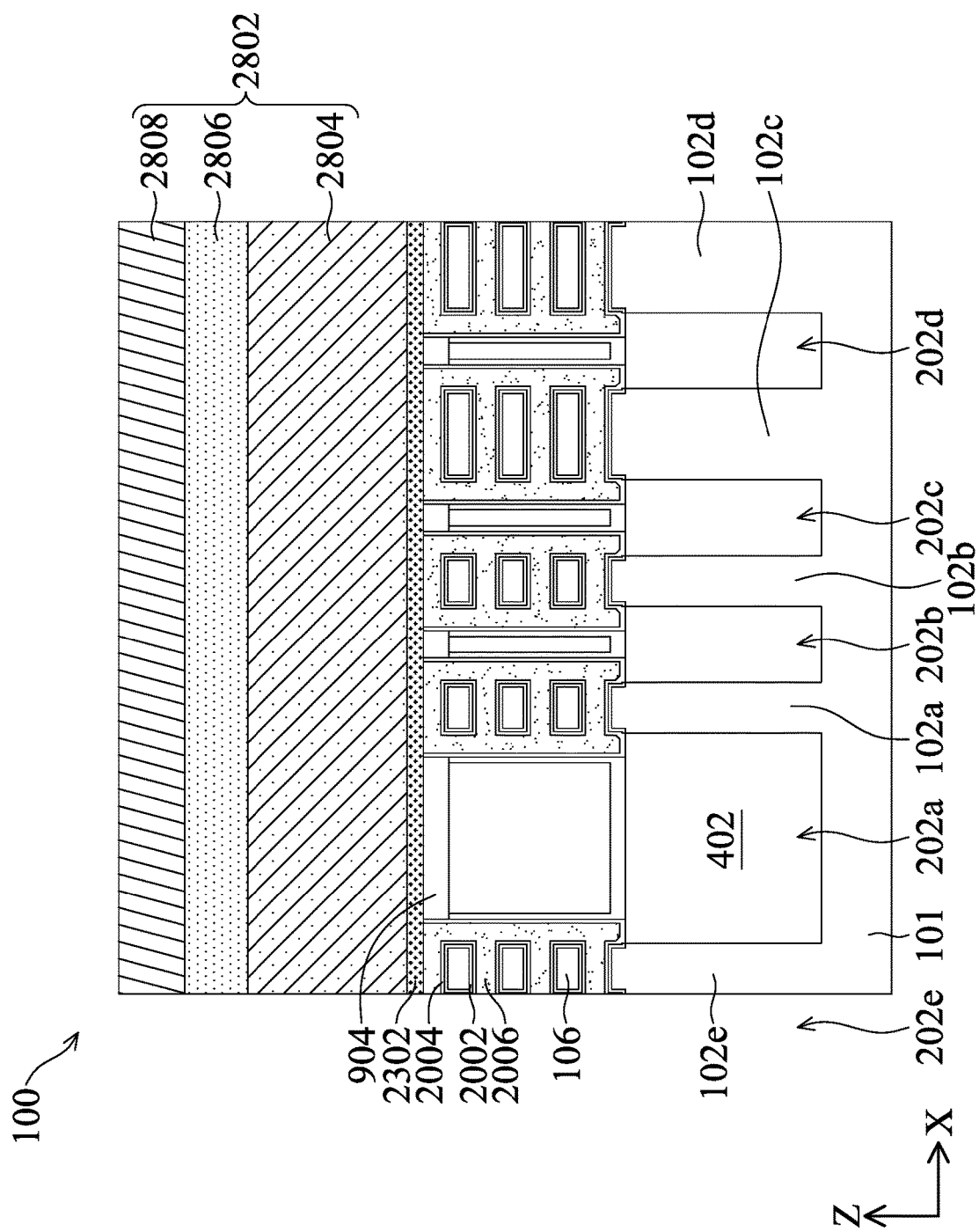
Figure 29C:
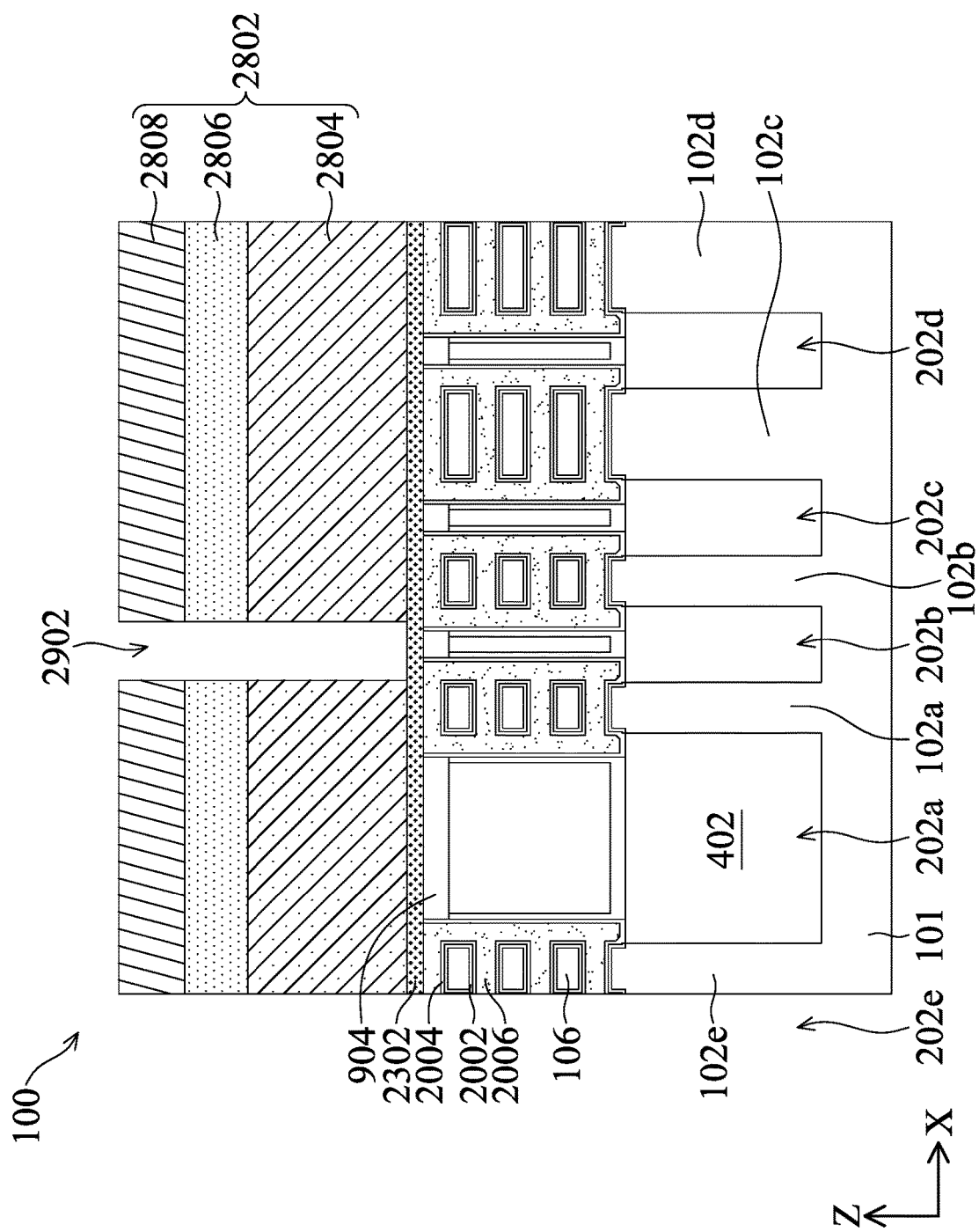

Next, as shown in FIGS. 28A-28C, a mask structure 2802 is formed in the trenches 2202. The mask structure 2802 includes a bottom layer 2804, a middle layer 2806, and a photoresist layer 2808. The mask structure 2802 may be the mask structure 1902, the bottom layer 2804 may be the bottom layer 1904, the middle layer 2806 may be the middle layer 1906, and the photoresist layer 2808 may be the photoresist layer 1908. As shown in FIGS. 29A-29C, an opening 2902 is formed in the mask structure 2802. The opening 2902 may be formed by multiple processes. The opening 2902 exposes a portion of the conductive layer 2302 disposed on one of the dielectric features 906.

Figure 30B:
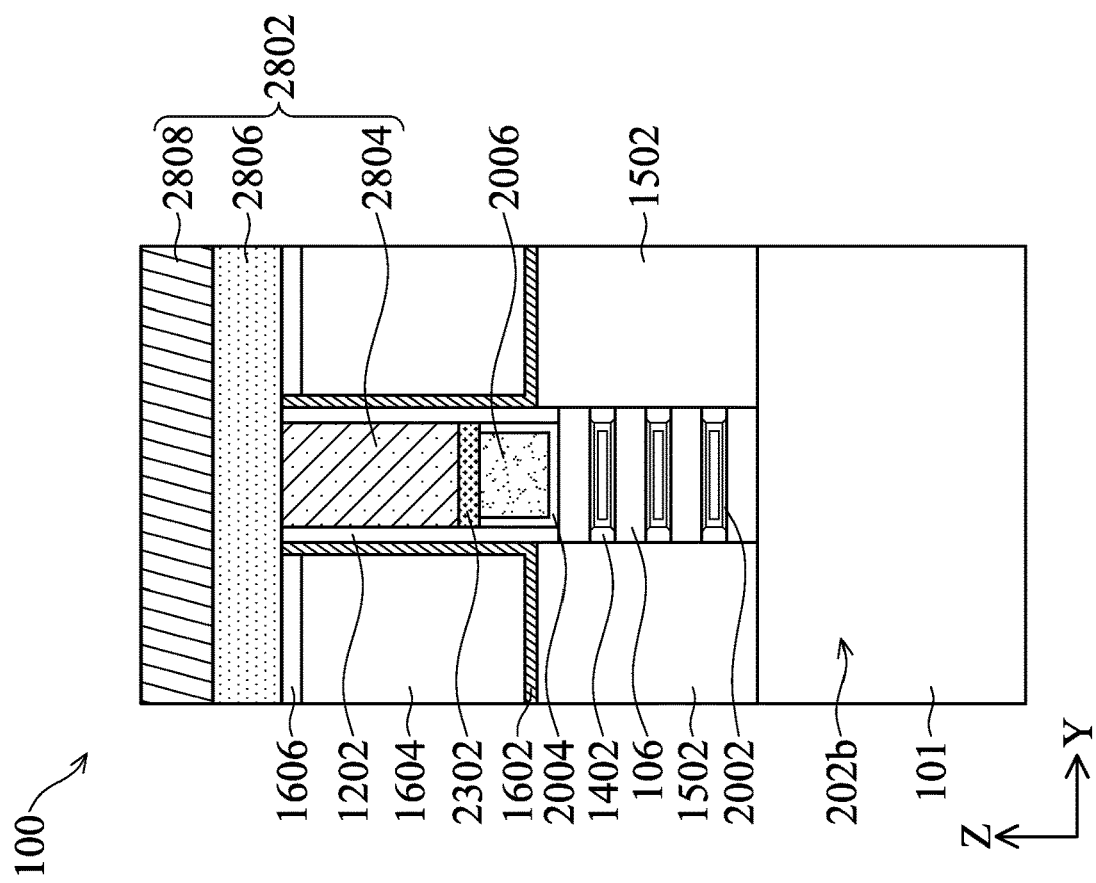
Figure 30A:
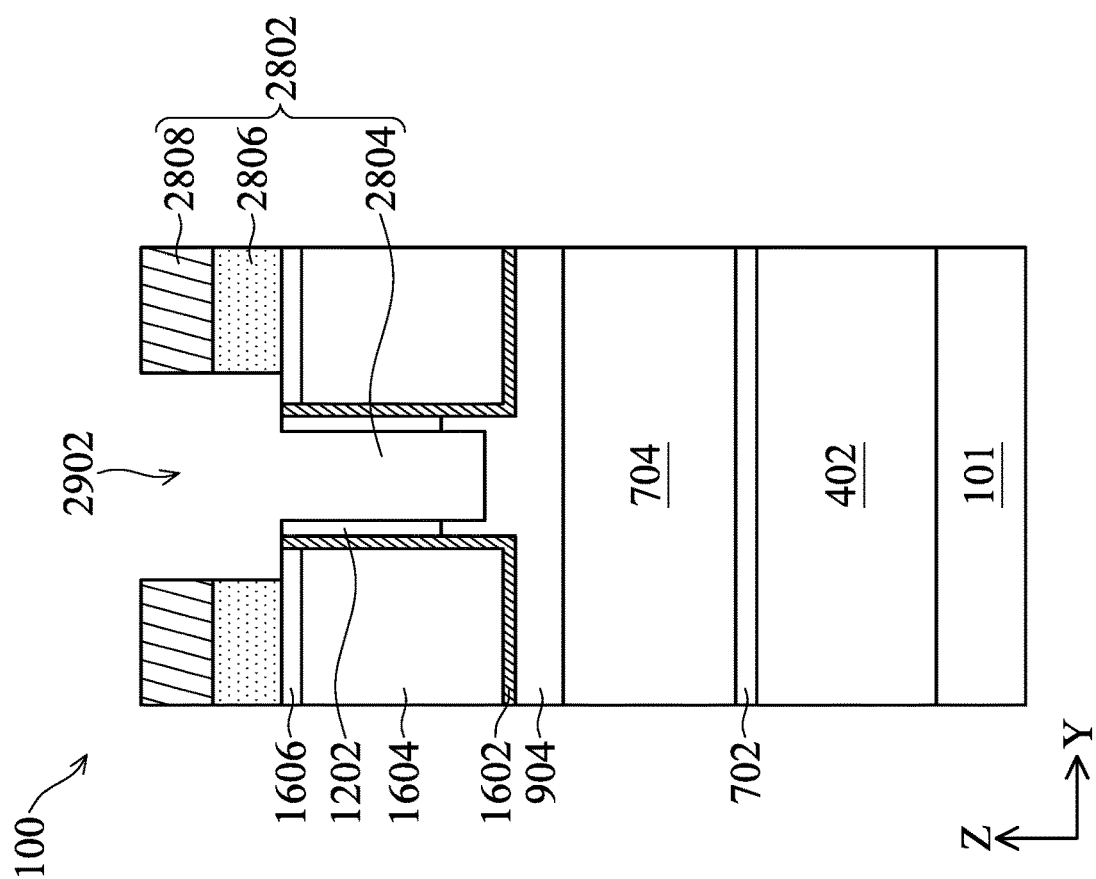
Figure 30C:
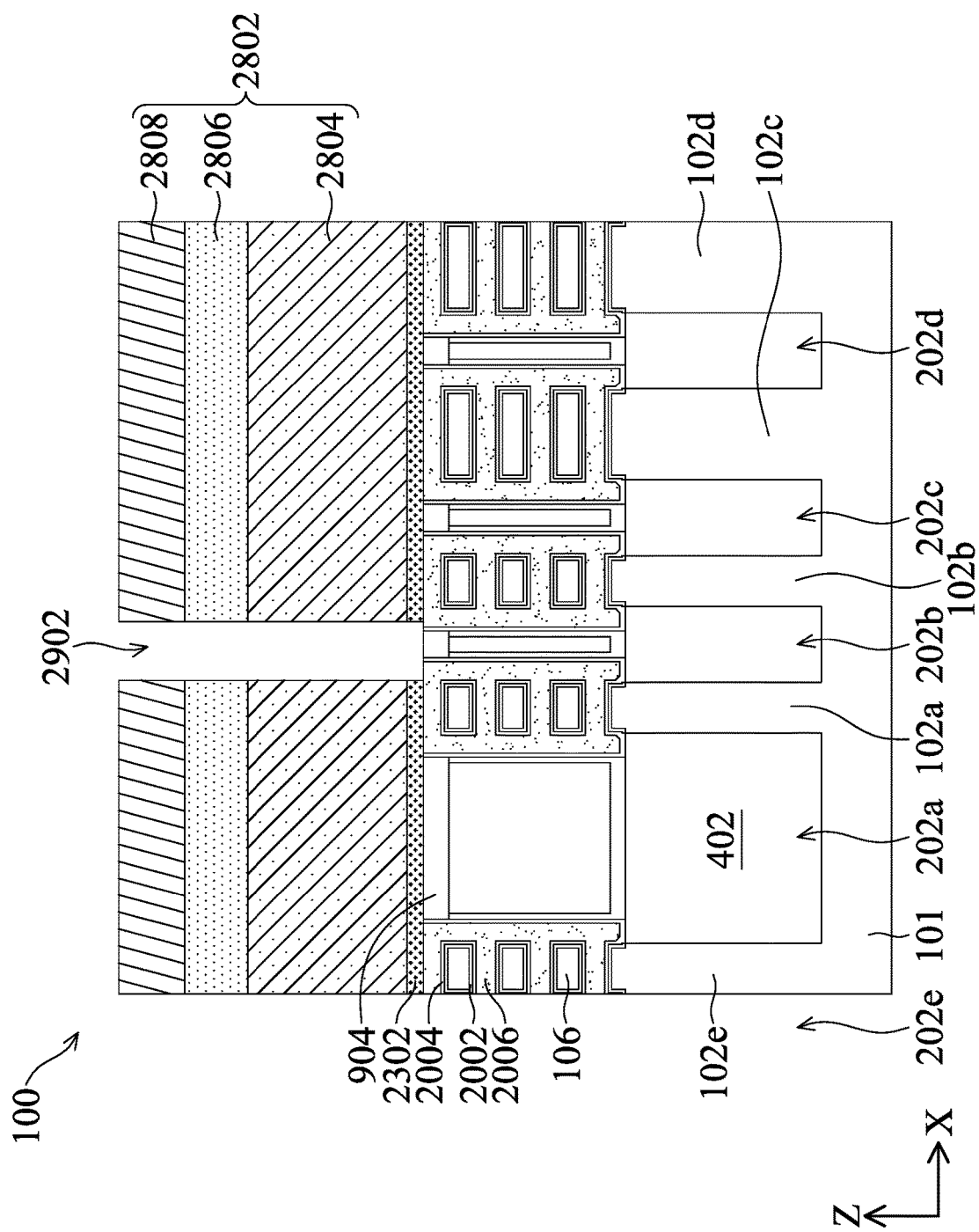

As shown in FIGS. 30A-30C, the exposed portion of the conductive layer 2302 is removed by any suitable process, and the dielectric material 904 is exposed. In some embodiments, portions of the gate electrode layer 2006 may be also exposed. In some embodiments, the conductive layer 2302 includes FFW, and a fluorine based dry etch process is performed to remove the exposed portion of the conductive layer 2302. For example, the dry etch process is performed in an etch chamber with a chamber pressure ranging from about 3 mTorr to about 20 mTorr. The processing temperature ranges from about 10 degrees Celsius to about 30 degrees Celsius. The etchant may be $SF_6$ with a flow rate ranging from about 0 sccm to about 50 sccm, $NF_3$ with a flow rate ranging from about 0 sccm to about 50 sccm, and/or $CF_4$ ranging from about 0 sccm to about 50 sccm. Other gases, such as Ar and/or $N_2$ may be flowed along with the fluorine containing gas. The flow rate of Ar may range from about 50 sccm to about 200 sccm, and the flow rate of $N_2$ may range from about 50 sccm to about 140 sccm. With the process conditions described above, the FFW etch process with fluorine containing etchant can achieve high selectivity to the material of the gate electrode layer 2006 (e.g. TiN), the material of the dielectric material 904 (e.g. $HfO_2$), and the material of the spacer 1202 (e.g. SiN). In some embodiments, the dry etch process removes about less than 80 percent of the thickness of the spacer 1202, about less than 10 percent of the gate electrode layer 2006, and about less than 10 percent of the dielectric material 904.

Figure 31C:
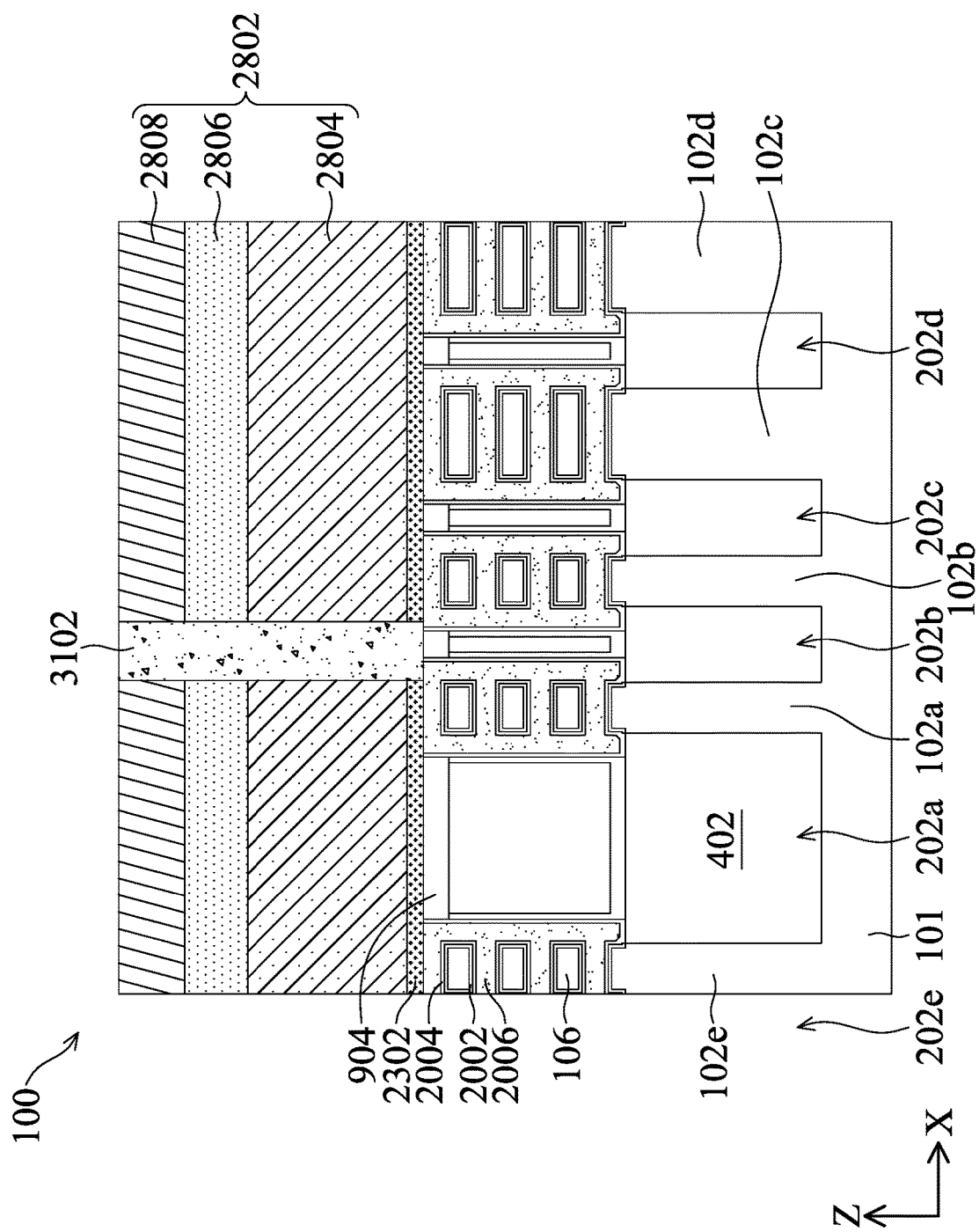
Figure 32C:
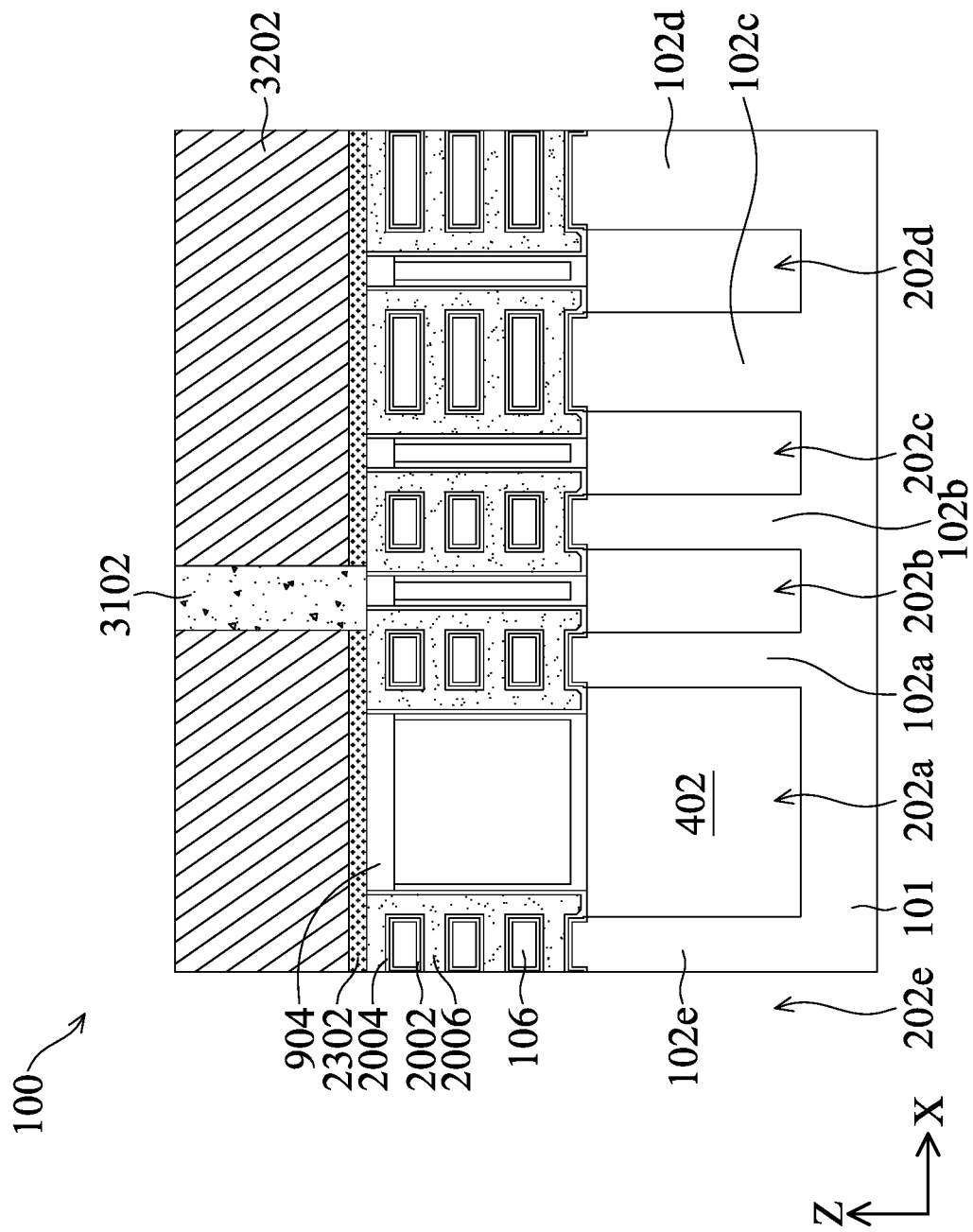

As shown in FIGS. 31A-31C, a dielectric material 3102 is formed in the opening 2902 and on the dielectric material 904. The dielectric material 3102 may include any suitable dielectric material, such as SiN. Next, the mask structure 2802 is removed, and a dielectric material 3202 is formed in the trench 2202, as shown in FIGS. 32A-32C. The dielectric material 3202 may include the same material as the dielectric material 3102. As shown in FIG. 32C, the conductive layer 2302 may be separated into segments. For example, a first segment of the conductive layer 2302 electrically connects the gate electrode layers 2006 disposed over the fins 202a and 202e, and second segment of the conductive layer 2302 electrically connects the gate electrode layers 2006 disposed over the fins 202b, 202c, and 202d. The first and second segments of the conductive layer 2302 are separated by the dielectric material 3102. Thus, FIGS. 21A to 32C illustrate a process to cut-off and to share the gate electrode layer 2006, according to an alternative embodiment compared to the process shown in FIGS. 20A-20I.

Figure 33B:
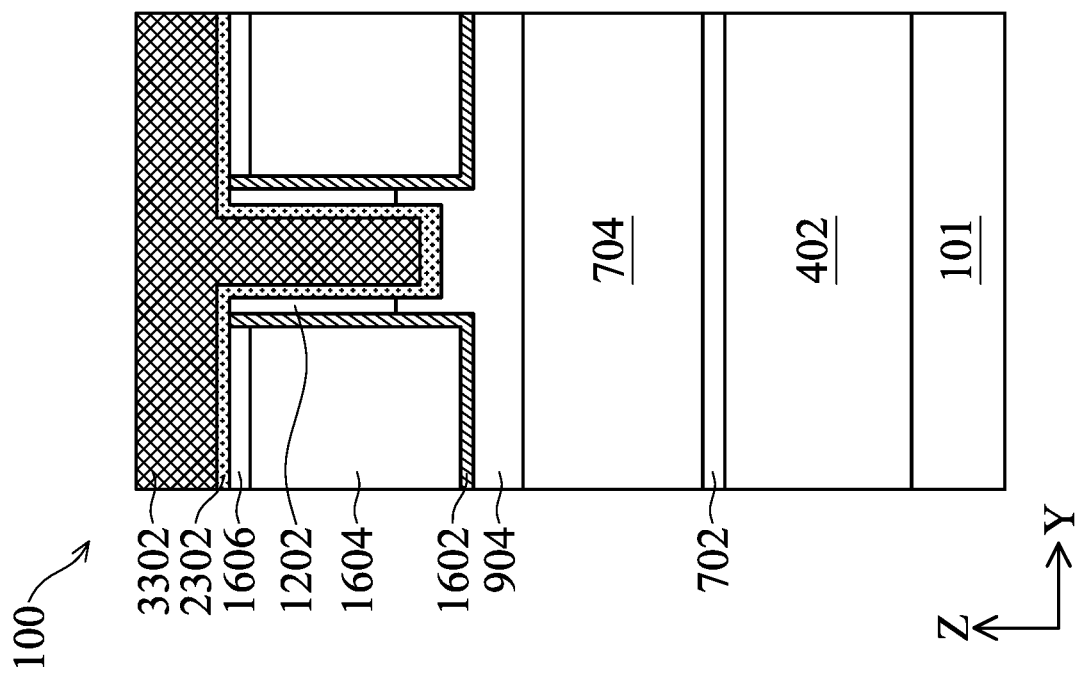
FIGS. 33A-33E are cross-sectional side views of various stages of manufacturing the semiconductor device structure taken along line B-B of FIG. 16, in accordance with alternative embodiments.
Figure 33A:
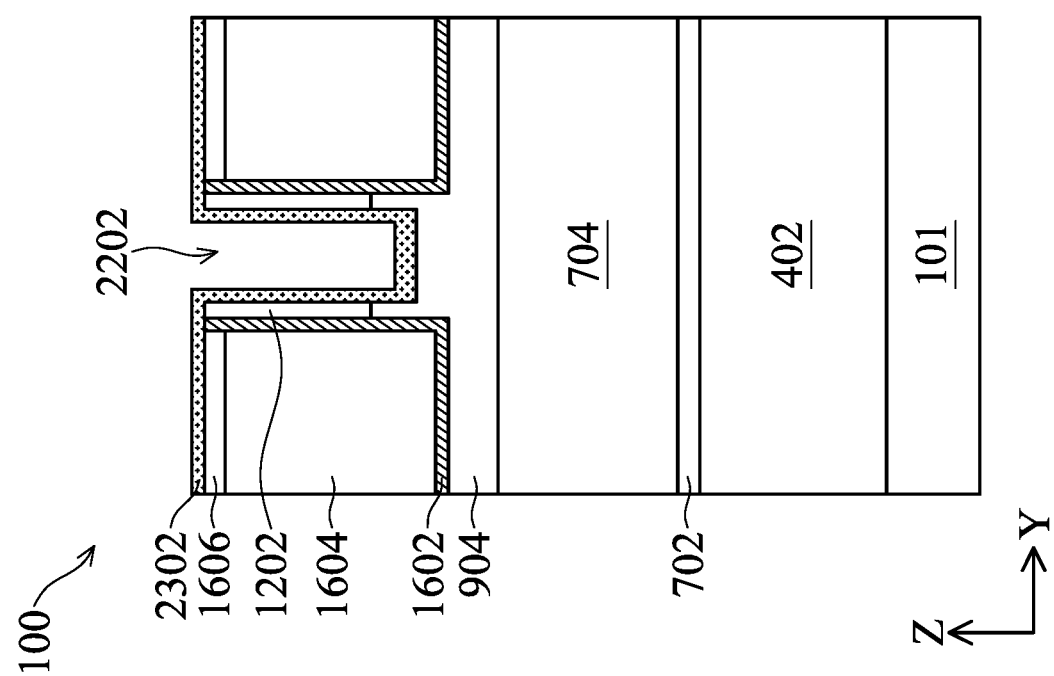

FIGS. 33A-33E are cross-sectional side views of various stages of manufacturing the semiconductor device structure 100 taken along line B-B of FIG. 16, in accordance with alternative embodiments. In some embodiments, the conductive layer 2302 is formed by a conformal process, such as an ALD process, and the conductive layer 2302 may be a conformal layer, as shown in FIG. 33A. Next, as shown in FIG. 33B, a sacrificial layer 3302 is formed in the trench 2202. The sacrificial layer 3302 may include any material that has a different etch selectivity compared to the conductive layer 2302, the spacers 1202, and the nitrogen-containing layer 1606. In some embodiments, the sacrificial layer 3302 is a bottom anti-reflective coating (BARC) layer.

Figure 33D:
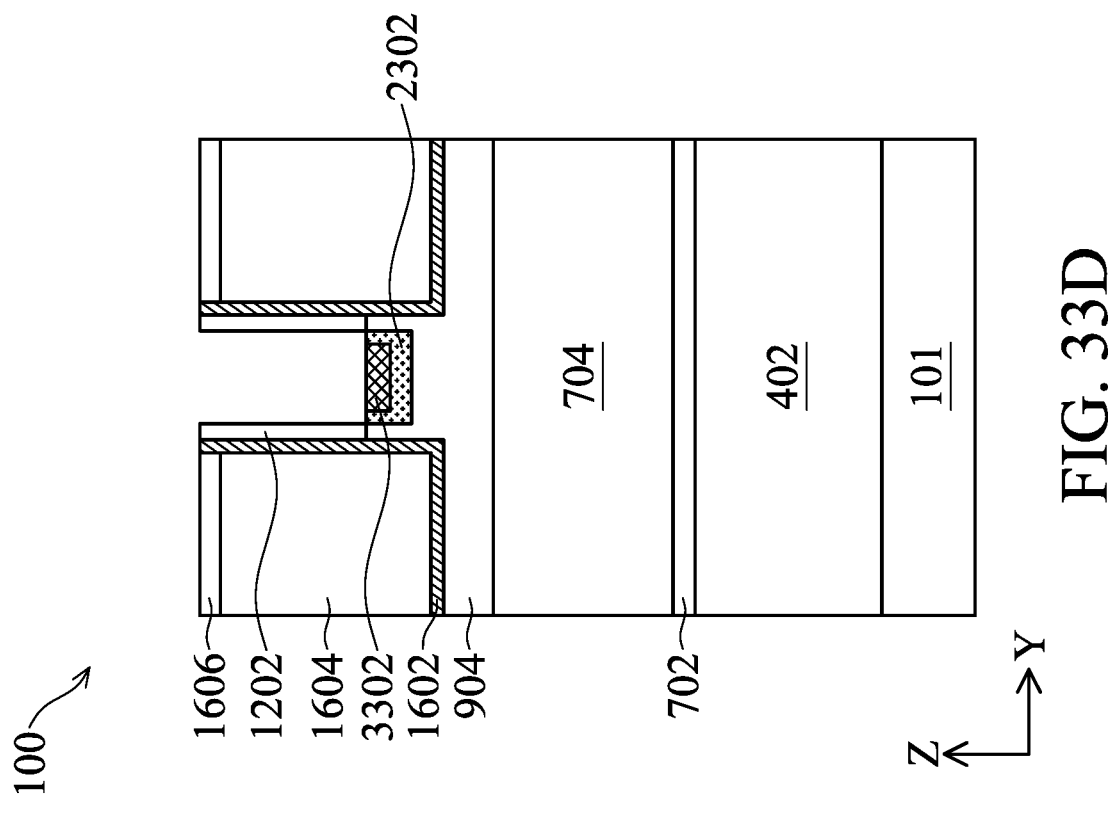
Figure 33C:
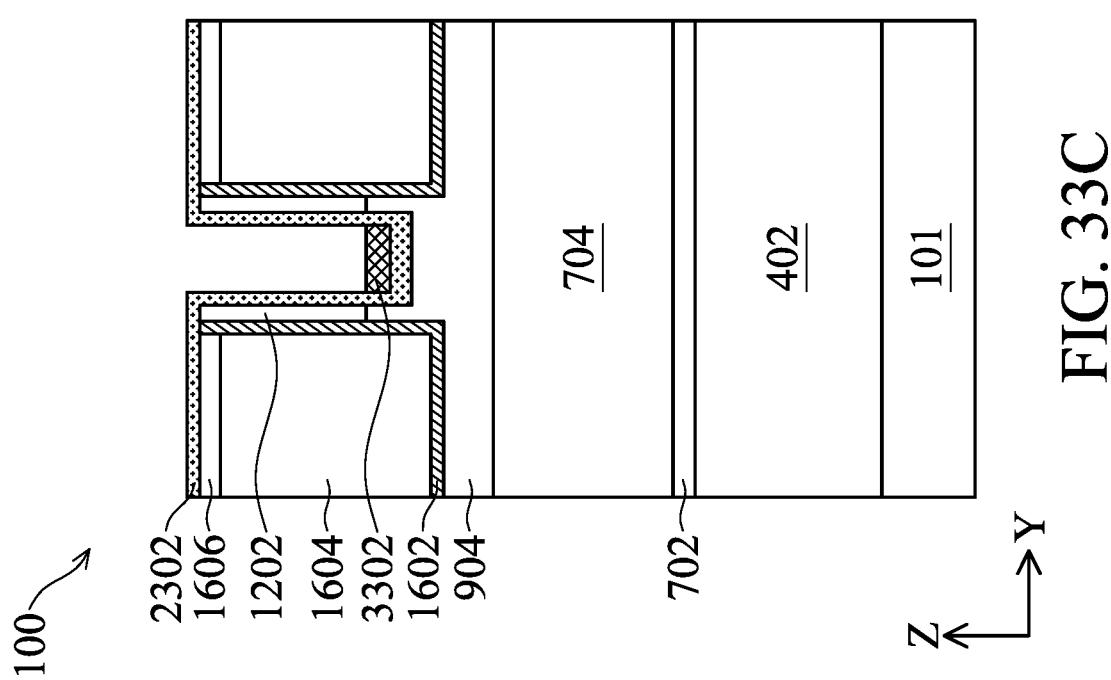
Figure 33E:
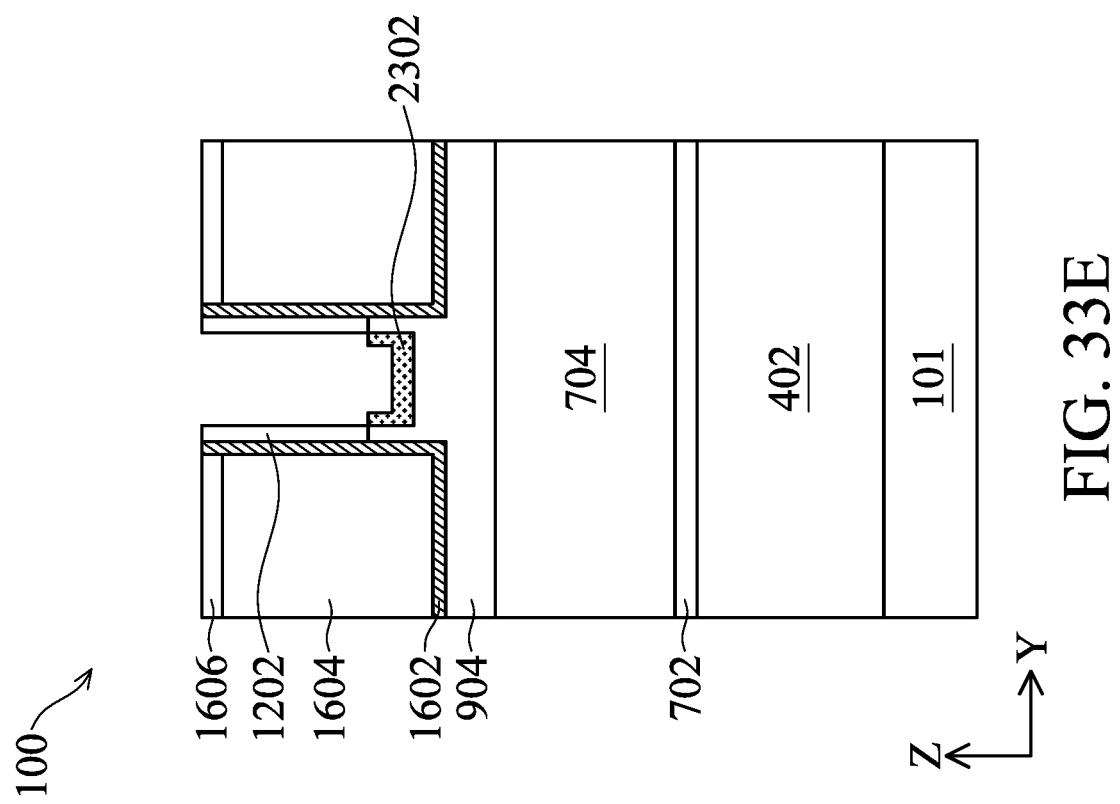

As shown in FIG. 33C, the sacrificial layer 3302 is recessed to expose the portions of the conductive layer 2302 formed on the nitrogen-containing layer 1606 and formed on a portion of each spacer 1202. Next, as shown in FIG. 33D, the exposed portions of the conductive layer 2302 are removed by any suitable process, such as the dry etch process described in FIGS. 30A-30C. The remaining sacrificial layer 3302 is then removed by any suitable process, as shown in FIG. 30E. The remaining conductive layer 2302 may have a "U" shaped cross-section in the Y-Z plane, unlike the bar shaped cross-section shown in FIG. 27A. Subsequent processes, such as the processes described in FIGS. 28A-32C, may be performed on the conductive layer 2302 to cut-off and to share the gate electrode layer 2006.

The present disclosure in various embodiments provide a semiconductor device structure 100 including a first channel region (the plurality of semiconductor layers 106), a second channel region (the plurality of semiconductor layers 106) disposed adjacent the first channel region, a gate electrode layer 2006 disposed in the first and second channel regions, a first dielectric feature 906 disposed adjacent the gate electrode layer 2006, and a second dielectric feature 906 disposed between the first and second channel regions. The first dielectric feature 906 includes a first dielectric material 904 having a first thickness T3, and the second dielectric feature 906 includes a second dielectric material 904 having a second thickness T2 substantially less than the first thickness T3. Some embodiments may achieve advantages. For example, the first dielectric material 904 having the thickness T3 can separate the gate electrode layers 2006, while the second dielectric material 904 having the thickness T2 allows adjacent channel regions to share a gate electrode layer 2006.

An embodiment is a semiconductor device structure. The semiconductor device structure includes a first channel region disposed over a substrate, a second channel region disposed adjacent the first channel region, a gate electrode layer disposed in the first and second channel regions, and a first dielectric feature disposed adjacent the gate electrode layer. The first dielectric feature includes a first dielectric material having a first thickness. The structure further includes a second dielectric feature disposed between the first and second channel regions, and the second dielectric feature includes a second dielectric material having a second thickness substantially less than the first thickness. The second thickness ranges from about 1 nm to about 20 nm.

Another embodiment is a method. The method includes forming first and second fins from a substrate, the first fin includes a first plurality of semiconductor layers, and the second fin includes a second plurality of semiconductor layers. The method further includes forming first and second dielectric features, the first dielectric feature is disposed adjacent the first fin, the second dielectric feature is disposed between the first and second fins, the first dielectric feature includes a first dielectric material, and the second dielectric feature includes a second dielectric material. The method further includes forming a sacrificial gate electrode layer over the first fin, the second fin, the first dielectric feature, and the second dielectric feature, recessing the sacrificial gate electrode layer to a level above a top surface of the second dielectric material, forming a mask structure over the first dielectric feature, removing a portion of the sacrificial gate electrode layer disposed on the second dielectric material to expose the second dielectric material, removing the mask structure, and recessing the second dielectric material.

A further embodiment is a method. The method includes forming first and second fins from a substrate, the first fin includes a first plurality of semiconductor layers, and the second fin includes a second plurality of semiconductor layers. The method further includes forming a dielectric feature between the first and second fins, and the dielectric feature includes a first dielectric material. The method further includes forming an interlayer dielectric layer over the substrate, forming a gate electrode layer surrounding the first and second pluralities of semiconductor layers, recessing the gate electrode layer to a level of a top surface of the first dielectric material, forming a conductive layer on the gate electrode layer, the first dielectric material, and over the interlayer dielectric layer, removing a portion of the conductive layer disposed over the interlayer dielectric layer, forming a mask structure on the conductive layer, forming an opening in the mask structure to expose a portion of the conductive layer disposed on the first dielectric material, removing the exposed portion of the conductive layer to expose the first dielectric material, and forming a second dielectric material on the first dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
   forming first and second fins from a substrate, wherein first fin includes a first plurality of semiconductor layers and the second fin includes a second plurality of semiconductor layers;
   forming first and second dielectric features, wherein the first dielectric feature is disposed adjacent the first fin, the second dielectric feature is disposed between the first and second fins, the first dielectric feature comprises a first dielectric material, and the second dielectric feature comprises a second dielectric material;
   forming a sacrificial gate electrode layer over the first fin, the second fin, the first dielectric feature, and the second dielectric feature;
   recessing the sacrificial gate electrode layer to a level above a top surface of the second dielectric material;
   forming a mask structure over the first dielectric feature;
   removing a portion of the sacrificial gate electrode layer disposed on the second dielectric material to expose the second dielectric material;
   removing the mask structure; and
   recessing the second dielectric material.

2. The method of claim 1, further comprising removing the sacrificial gate electrode layer.

3. The method of claim 1, further comprising:
   forming a gate dielectric layer on the first dielectric material, the second dielectric material, and surrounding the first and second pluralities of semiconductor layers.

4. The method of claim 3, further comprising forming a gate electrode layer on the gate dielectric layer, wherein the gate electrode layer has a top surface below a top surface of the first dielectric material, and the gate electrode layer is formed over the second dielectric material.

5. The method of claim 1, wherein forming the second dielectric feature comprises:
   forming a liner between the first and second fins;
   forming a third dielectric material on the liner; and
   forming the second dielectric material on the liner and the third dielectric material.

6. The method of claim 5, further comprising removing the second dielectric material to expose the liner and the third dielectric material.

7. The method of claim 6, further comprising:
   forming a gate dielectric layer on the first dielectric material, the liner, the third dielectric material, and surrounding the first and second pluralities of semiconductor layers.

8. The method of claim 7, further comprising forming a gate electrode layer on the gate dielectric layer, wherein the gate electrode layer has a top surface below a top surface of the first dielectric material, and the gate electrode layer is formed over the liner and the third dielectric material.

9. A method for forming a semiconductor device structure, comprising:
   forming first and second fins from a substrate, wherein the first fin includes a first plurality of semiconductor layers and the second fin includes a second plurality of semiconductor layers;
   forming a dielectric feature between the first and second fins, wherein the dielectric feature comprises a first dielectric material;
   forming an interlayer dielectric layer over the substrate;
   forming a gate electrode layer surrounding the first and second pluralities of semiconductor layers;
   recessing the gate electrode layer to a level of a top surface of the first dielectric material;
   forming a conductive layer on the gate electrode layer, the first dielectric material, and over the interlayer dielectric layer;
   removing a portion of the conductive layer disposed over the interlayer dielectric layer;
   forming a mask structure on the conductive layer;
   forming an opening in the mask structure to expose a portion of the conductive layer disposed on the first dielectric material;
   removing the exposed portion of the conductive layer to expose the first dielectric material; and
   forming a second dielectric material on the first dielectric material.

10. The method of claim 9, further comprising forming spacers over the substrate prior to forming the gate electrode layer, and the conductive layer is formed on the spacers.

11. The method of claim 10, further comprising removing a portion of the conductive layer disposed on the spacers prior to removing the portion of the conductive layer disposed over the interlayer dielectric layer.

12. The method of claim 10, further comprising:
   forming a sacrificial layer on the conductive layer prior to removing a portion of the conductive layer disposed over the interlayer dielectric layer;
   recessing the sacrificial layer;
   removing a portion of the conductive layer disposed on the spacers while removing the portion of the conductive layer disposed over the interlayer dielectric layer; and
   removing the sacrificial layer.

13. The method of claim 9, further comprising removing the mask structure and forming a third dielectric material on the conductive layer over the gate electrode layer.

14. A method, comprising:
   forming first and second fins from a substrate;
   forming a first dielectric feature between the first and second fins;
   forming a sacrificial gate electrode layer over the first dielectric feature;
   recessing the sacrificial gate electrode layer to a level above a top surface of the first dielectric feature;
   removing a portion of the sacrificial gate electrode layer to expose the first dielectric feature;
   recessing the first dielectric feature;
   removing a remaining portion of the sacrificial gate electrode layer;
   forming a gate electrode layer over the first and second fins and over the recessed first dielectric feature; and
   selectively depositing a conductive layer on the gate electrode layer.

15. The method of claim 14, wherein the first dielectric feature comprises a first high-K dielectric material, and the first high-K dielectric material is recessed.

16. The method of claim 15, wherein the first high-K dielectric material is recessed by a chlorine-based dry etch process.

17. The method of claim 16, wherein an etchant of the chlorine-based dry etch process comprises $BCl_3$ or $Cl_2$.

18. The method of claim 14, further comprising forming a second dielectric feature, wherein the first fin is disposed between the first and second dielectric features, and the second dielectric feature comprises a second high-K dielectric material.

19. The method of claim 18, wherein the second high-K dielectric material has a thickness substantially greater than a thickness of the first high-K dielectric material of the recessed first dielectric feature.

20. The method of claim 18, wherein the second high-K dielectric material has a first top surface, and the gate electrode layer has a second top surface located at a level below the first top surface.

* * * * *